US012776705B2

(12) United States Patent
Inoue et al.

(10) Patent No.: US 12,776,705 B2
(45) Date of Patent: Oct. 27, 2026

(54) SEMICONDUCTOR DEVICE AND METHOD FOR OPERATING SEMICONDUCTOR DEVICE

(71) Applicant: Semiconductor Energy Laboratory Co., Ltd., Atsugi (JP)

(72) Inventors: Hiroki Inoue, Atsugi (JP); Kousuke Sasaki, Atsugi (JP); Yuto Yakubo, Atsugi (JP); Kei Takahashi, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 111 days.

(21) Appl. No.: 18/986,896

(22) Filed: Dec. 19, 2024

(65) Prior Publication Data

US 2025/0141355 A1 May 1, 2025

Related U.S. Application Data

(63) Continuation of application No. 17/621,338, filed as application No. PCT/IB2020/055940 on Jun. 24, 2020, now Pat. No. 12,176,810.

(30) Foreign Application Priority Data

Jul. 5, 2019 (JP) ................................ 2019-125872

(51) Int. Cl.
*H02M 3/156* (2006.01)
*H02H 7/18* (2006.01)
(Continued)

(52) U.S. Cl.
CPC .............. *H02M 3/156* (2013.01); *H02H 7/18* (2013.01); *H10D 30/6755* (2025.01);
(Continued)

(58) Field of Classification Search
CPC ............... H02M 3/156; H01L 27/1225; H01L 29/7869; H01L 29/78696; H02H 7/18
See application file for complete search history.

(56) References Cited

U.S. PATENT DOCUMENTS

| | | | |
|---|---|---|---|
| 7,589,596 | B2 | 9/2009 | Masuda et al. |
| 8,872,935 | B2 | 10/2014 | Emori |

(Continued)

FOREIGN PATENT DOCUMENTS

| | | |
|---|---|---|
| JP | 04-045974 | 4/1992 |
| JP | 2006-012199 A | 1/2006 |

(Continued)

OTHER PUBLICATIONS

International Search Report (Application No. PCT/IB2020/055940) Dated Sep. 29, 2020.

(Continued)

*Primary Examiner* — Adolf D Berhane
(74) *Attorney, Agent, or Firm* — Eric J. Robinson; Robinson Intellectual

(57) ABSTRACT

A novel oscillator, an amplifier circuit, an inverter circuit, an amplifier circuit, a battery control circuit, a battery protection circuit, a power storage device, a semiconductor device, an electric device, and the like are provided. The semiconductor device includes an oscillator including a first transistor containing a metal oxide, and a second transistor to a fifth transistor, in which a first potential is supplied to a gate of the second transistor and a gate of the third transistor when the first transistor is turned on, and the first potential is held when the first transistor is turned off. The oscillator supplies a first signal based on the first potential to a first circuit. The first circuit performs at least one of shaping and amplification on the first signal. The second transistor and the fourth transistor are connected in series, and the third transistor and the fifth transistor are connected in series. A (Continued)

21 source or a drain of the third transistor is electrically connected to a gate of the fourth transistor, and a source or a drain of the fourth transistor is electrically connected to the gate of the third transistor.

18 Claims, 18 Drawing Sheets

(51) Int. Cl.
*H10D 30/67* (2025.01)
*H10D 86/40* (2025.01)
*H10D 86/60* (2025.01)

(52) U.S. Cl.
CPC ....... *H10D 30/6757* (2025.01); *H10D 86/423* (2025.01); *H10D 86/60* (2025.01)

(56) References Cited

U.S. PATENT DOCUMENTS

| | | | |
|---|---|---|---|
| 9,412,762 B2 | 8/2016 | Koyama et al. | |
| 10,008,929 B2 | 6/2018 | Koyama et al. | |
| 11,777,502 B2 * | 10/2023 | Inoue | H03K 17/063 327/574 |
| 12,176,810 B2 * | 12/2024 | Inoue | H02H 7/18 |
| 2005/0281162 A1 | 12/2005 | Nagaoka. et al. | |
| 2015/0035514 A1 | 2/2015 | Koyama et al. | |
| 2018/0212567 A1 | 7/2018 | Lin. et al. | |
| 2022/0173737 A1 | 6/2022 | Inoue et al. | |

FOREIGN PATENT DOCUMENTS

| | | |
|---|---|---|
| JP | 2006-324953 A | 11/2006 |
| JP | 2008-103888 A | 5/2008 |
| JP | 2010-057068 A | 3/2010 |
| JP | 2010-103888 A | 5/2010 |
| JP | 2015-047061 A | 3/2015 |

OTHER PUBLICATIONS

Written Opinion (Application No. PCT/IB2020/055940) Dated Sep. 29, 2020.

Jacob.B, “The Voltage-Controlled Oscillator”, CMOS Circuit Design, Layout, and Simulation, Sep. 7, 2010, pp. 561-567, IEEE Press.

* cited by examiner

SEMICONDUCTOR DEVICE AND METHOD FOR OPERATING SEMICONDUCTOR DEVICE

TECHNICAL FIELD

One embodiment of the present invention relates to a semiconductor device and an operation method of the semiconductor device. One embodiment of the present invention relates to a battery control circuit, a battery protection circuit, a power storage device, and an electric device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter. Thus, more specifically, examples of the technical field of one embodiment of the present invention disclosed in this specification include a display device, a light-emitting device, a power storage device, an imaging device, a memory device, a driving method thereof, and a manufacturing method thereof.

BACKGROUND ART

Oscillators have been used in a variety of devices, e.g., wireless communication devices. Patent Document 1 shows an example of a negative impedance circuit used for oscillations.

REFERENCE

Patent Document

[Patent Document 1] Japanese Published Patent Application No. 2006-324953

SUMMARY OF THE INVENTION

Problems to be Solved by the Invention

An object of one embodiment of the present invention is to provide a novel oscillator, a novel amplifier circuit, a novel inverter circuit, a novel amplifier circuit, a novel battery control circuit, a novel battery protection circuit, a power storage device, a semiconductor device, an electric device, and the like. Another object of one embodiment of the present invention is to provide an oscillator, an inverter circuit, an amplifier circuit, a battery control circuit, a battery protection circuit, a power storage device, a semiconductor device, an electric device, and the like that have novel structures and can reduce the power consumption.

Note that the objects of one embodiment of the present invention are not limited to the objects listed above. The objects listed above do not preclude the existence of other objects. Note that the other objects are objects that are not described in this section and are described below. The objects that are not described in this section are derived from the description of the specification, the drawings, and the like and can be extracted as appropriate from the description by those skilled in the art. Note that one embodiment of the present invention is to achieve at least one of the objects listed above and/or the other objects.

Means for Solving the Problems

One embodiment of the present invention is a semiconductor device including a first transistor, an oscillator, a first wiring, a second wiring, and a first circuit. The oscillator is electrically connected to each of the first wiring, the second wiring, and the first circuit. The first transistor includes a metal oxide containing indium or zinc in a channel formation region. The oscillator includes a second transistor, a third transistor, a fourth transistor, a fifth transistor, and a first capacitor. A gate of the second transistor and a gate of the third transistor are electrically connected to one of a source and a drain of the first transistor. One of a source and a drain of the second transistor is electrically connected to one of a source and a drain of the fourth transistor and one of electrodes of the first capacitor. One of a source and a drain of the third transistor is electrically connected to one of a source and a drain of the fifth transistor and the other electrode of the first capacitor. The other of the source and the drain of the fourth transistor is electrically connected to a gate of the fifth transistor. The other of the source and the drain of the fifth transistor is electrically connected to the first circuit and a gate of the fourth transistor. The first wiring is electrically connected to the other of the source and the drain of the second transistor and the other of the source and the drain of the third transistor.

Furthermore, in the semiconductor device having the above structure of, the first circuit includes at least one of an inverter and a buffer and an input terminal, the gate of the fourth transistor is electrically connected to the input terminal, and the first circuit has a function of performing at least one of shaping and amplification on a signal supplied to the input terminal.

Alternatively, in the above structure, it is preferable that the second transistor to the fifth transistor each include a metal oxide containing indium or zinc in a channel formation region. Alternatively, in the above structure, it is preferable that a second capacitor be further included, that one of electrodes of the second capacitor be electrically connected to the one of the source and the drain of the first transistor, and that the other electrode of the second capacitor be electrically connected to the first wiring.

Alternatively, in the above structure, it is preferable that the second wiring be included, that the first circuit include two or more transistors connected in series between the first wiring and the second wiring, that of one of the two or more transistors included in the first circuit, one of a source and a drain and a gate be electrically connected to the first wiring and the one of the source and the drain of the first transistor, respectively, that a low potential signal be supplied to the first wiring, and that a high potential signal be supplied to the second wiring.

Alternatively, in the above structure, it is preferable that a resistor, a sixth transistor, and a seventh transistor be included, that the first wiring be electrically connected to one of a source and a drain of the sixth transistor, that the other of the source and the drain of the sixth transistor be electrically connected to one of a source and a drain of the seventh transistor, that the other of the source and the drain of the seventh transistor be electrically connected to one of electrodes of the resistor, that the other electrode of the resistor be electrically connected to the second wiring, that the other of the source and the drain of the first transistor be electrically connected to the source or the drain of the seventh transistor, that at least one of the sixth transistor and the seventh transistor is turned off during a period of holding a first potential so as to block current flowing between the first wiring and the second wiring, that a low potential signal be supplied to the first wiring, and that a high potential signal be supplied to the second wiring.

Alternatively, in the above structure, it is preferable that the first circuit include n transistors (n is a natural number greater than or equal to 2), that the n transistors included in the first circuit be connected in series between the first wiring and the second wiring, that between two adjacent transistors in the n transistors included in the first circuit, a source or a drain of one of the two transistors be electrically connected to a source or a drain of the other transistor, and that the gate of the fourth transistor be electrically connected to a gate of at least one of the n transistors included in the first circuit.

Alternatively, in the above structure, it is preferable that the first circuit include n transistors (n is a natural number greater than or equal to 2), that the n transistors included in the first circuit be connected in series between the first wiring and the second wiring, that in the n transistors included in the first circuit, a source or a drain of a (m-1)-th transistor (m is a natural number greater than or equal to 3 and less than or equal to n) be electrically connected to a source or a drain of a (m-2)-th transistor, that of a first transistor in the n transistors included in the first circuit, one of a source and a drain and the other be electrically connected to the first wiring and a source or a drain of a second transistor, respectively, that of the n-th transistor in the n transistors included in the first circuit, one of a source and a drain and the other be electrically connected to the second wiring and a source or a drain of a (n-1)-th transistor, respectively, and that the gate of the fourth transistor be electrically connected to a gate of at least one of the n transistors included in the first circuit.

Another embodiment of the present invention is a power storage device including the above-described semiconductor device, a comparator, and an eighth transistor. One of a non-inverting input terminal and an inverting input terminal of the comparator is electrically connected to a positive electrode of a secondary battery, and the other is electrically connected to one of a source and a drain of the eighth transistor. The eighth transistor includes a metal oxide containing indium or zinc in a channel formation region. A first potential is supplied to the other of the non-inverting input terminal and the inverting input terminal when the eighth transistor is turned on, and the first potential is held when the eighth transistor is turned off. The comparator has a function of outputting an output signal based on a result of comparison between a potential of the positive electrode and a second potential. The oscillator has a function of blocking current flowing between the first wiring and the second wiring in accordance with an output signal.

Another embodiment of the present invention is a method for operating a semiconductor device including an oscillator, a first transistor, and a first circuit. The first transistor includes a metal oxide containing indium or zinc in a channel formation region. The oscillator includes a second transistor, a third transistor, a fourth transistor, a fifth transistor, and a first capacitor. The first circuits includes an input terminal. A gate of the second transistor and a gate of the third transistor are electrically connected to one of a source and a drain of the first transistor. One of a source and a drain of the second transistor is electrically connected to one of a source and a drain of the fourth transistor and one of electrodes of the first capacitor. One of a source and a drain of the third transistor is electrically connected to one of a source and a drain of the fifth transistor and the other electrode of the first capacitor. The other of the source and the drain of the fourth transistor is electrically connected to a gate of the fifth transistor. The other of the source and the drain of the fifth transistor is electrically connected to the input terminal included in the first circuit and a gate of the fourth transistor. The method includes a first step of turning the first transistor on to supply a first potential to the gate of the second transistor and the gate of the gate of the third transistor, a second step of supplying a first signal based on the first potential from the oscillator to the input terminal included in the first circuit, a third step of turning the first transistor off to hold the first potential supplied to the gate of the second transistor and the gate of the gate of the third transistor, and a fourth step of performing at least one of shaping and amplification on the first signal in the first circuit.

Alternatively, in the above structure, it is preferable that a first wiring, a second wiring, a resistor, a sixth transistor, and a seventh transistor be included, that the first wiring be electrically connected to one of a source and a drain of the sixth transistor, that the other of the source and the drain of the sixth transistor be electrically connected to one of a source and a drain of the seventh transistor, that the other of the source and the drain of the seventh transistor be electrically connected to one of electrodes of the resistor, that the other electrode of the resistor be electrically connected to the second wiring, that the other of the source and the drain of the first transistor be electrically connected to the source or the drain of the seventh transistor, that a low potential signal and a high potential signal be respectively supplied to the first wiring and the second wiring in the first step, and that at least one of the sixth transistor and the seventh transistor be turned off after the first transistor is turned off in the third step, so that current flowing between the first wiring and the second wiring is blocked.

Alternatively, in the above structure, it is preferable that a second capacitor be included, that one of electrodes of the second capacitor be electrically connected to the one of the source and the drain of the first transistor, and that the other electrode of the second capacitor be electrically connected to the first wiring.

Alternatively, in the above structure, it is preferable that the first circuit include at least one of an inverter and a buffer.

Alternatively, in the above structure, it is preferable that the second transistor to the fifth transistor each include a metal oxide containing indium or zinc in a channel formation region.

Another embodiment of the present invention is a method for operating a semiconductor device including an oscillator, a first transistor, a first circuit, and a second circuit, and a first wiring. The first transistor includes a metal oxide containing indium or zinc in a channel formation region. The oscillator includes a second transistor, a third transistor, a fourth transistor, a fifth transistor, and a first capacitor. The first circuits includes an input terminal. The first wiring is electrically connected to one of a source and a drain of the second transistor and one of a source and a drain of the third transistor. A gate of the second transistor and a gate of the third transistor are electrically connected to one of a source and a drain of the first transistor. The other of the source and the drain of the second transistor is electrically connected to one of a source and a drain of the fourth transistor and one of electrodes of the first capacitor. The other of the source and the drain of the third transistor is electrically connected to one of a source and a drain of the fifth transistor and the other electrode of the first capacitor. The other of the source and the drain of the fourth transistor is electrically connected to a gate of the fifth transistor. The other of the source and the drain of the fifth transistor is electrically connected to the first circuit and a gate of the fourth transistor. The second circuit is electrically connected to a positive electrode of a secondary battery. The method includes a first step of supplying a first potential to the second circuit, a second step of holding the first potential, a third step of outputting a second signal from the second circuit, a fourth step of a low potential signal to the first wiring from the second circuit, a fifth step of turning the first transistor on to supply a second potential to the gate of the second transistor and the gate of the third transistor, a sixth step of supplying the second signal based on the second potential to the input terminal included in the first circuit from the oscillator, a seventh step of turning the first transistor off to hold the second potential supplied to the gate of the second transistor and the gate of the third transistor, and an eighth step of performing at least one of shaping and amplification on the second signal in the first circuit.

Alternatively, in the above structure, it is preferable that a second wiring, a resistor, a sixth transistor, and a seventh transistor be included, that the first wiring be electrically connected to one of a source and a drain of the sixth transistor, that the other of the source and the drain of the sixth transistor be electrically connected to one of a source and a drain of the seventh transistor, that the other of the source and the drain of the seventh transistor be electrically connected to one of electrodes of the resistor, that the other electrode of the resistor be electrically connected to the second wiring, that the other of the source and the drain of the first transistor be electrically connected to the source or the drain of the seventh transistor, and that at least one of the sixth transistor and the seventh transistor be turned off after the first transistor is turned off in the seventh step, so that current flowing between the first wiring and the second wiring is blocked.

Alternatively, in the above structure, it is preferable that a second capacitor be included, that one of electrodes of the second capacitor be electrically connected to the one of the source and the drain of the first transistor, and that the other electrode of the second capacitor be electrically connected to the first wiring.

Alternatively, in the above structure, it is preferable that the first circuit include at least one of an inverter and a buffer.

Alternatively, in the above structure, it is preferable that the second transistor to the fifth transistor each include a metal oxide containing indium or zinc in a channel formation region.

Effect of the Invention

One embodiment of the present invention can provide a novel oscillator, a novel amplifier circuit, a novel inverter circuit, a novel amplifier circuit, a novel battery control circuit, a novel battery protection circuit, a power storage device, a semiconductor device, an electric device, and the like. Another embodiment of the present invention can provide an oscillator, an inverter circuit, an amplifier circuit, a battery control circuit, a battery protection circuit, a power storage device, a semiconductor device, an electric device, and the like that have novel structures and can reduce the power consumption.

Note that the effects of one embodiment of the present invention are not limited to the effects listed above. The effects listed above do not preclude the existence of other effects. Note that the other effects are effects that are not described in this section and will be described below. The effects that are not described in this section are derived from the descriptions of the specification, the drawings, and the like and can be extracted from these descriptions by those skilled in the art. Note that one embodiment of the present invention is to have at least one of the effects listed above and/or the other effects. Accordingly, depending on the case, one embodiment of the present invention does not have the effects listed above in some cases.

MODE FOR CARRYING OUT THE INVENTION

Figure 1:
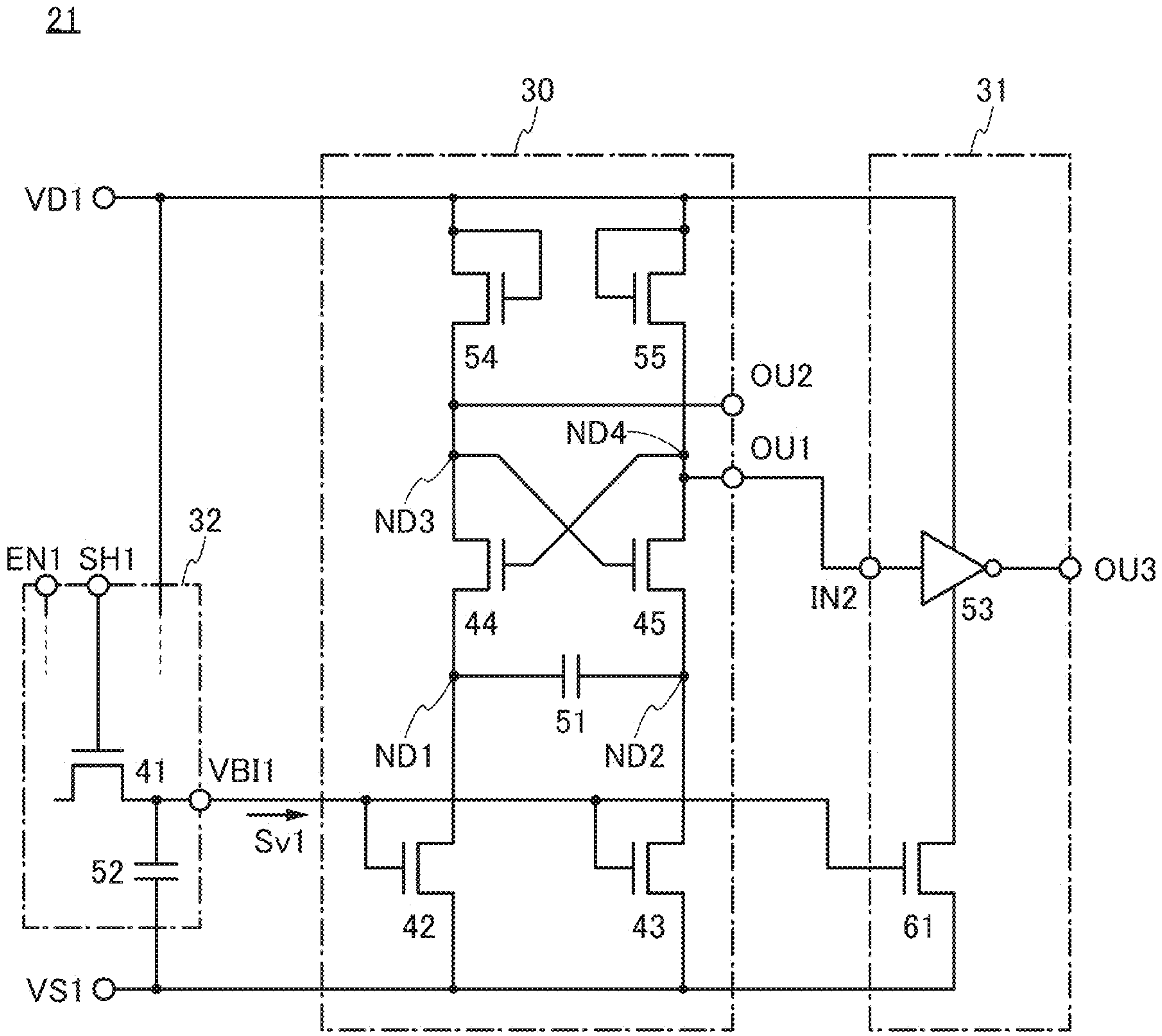
FIG. 1 is a circuit diagram illustrating a structure example of a semiconductor device.

Hereinafter, embodiments are described with reference to the drawings. Note that the embodiments can be implemented with many different modes, and it is readily understood by those skilled in the art that modes and details thereof can be changed in various ways without departing from the spirit and scope thereof. Thus, the present invention should not be construed as being limited to the following description of the embodiments.

Note that ordinal numbers such as "first," "second," and "third" in this specification and the like are used in order to avoid confusion among components. Thus, the ordinal numbers do not limit the number of components. In addition, the ordinal numbers do not limit the order of components. Furthermore, in this specification and the like, for example, a "first" component in one embodiment can be referred to as a "second" component in other embodiments or claims. Moreover, in this specification and the like, for example, a "first" component in one embodiment can be omitted in other embodiments or claims.

Note that in the drawings, the same elements, elements having similar functions, elements formed of the same material, elements formed at the same time, or the like are sometimes denoted by the same reference numerals, and repeated description thereof is omitted in some cases.

The position, size, range, and the like of each component illustrated in the drawings and the like are not accurately represented in some cases to facilitate understanding of the invention. Therefore, the disclosed invention is not necessarily limited to the position, size, range, and the like disclosed in the drawings and the like. For example, in the actual manufacturing process, a resist mask or the like might be unintentionally reduced in size by treatment such as etching, which is not illustrated in some cases for easy understanding.

In a top view (also referred to as a plan view), a perspective view, or the like, some components might not be illustrated for easy understanding of the drawings.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

Furthermore, in this specification and the like, a "terminal" refers to a wiring or an electrode connected to a wiring in some cases, for example. Moreover, in this specification and the like, part of a "wiring" is referred to as a "terminal" in some cases.

Note that the term "over" or "under" in this specification and the like does not necessarily mean that a component is placed directly over and in contact with or directly under and in contact with another component. For example, the expression "electrode B over insulating layer A" does not necessarily mean that the electrode B is formed on and in direct contact with the insulating layer A, and does not exclude the case where another component is provided between the insulating layer A and the electrode B.

Furthermore, functions of a source and a drain might be switched depending on operation conditions, e.g., when a transistor of opposite polarity is employed or a direction of current flow is changed in circuit operation. Therefore, it is difficult to define which is a source or a drain. Thus, the terms "source" and "drain" can be interchanged with each other in this specification.

In this specification and the like, the expression "electrically connected" includes the case where components are directly connected to each other and the case where components are connected through an "object having any electric function". Here, there is no particular limitation on the "object having any electric function" as long as electric signals can be transmitted and received between components that are connected through the object. Thus, even when the expression "electrically connected" is used, there is a case where no physical connection is made and a wiring just extends in an actual circuit.

In this specification and the like, "parallel" indicates a state where two straight lines are placed at an angle of greater than or equal to −10° and less than or equal to 10°, for example. Accordingly, the case where the angle is greater than or equal to −5° and less than or equal to 5° is also included. Moreover, "perpendicular" and "orthogonal" indicate a state where two straight lines are placed at an angle of greater than or equal to 80° and less than or equal to 100°, for example. Accordingly, the case where the angle is greater than or equal to 85° and less than or equal to 95° is also included.

In this specification and the like, the terms "identical", "the same", "equal", "uniform", and the like used in describing calculation values and actual measurement values allow for a margin of error of ±20% unless otherwise specified.

Furthermore, in this specification, in the case where an etching treatment is performed after a resist mask is formed, the resist mask is removed after the etching treatment, unless otherwise specified.

Note that voltage refers to a potential difference between a given potential and a reference potential (e.g., a ground potential or a source potential) in many cases. Therefore, the terms "voltage" and "potential" can be replaced with each other in many cases. In this specification and the like, "voltage" and "potential" can be replaced with each other unless otherwise specified.

Note that a "semiconductor" has characteristics of an "insulator" when the conductivity is sufficiently low, for example. Thus, a "semiconductor" and an "insulator" can be replaced with each other. In that case, a "semiconductor" and an "insulator" cannot be strictly distinguished from each other because a border therebetween is not clear. Accordingly, a "semiconductor" and an "insulator" in this specification can be replaced with each other in some cases.

Furthermore, a "semiconductor" has characteristics of a "conductor" when the conductivity is sufficiently high, for example. Thus, a "semiconductor" and a "conductor" can be replaced with each other. In that case, a "semiconductor" and a "conductor" cannot be strictly distinguished from each other because a border therebetween is not clear. Accordingly, a "semiconductor" and a "conductor" in this specification can be replaced with each other in some cases.

Note that in this specification and the like, an "on state" of a transistor refers to a state in which a source and a drain of the transistor are regarded as being electrically short-circuited (also referred to as a "conduction state"). Furthermore, an "off state" of a transistor refers to a state in which a source and a drain of the transistor are regarded as being electrically disconnected (also referred to as a "non-conduction state").

In addition, in this specification and the like, an "on-state current" sometimes refers to a current that flows between a source and a drain when a transistor is in an on state. Furthermore, an "off-state current" sometimes refers to a current that flows between a source and a drain when a transistor is in an off state.

In this specification and the like, a high potential signal refers to a power supply potential at a potential higher than a low potential signal. The low potential signal refers to a power supply potential at a potential lower than the high potential signal. A ground potential can be used as the high potential signal or the low potential signal. For example, in the case where a ground potential is used as the high potential signal, the low potential signal is a potential lower than the ground potential, and in the case where a ground potential is used as the low potential signal, the high potential signal is a potential higher than the ground potential. Furthermore, the high potential signal is referred to as a high power supply potential in some cases. Moreover, the low potential signal is referred to as a low power supply potential in some cases.

In this specification and the like, a gate refers to part or the whole of a gate electrode and a gate wiring. A gate wiring refers to a wiring for electrically connecting at least one gate electrode of a transistor to another electrode or another wiring.

In this specification and the like, a source refers to part or the whole of a source region, a source electrode, and a source wiring. A source region refers to a region in a semiconductor layer where the resistivity is lower than or equal to a given value. A source electrode refers to part of a conductive layer which is connected to a source region. A source wiring refers to a wiring for electrically connecting at least one source electrode of a transistor to another electrode or another wiring.

Moreover, in this specification and the like, a drain refers to part or all of a drain region, a drain electrode, or a drain wiring. A drain region refers to a region in a semiconductor layer where the resistivity is lower than or equal to a given value. A drain electrode refers to part of a conductive layer which is connected to a drain region. A drain wiring refers to a wiring for electrically connecting at least one drain electrode of a transistor to another electrode or another wiring.

Embodiment 1

In this embodiment, an example of a semiconductor device of one embodiment of the present invention will be described.

<Example of Semiconductor Device>

A semiconductor device 21 illustrated in FIG. 1 includes an oscillator 30, a circuit 31, a circuit 32, a wiring VD1, and a wiring VS1. Each of the wiring VD1 and the wiring VS1 is electrically connected to the oscillator 30, the circuit 31, and the circuit 32. For example, a high potential signal is supplied to the wiring VD1, and a low potential signal is supplied to the wiring VS1.

The oscillator 30 includes a transistor 42, a transistor 43, a transistor 44, a transistor 45, a capacitor 51, a terminal OU1, and a terminal OU2. A terminal VBI1 included in the circuit 32 is electrically connected to the oscillator 30 and the like. The terminal VBI1 has a function of supplying a signal Sv1 to the oscillator 30 and the like.

One of a source and a drain of the transistor 42 is electrically connected to one of a source and a drain of the transistor 44, one of electrodes of the capacitor 51, and a node ND1. One of a source and a drain of the transistor 43 is electrically connected to one of a source and a drain of the transistor 45, the other electrode of the capacitor 51, and a node ND2. The other of the source and the drain of the transistor 44 is electrically connected to a gate of the transistor 45, the terminal OU2, and a node ND3. The other of the source and the drain of the transistor 45 is electrically connected to a gate of the transistor 44, the terminal OU1, and a node ND4. The other of the source and the drain of the transistor 42 and the other of the source and the drain of the transistor 43 are electrically connected to the wiring VS1.

The terminal OU1 is electrically connected to a terminal IN2 included in the circuit 31.

Furthermore, the oscillator 30 preferably includes a transistor 54 and a transistor 55. In FIG. 1, one of a source and a drain of the transistor 54 is electrically connected to the gate of the transistor 45. The other of the source and the drain and a gate of the transistor 54 are electrically connected to the wiring VD1. One of a source and a drain of the transistor 55 is electrically connected to the gate of the transistor 44. The other of the source and the drain and a gate of the transistor 55 are electrically connected to the wiring VD1.

Instead of the transistor 54 and the transistor 55, a resistor may be used. Alternatively, a plurality of transistors which are connected in series, whose gates are electrically connected to each other, may be used.

The oscillator 30, for example, has a function of outputting a signal with a frequency determined depending on a capacitance value of the capacitor 51, threshold values of the transistor 44 and the transistor 45, current flowing through the transistor 44 and the transistor 45, or the like, to the terminal OU1 or the like.

The oscillator 30 is sometimes called Source Coupled Voltage Controlled Oscillator.

Gates of the transistor 42 and the transistor 43 are electrically connected to the terminal VBI1. The amount of drain current of the transistor 42 and the transistor 43 can be controlled by the signal Sv1 supplied from the terminal VBI1. Thus, the amount of current flowing through the transistor 44 and the transistor 44 in the oscillator 30 can be controlled by the signal Sv1.

In addition, a change in the signal Sv1 enables the frequency of the oscillator 30 to be modified.

The circuit 31 includes an inverter 53. Note that the circuit 31 may include a buffer circuit instead of the inverter. The circuit 31 preferably has a function of performing shaping, amplification, or the like on a signal supplied to the terminal IN2.

The circuit 31 illustrated in FIG. 1 includes the inverter 53, a transistor 61, the terminal IN2, and a terminal OU3. The inverter 53 has a function of outputting a signal input from the terminal IN2 to the terminal OU3.

The inverter 53 is supplied with a high potential signal from the wiring VD1. One of a source and a drain of the transistor 61 is electrically connected to the inverter 53, and the other of the source and the drain of the transistor 61 is electrically connected to the wiring VS1. When the transistor 61 is in an on state, a low potential signal is supplied from the wiring VS1 to the inverter 53 through the transistor 61.

A gate of the transistor 61 is electrically connected to the terminal VBI1. The amount of drain current of the transistor 61 can be controlled by the signal Sv1 supplied from the terminal VBI1. Thus, the current flowing between the wiring VD1 and the wiring VS1 through the inverter 53 in the circuit 31 can be controlled by the signal Sv1. Consequently, power more than necessary is not supplied to the circuit 31, and the power consumption of the circuit 31 can be reduced.

The circuit 32 illustrated in FIG. 1 includes a transistor 41, the terminal VBI1, a terminal SH1, and a terminal EN1. One of a source and a drain of the transistor 41 is electrically connected to the terminal VBI1. A gate of the transistor 41 is electrically connected to the terminal SH1. Furthermore, the circuit 32 preferably includes a capacitor 52. In FIG. 1, one of electrodes of the capacitor 52 is electrically connected to the terminal SH1 of the transistor 41, and the other electrode is electrically connected to the wiring VS1.

Detailed description of the circuit 32 will be made later.

The transistor included in the semiconductor device 21 may include a back gate. In the semiconductor device 21 illustrated in FIG. 2, the transistor 42, the transistor 43, the transistor 44, the transistor 45, the transistor 54, the transistor 55, and the transistor 61 have back gates electrically connected to respective sources or drains, and a back gate of the transistor 41 is electrically connected to the wiring VS1.

Figure 2:
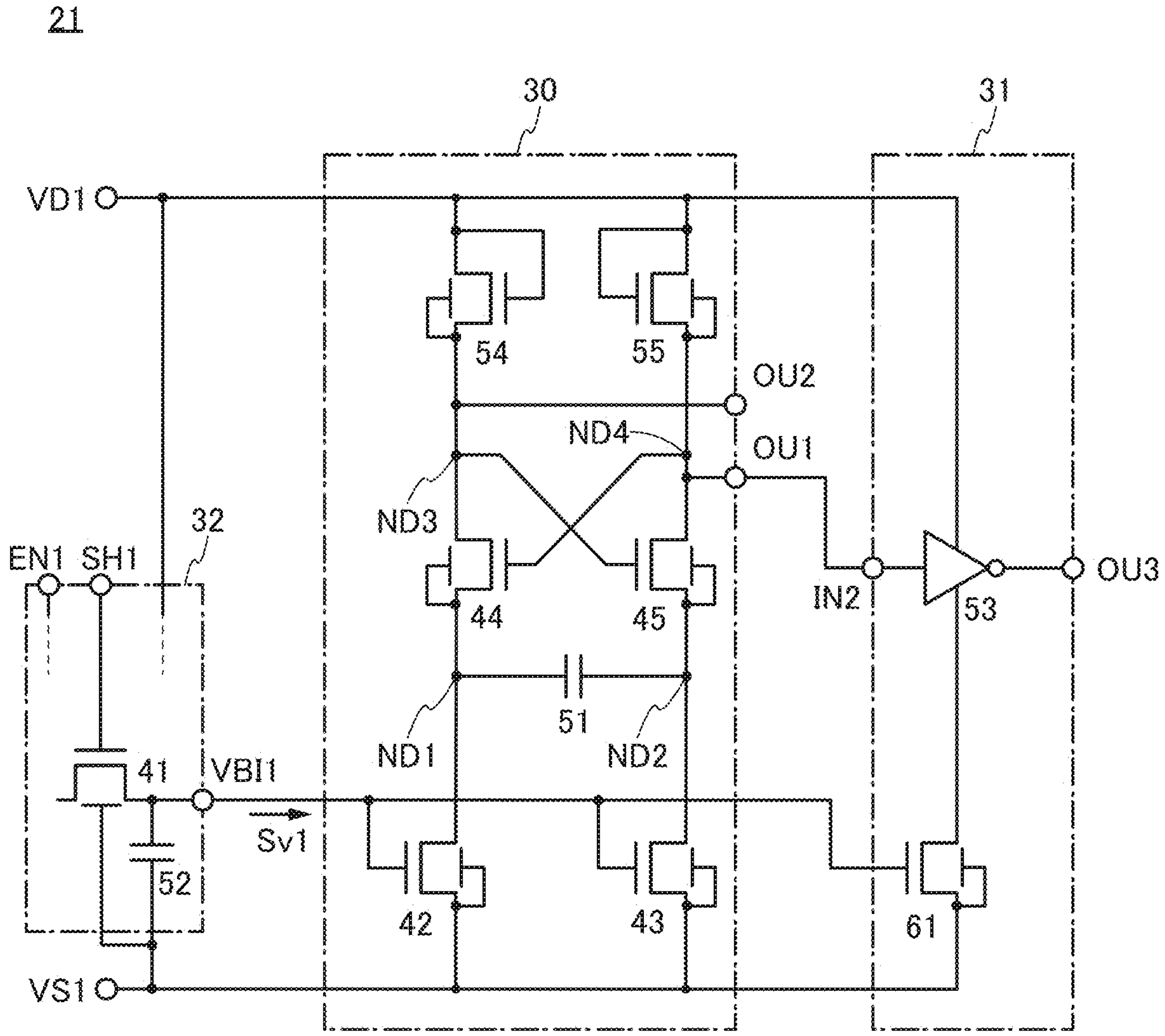
FIG. 2 is a circuit diagram illustrating a structure example of a semiconductor device.

Although the semiconductor device 21 illustrated in FIG. 2 shows an example where the back gates of the transistor 42, the transistor 43, the transistor 44, the transistor 45, the transistor 54, the transistor 55, and the transistor 61 are electrically connected to the sources or drains thereof, the back gate of the transistor may be supplied with a predetermined potential, and the potential may be fixed. The predetermined potential may be, for example, a potential of the wiring VS1. Alternatively, one potential selected from several potentials may be supplied to the back gate. Alternatively, the potential may be changed over time. The back gate may be electrically connected to a gate coupled with the back gate with a gate insulator and a semiconductor layer provided therebetween.

FIG. 3A, FIG. 3B, FIG. 3C, and FIG. 3D each illustrate a specific structure example of the circuit 32. The circuit 32 has a function of outputting a desired potential from the terminal VBI1 and holding the potential.

Figure 3A:
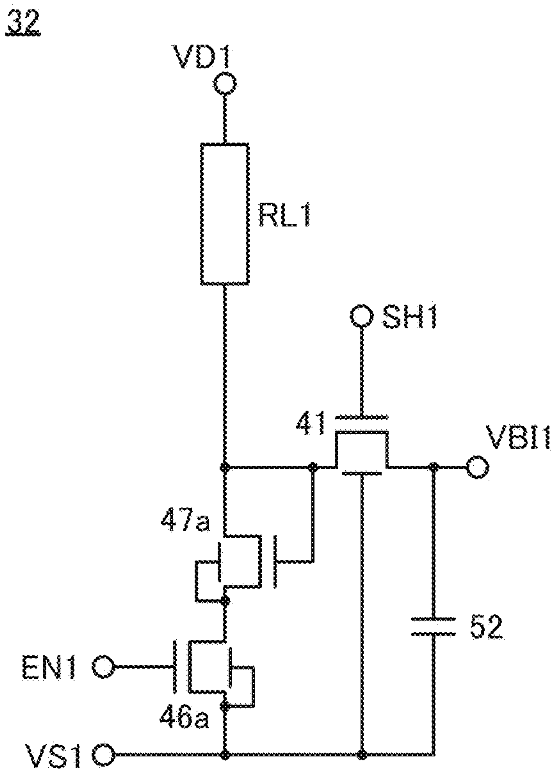
FIG. 3A is a diagram illustrating a structure example of a circuit.

The circuit 32 illustrated in FIG. 3A includes the transistor 41, a transistor 46*a*, a transistor 47*a*, the capacitor 52, and a resistor RL1. In FIG. 3A, one of a source and a drain of the transistor 41 is electrically connected to the terminal VBI1 and one of electrodes of the capacitor 52. The other electrode of the capacitor 52 is electrically connected to the wiring VS1. The other of the source and the drain of the transistor 41 is electrically connected to one of terminals of the resistor RL1, one of a source and a drain of the transistor 47*a*, and a gate of the transistor 47*a*. A gate of the transistor 41 is electrically connected to the terminal SH1. The other terminal of the resistor RL1 is electrically connected to the wiring VD1. The other of the source and the drain of the transistor 47*a* is electrically connected to one of a source and a drain of the transistor 46*a*, and the other of the source and the drain of the transistor 46*a* is electrically connected to the wiring VS1. A gate of the transistor 46*a* is electrically connected to the terminal EN1.

A transistor may be used as the resistor. Furthermore, the resistor may be a current source. For example, instead of the resistor, a current generation circuit may be connected, and current from the circuit may be supplied.

Figure 3B:
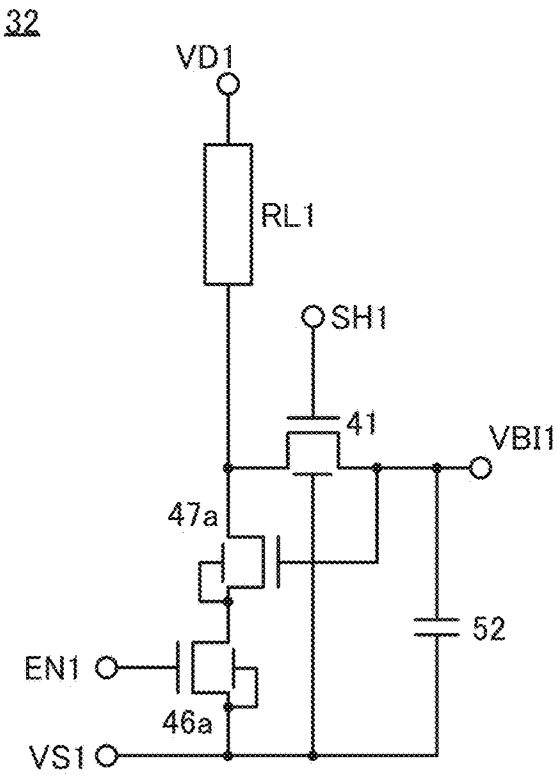
FIG. 3B is a diagram illustrating a structure example of a circuit.

The circuit 32 illustrated in FIG. 3B includes the transistor 41, the transistor 46*a*, the transistor 47*a*, the capacitor 52, and the resistor RL1. The circuit 32 illustrated in FIG. 3B is different from that in FIG. 3A in that the terminal VBI1 is electrically connected not to one of a source and a drain of the transistor 41 but to the gate of the transistor 47*a*.

Figure 3C:
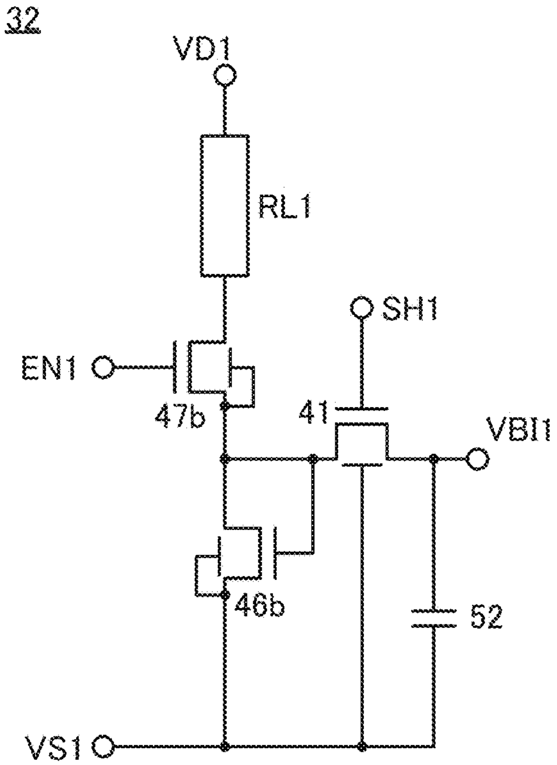
FIG. 3C is a diagram illustrating a structure example of a circuit.

The circuit 32 illustrated in FIG. 3C includes the transistor 41, a transistor 46*b*, a transistor 47*b*, the capacitor 52, and the resistor RL1. In FIG. 3C, one of a source and a drain of the transistor 41 is electrically connected to the terminal VBI1 and one of electrodes of the capacitor 52. The other electrode of the capacitor 52 is electrically connected to the wiring VS1. The other of the source and the drain of the transistor 41 is electrically connected to one of a source and a drain of the transistor 47*b*, a gate of the transistor 46*b*, and one of a source and a drain of the transistor 46*b*. A gate of the transistor 41 is electrically connected to the terminal SH1. The other of the source and the drain of the transistor 46*b* is electrically connected to the wiring VS1. The other of the source and the drain of the transistor 47*b* is connected to one of terminals of the resistor RL1. The other terminal of the resistor RL1 is electrically connected to the wiring VD1. A gate of the transistor 47*b* is electrically connected to the terminal EN1.

Figure 3D:
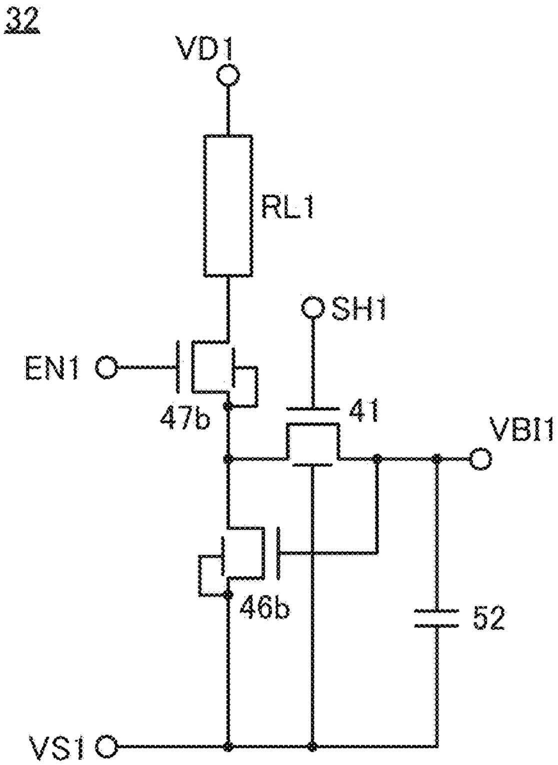
FIG. 3D is a diagram illustrating a structure example of a circuit.

The circuit 32 illustrated in FIG. 3D includes the transistor 41, the transistor 46*b*, the transistor 47*b*, the capacitor 52, and the resistor RL1. The circuit 32 illustrated in FIG. 3D is different from that in FIG. 3C in that the terminal VBI1 is electrically connected not to one of a source and a drain of the transistor 41 but to a gate of the transistor 46*b*. Although an example in which the back gate of the transistor 41 is electrically connected to the wiring VS1 is shown in FIG. 3A, FIG. 3B, FIG. 3C, FIG. 3D, or the like, the back gate of the transistor 41 may be electrically connected to a terminal that outputs a potential different from that from the wiring VS1. Alternatively, the back gate of the transistor 41 may be electrically connected to one of the source and the drain of the transistor 41. Alternatively, the back gate of the transistor may be electrically connected to a gate coupled with the back gate with a gate insulator and a semiconductor layer provided therebetween.

When a transistor including an oxide semiconductor in a channel formation region (hereinafter referred to as an OS transistor) is used as the transistor 41, its off-state current can be extremely reduced. A preferable potential is supplied to the terminal VBI1 when the transistor 41 is brought into an on state, and then the transistor 41 is turned off, so that a floating state is made and the supplied potential is held. Accordingly, the potential can be programmed to the node ND2.

The OS transistor will be described in detail later.

A potential that turns the transistor 41 on is supplied to the terminal SH1, whereby the transistor 41 is turned on, and a desired potential is supplied as the signal Sv1 to the terminal VBI1. After that a potential that turns the transistor off is supplied to the terminal SH1, whereby the transistor 41 is turned off, and the potential of the terminal VBI1 is held. When an OS transistor is used as the transistor 41, the potential supplied from the terminal VBI1 can be held for a long time, preferably longer than or equal to one minute, further preferably longer than or equal to one hour, still further preferably longer than or equal to 10 hours.

After that, a potential that turns the transistor 46*a* or the transistor 46*b* off is supplied to the terminal EN1, so that current flowing between the wiring VD1 and the wiring VS1 through the resistor RL1 or the like can be blocked in the circuit 32. Blocking of the current enables power consumption of the circuit 32 to be reduced significantly.

It is preferable that at least one of the transistor 46*a* and the transistor 46*b* be an OS transistor. More specifically, for example, an OS transistor is used for the transistor whose gate is electrically connected to the terminal EN1 as the transistor 46*a* or the transistor 46*b*, in which case the leakage current can be extremely made low when current flowing between the wiring VD1 and the wiring VS1 is blocked in the circuit 32.

Furthermore, after a potential that turns the transistor 46*a* or the transistor 46*b* off is supplied to the terminal EN1, circuits supplying signals, power, current, or the like to the circuit 32, such as a control circuit, a power supply circuit, a current generation circuit, a voltage generation circuit, a current source, and a constant current source may be brought into an off state. When these circuits are brought into an off state, power consumption can be reduced.

All the transistors included in the oscillator 30, the circuit 31, and the circuit 32 included in the semiconductor device illustrated in FIG. 1 may be OS transistors. All the transistors included in the oscillator 30, the circuit 31, and the circuit 32 included in the semiconductor device illustrated in FIG. 1 may be transistors having the same conductivity, e.g., n-channel transistors. For example, all the transistors may be n-channel OS transistors.

An OS transistor can be stacked over a layer including a transistor using silicon in a channel formation region (hereinafter, the transistor is referred to as Si transistor). When all the transistors included in the oscillator 30, the circuit 31, and the circuit 32 are OS transistors, the oscillator 30, the circuit 31, and the circuit 32 are stacked over a circuit formed using Si transistors, which enables a reduction in a circuit area.

An oxide semiconductor used in an OS transistor can be formed by a thin film method such as a sputtering method. Thus, an OS transistor can be formed easily over various substrates including a glass substrate, and accordingly, a semiconductor device can be manufactured at low cost in some cases.

Figure 4A:
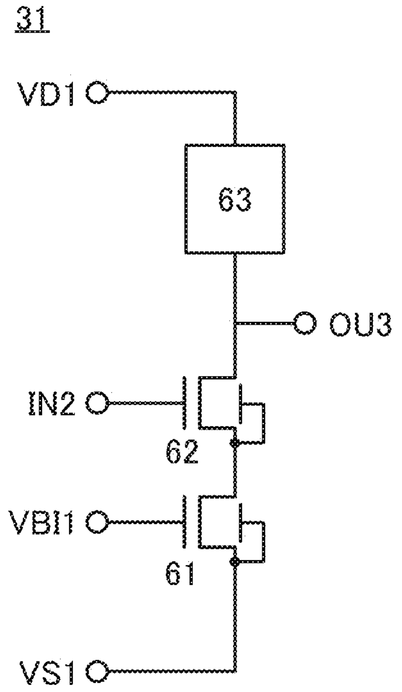
FIG. 4A is a diagram illustrating a structure example of a circuit.

FIG. 4A illustrates a structure example of the circuit 31. The circuit 31 illustrated in FIG. 4A includes the transistor 61, a transistor 62, and a circuit 63. A gate of the transistor 61 is electrically connected to the terminal VBI1. One of a source and a drain of the transistor 61 and the other thereof are electrically connected to one of a source and a drain of the transistor 62 and the wiring VS1, respectively. The other of the source and the drain of the transistor 62 is electrically connected to the circuit 63 and the terminal OU3. A gate of the transistor 62 is electrically connected to the terminal IN2.

In FIG. 4A, the transistor 61 and the transistor 62 include a back gate which is electrically connected to a source or a drain of the respective transistors.

Figure 4B:
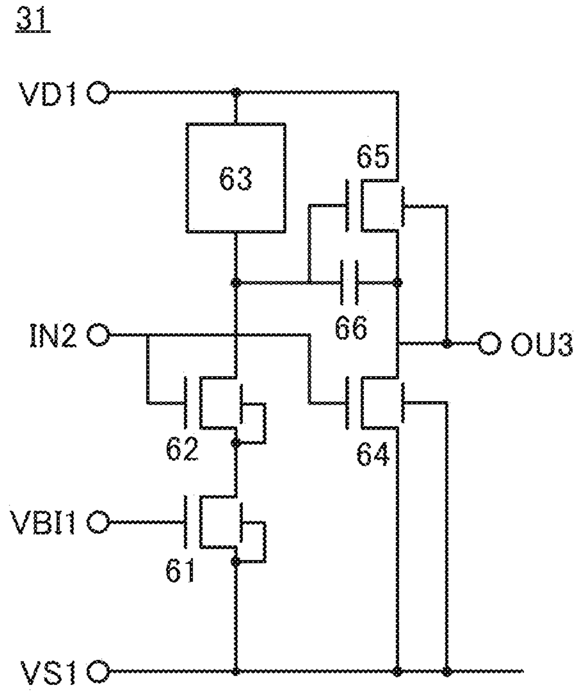
FIG. 4B is a diagram illustrating a structure example of a circuit.

FIG. 4B illustrates a structure example of the circuit 31. The circuit 31 illustrated in FIG. 4B includes a transistor 64, a transistor 65, and a capacitor 66 in addition to the components in the circuit 31 illustrated in FIG. 4A. A gate of the transistor 61 is electrically connected to the terminal VBI1. One of a source and a drain of the transistor 61 and the other thereof are electrically connected to one of a source and a drain of the transistor 62 and the wiring VS1, respectively. The other of the source and the drain of the transistor 62 is electrically connected to the circuit 63, one of electrodes of the capacitor 66, and a gate of the transistor 65. The other electrode of the capacitor 66 is electrically connected to one of a source and a drain of the transistor 64, one of a source and a drain of the transistor 65, and the terminal OU3. A gate of the transistor 62 and a gate of the transistor 64 are electrically connected to the terminal IN2. The other of the source and the drain of the transistor 64 is electrically connected to the wiring VS1, and the other of the source and the drain of the transistor 65 is electrically connected to the wiring VD1.

In FIG. 4B, each of the transistor 64 and the transistor 65 includes a back gate. The back gate of the transistor 64 is, for example, electrically connected to the wiring VS1. The back gate of the transistor 65 is, for example, electrically connected to the terminal OU3.

Figure 4C:
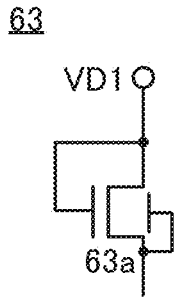
FIG. 4C is a diagram illustrating a structure example of a circuit.
Figure 4D:
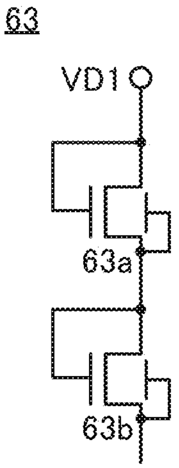
FIG. 4D is a diagram illustrating a structure example of a circuit.
Figure 4E:
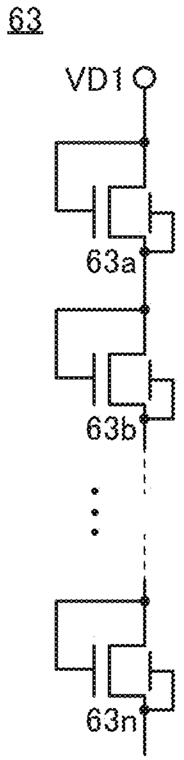
FIG. 4E is a diagram illustrating a structure example of a circuit.

FIG. 4C, FIG. 4D, and FIG. 4E each illustrate an example of the circuit 63. The circuit 63 illustrated in FIG. 4C includes a transistor 63*a*. One of a source and a drain of the transistor 63*a* is electrically connected to a gate of the transistor 63*a* and the wiring VD1. The other of the source and the drain of the transistor 63*a* is electrically connected to the other of the source and the drain of the transistor 62.

The circuit 63 illustrated in FIG. 4D includes the transistor 63*a* and a transistor 63*b*. The wiring VD1 is electrically connected to one of a source and a drain of the transistor 63*a* and a gate thereof. The other of the source and the drain of the transistor 63*a* is electrically connected to one of a source and a drain of the transistor 63*b* and a gate thereof. The other of the source and the drain of the transistor 63*b* is electrically connected to the other of the source and the drain of the transistor 62.

As illustrated in FIG. 4E, the circuit 63 may include n (n is an integer greater than or equal to 2) transistors. The wiring VD1 is electrically connected to one of a source and a drain of a first transistor (transistor 63*a* in FIG. 4E) and a gate thereof. The other of the source and the drain of the first transistor is electrically connected to one of a source and a drain of a second transistor (transistor 63*b* in FIG. 4E) and a gate thereof. The same applies hereinafter; the other of the source and the drain of one transistor is electrically connected to one of a source and a drain of a next-stage transistor and a gate thereof. The other of a source and a drain of the n-th transistor (transistor 63*n* in FIG. 4E) is electrically connected to the other of the source and the drain of the transistor 62.

Each of the transistors illustrated in FIG. 4C, FIG. 4D, and FIG. 4E includes a back gate, and the back gates are electrically connected to the respective sources or drains of the transistors.

Figure 5:
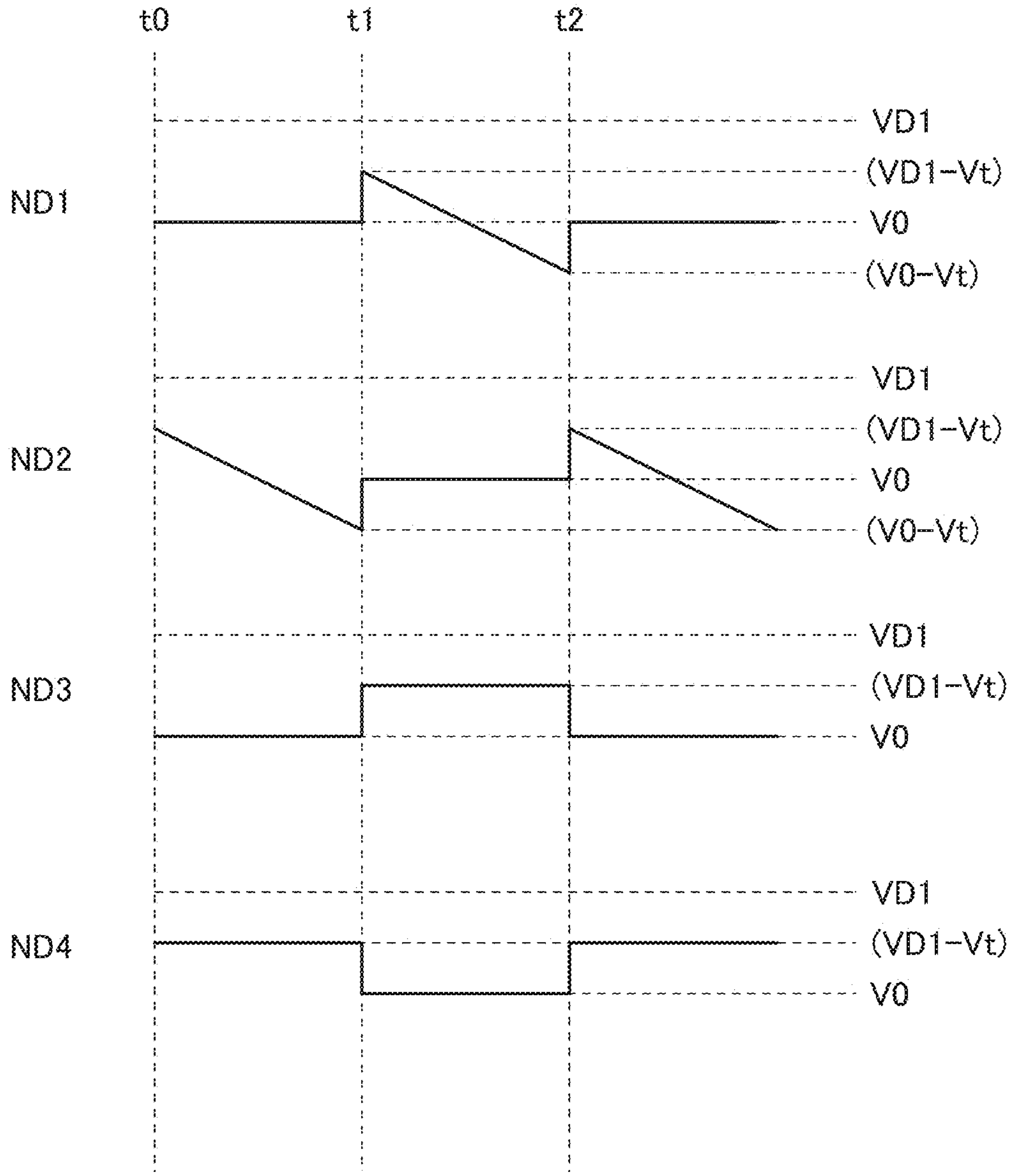
FIG. 5 is a timing chart showing an operation example of a semiconductor device.

FIG. 5 is a timing chart showing an operation example of the oscillator 30.

Here, the threshold values of the transistor 54, the transistor 55, the transistor 44, and the transistor 45 are each referred to as a potential Vt. Although these threshold values of the transistors vary between the transistors in some cases, the threshold values of the transistors are assumed to have the same value here for simple description.

Assuming the oscillator 30, at a certain time, in which one of the transistor 44 and the transistor 45 is in an on state and the other is in an off state, an example of subsequent operation of the oscillator 30 is considered. Here, the case where the transistor 44 is in an on state and the transistor 45 is in an off state at a time 10 is considered as an example.

At the time t0, the transistor 45 is in an off state, the potential of the node ND4 is, for example, a potential lower by the threshold value of the transistor 55 than a potential VD1, that is, a potential represented as (VD1−Vt).

At the time t0, the transistor 44 is in an on state, and the potentials of the node ND1 and the node ND3 are substantially the same. The potentials of the node ND1 and the node ND3 at the time t0 are set to a potential V0. The potential V0 is a value at least lower by the threshold value of the transistor 44 than the potential (VD1−Vt), e.g., a potential represented as (VD1−2Vt).

The transistor 45 is in an off state, and charge of the capacitor 51 leaks to the transistor 43 or the like, whereby the potential of the node ND2 is gradually reduced over time.

At a time t1, when the potential of the node ND2 becomes a potential lower by the threshold value of the transistor 45 than the potential of the node ND3, that is, a potential represented as (V0−Vt), the transistor 45 is turned on.

When the transistor 45 is brought into an on state and a conducting state is made, the potential of the node ND4 is decreased, and the potential of the gate with respect to the source (Vgs) in the transistor 44 is lower than or equal to the potential Vt (Vgs≤Vt), so that the transistor 44 is turned off.

When the transistor 44 is brought into an off state, the potential of the node ND3 is increased, for example, to a potential that is lower by the threshold value of the transistor 54 than the potential VD1, i.e., the potential represented as (VD1−Vt). The potential of the node ND1 increases with the potential of the node ND3. After that, the potential of the node ND1 is gradually reduced over time by leakage from the capacitor 51.

At a time t2, when the potential of the node ND1 becomes lower by the threshold value of the transistor 44 than the potential of the node ND4, the transistor 44 is turned on. When the transistor 44 is brought into an on state, the potentials of the node ND1 and the node ND3 are each the potential V0. The transistor 45 is turned off, and the potential of the node ND4 is increased to the potential (VD1−Vt). The potential of the node ND2 is increased with the potential of the node ND4 but is reduced over time.

The potential of the node ND4 is the potential VD1−Vt during a period from the time t0 to the time t1 and then the potential V0 during a period from the time t1 to the time t2. After that, a change of the potential of the node ND4 is repeated between the potential VD1−Vt and the potential V0 alternately; accordingly a function of an oscillator is obtained. The time length from the time t0 to the time t1 and the time length from the time t1 to the time t2 are determined by the magnitude of the capacitance value of the capacitor 51, the amount of current flowing through the transistor 42 and the transistor 43, the threshold values of the transistor 54, the transistor 55, the transistor 44, and the transistor 45, and the like.

Figure 6A:
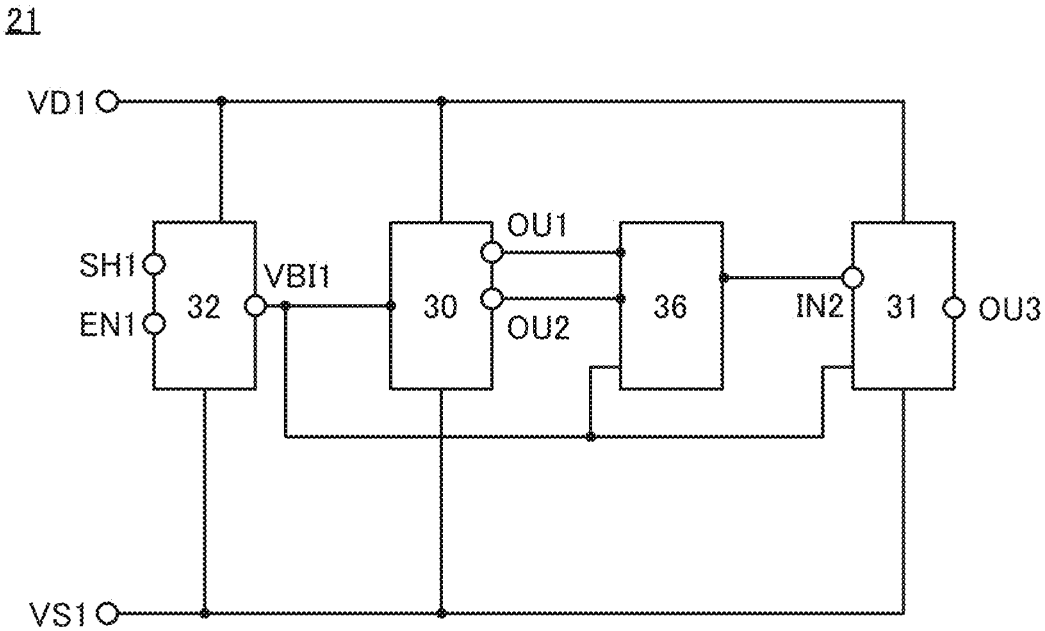
FIG. 6A is a circuit diagram illustrating a structure example of a semiconductor device.

FIG. 6A illustrates a structure example of the semiconductor device 21. The semiconductor device 21 illustrated in FIG. 6A includes an amplifier circuit 36 in addition to the components illustrated in FIG. 1 and the like. To the amplifier circuit 36, signals output from the terminal OU1 and the terminal OU2 of the oscillator 30 are supplied. The amplifier circuit 36 has a function of generating an amplified signal based on the signals supplied from the terminal OU1 and the terminal OU2 and supplying the amplified signal to the terminal IN2 of the circuit 31.

Figure 6B:
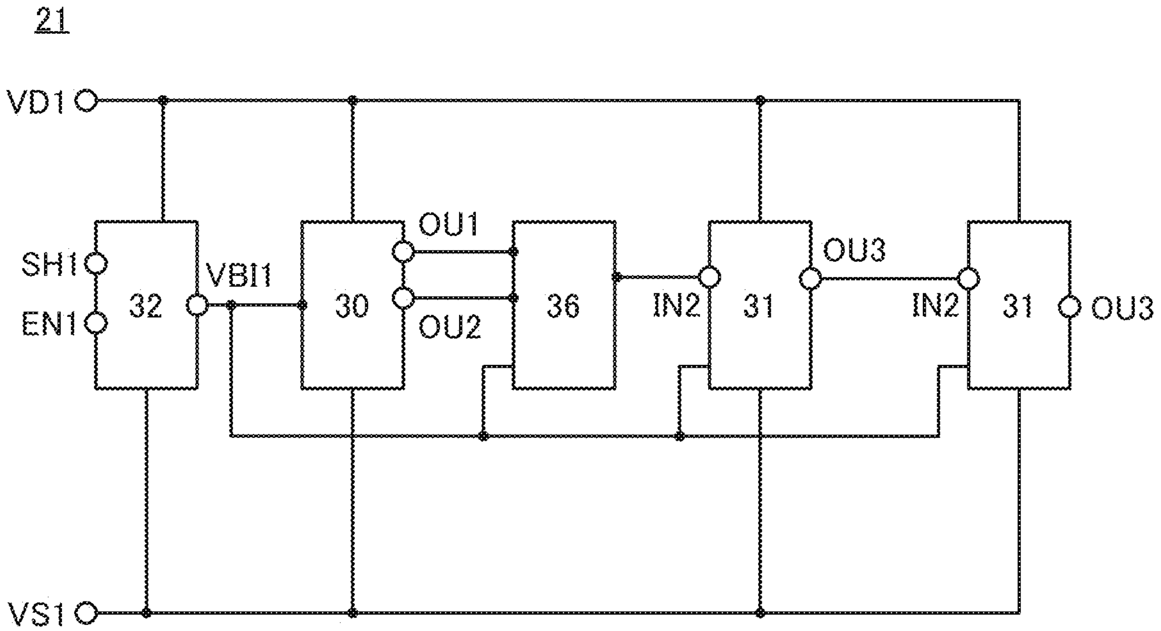
FIG. 6B is a circuit diagram illustrating a structure example of a semiconductor device.

In the structure of the semiconductor device 21 illustrated in FIG. 1, FIG. 2, FIG. 6A, or the like, the circuits 31 used at an output portion may be stacked to have two stages. FIG. 6B illustrates an example in which two-stage stacked circuits 31 are used at an output portion in the structure illustrated in FIG. 6A.

Figure 7A:
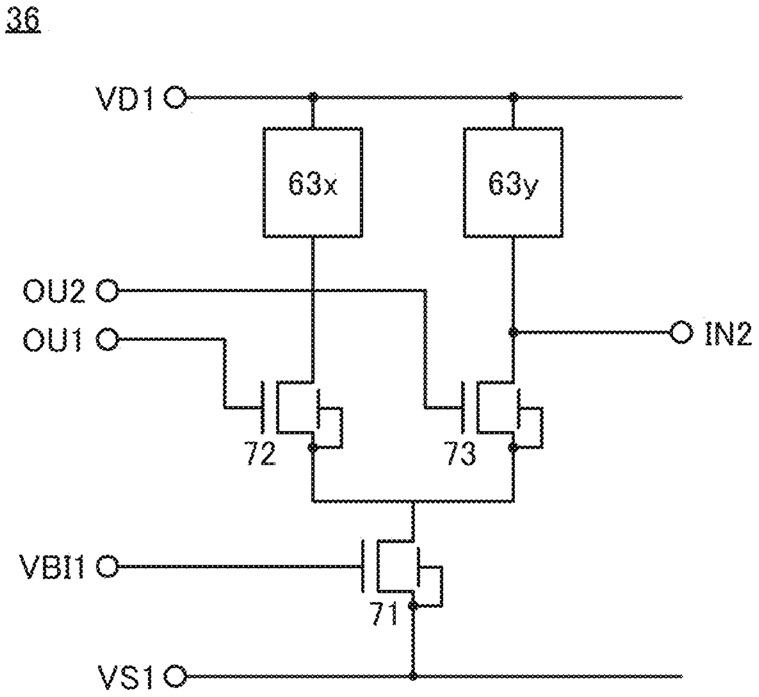
FIG. 7A is a circuit diagram illustrating a structure example of an amplifier circuit.
Figure 7B:
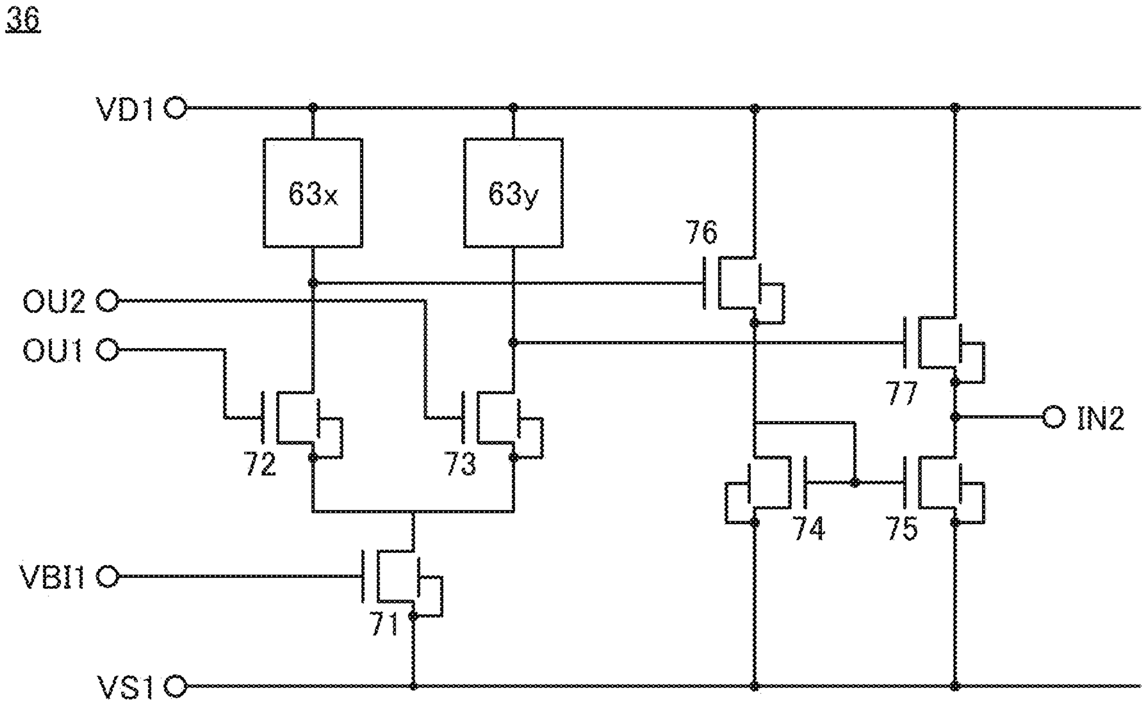
FIG. 7B is a circuit diagram illustrating a structure example of an amplifier circuit.

FIG. 7A and FIG. 7B each illustrate an example of the amplifier circuit 36.

The amplifier circuit 36 illustrated in FIG. 7A includes a transistor 71, a transistor 72, a transistor 73, a circuit 63*x*, and a circuit 63*y*. As the circuit 63*x* and the circuit 63*y*, the circuit 63 or the like illustrated in FIG. 4C, FIG. 4D, and FIG. 4E can be used.

In FIG. 7A, the circuit 63*x* is positioned between the wiring VD1 and one of a source and a drain of the transistor 72 and electrically connected to them. The circuit 63*y* is positioned between the wiring VD1 and one of a source and a drain of the transistor 73 and electrically connected to them. The one of the source and the drain of the transistor 73 is electrically connected to the terminal IN2. A gate of the transistor 72 is electrically connected to the terminal OU1. A gate of the transistor 73 is electrically connected to the terminal OU2. A back gate and the other of the source and the drain of the transistor 72 and a back gate and the other of the source and the drain of the transistor 73 are electrically connected to one of a source and a drain of the transistor 71. The other of the source and the drain and a back gate of the transistor 71 are electrically connected to the wiring VS1. A gate of the transistor 71 is electrically connected to the terminal VBI1 of the circuit 32.

The amplifier circuit 36 illustrated in FIG. 7A has a function of amplifying a difference of a signal supplied to the terminal OU1 and a signal supplied to the terminal OU2.

The amplifier circuit 36 illustrated in FIG. 7B includes a transistor 74, a transistor 75, a transistor 76, and a transistor 77, in addition to the components illustrated in FIG. 7A.

Although the one of the source and the drain of the transistor 73 in FIG. 7A is electrically connected to the terminal IN2, a corresponding one in FIG. 7B is electrically connected to a gate of the transistor 77. Moreover, in FIG. 7B, one of a source and a drain of the transistor 72 and the circuit 63*x* are electrically connected to a gate of the transistor 76.

One of a source and a drain of the transistor 76 is electrically connected to the wiring VD1, and the other of the source and the drain of the transistor 76 is electrically connected to one of a source and a drain of the transistor 74, a gate of the transistor 74, and a gate of the transistor 75. The other of the source and the drain of the transistor 74 is electrically connected to a back gate of the transistor 74 and the wiring VS1.

One of a source and a drain of the transistor 77 is electrically connected to the wiring VD1, and the other of the source and the drain of the transistor 77 is electrically connected to one of a source and a drain of the transistor 75 and the terminal IN2. The other of the source and the drain of the transistor 75 is electrically connected to a back gate of the transistor 75 and the wiring VS1.

Including the amplifier circuit 36 and the circuit 31 described above, the semiconductor device 21 can perform amplification and shaping of a signal with a desired frequency, which is generated by the oscillator 30, and obtain a preferable output signal.

Figure 8A:
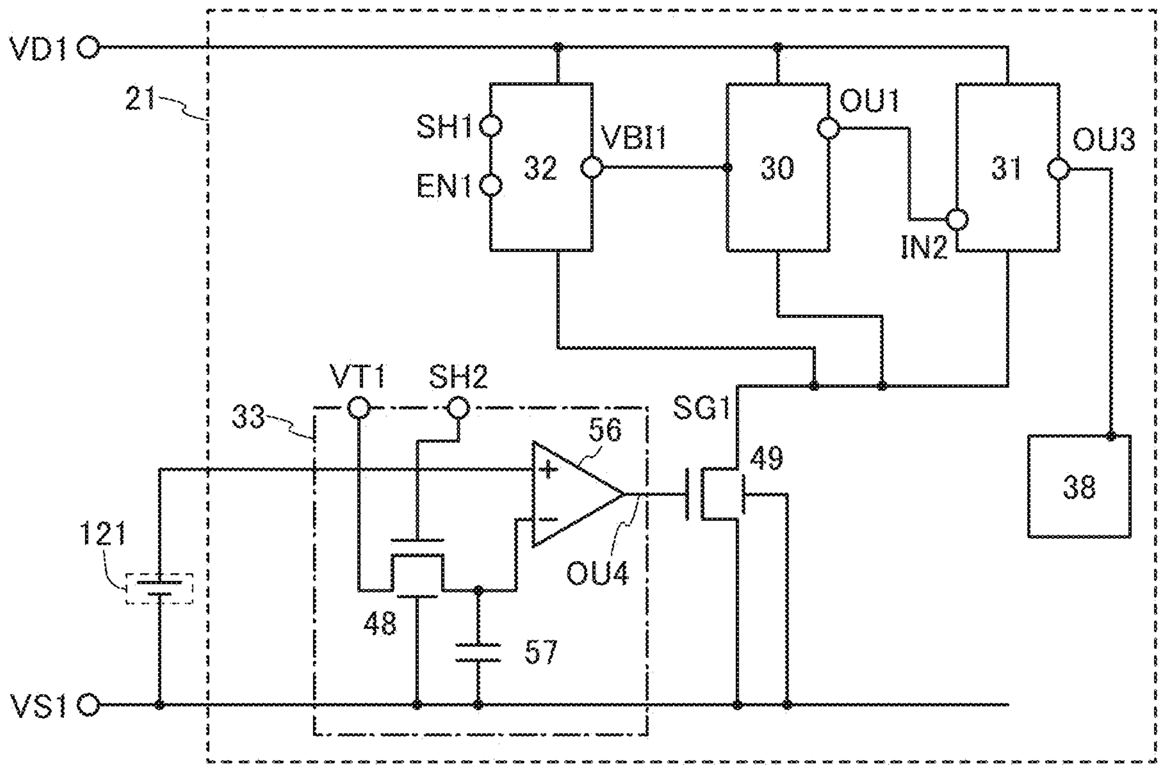
FIG. 8A is a circuit diagram illustrating an example of a secondary battery and a semiconductor device.

FIG. 8A illustrates an example in which the semiconductor device of one embodiment of the present invention is used with a secondary battery. The semiconductor device of one embodiment of the present invention is connected to the secondary battery, whereby a power storage device can be formed.

FIG. 8A illustrates a secondary battery 121 and the semiconductor device 21 electrically connected to the secondary battery 121. The semiconductor device 21 illustrated in FIG. 8A includes a circuit 33, a transistor 49, the circuit 32, the oscillator 30, and the circuit 31.

The circuit 33 includes a comparator 56, a transistor 48, and a capacitor 57. The comparator 56 has a function of comparing a reference potential and a positive electrode potential of the secondary battery 121 and outputting a signal based on a comparison result. In the example illustrated in FIG. 8A, a positive electrode of the secondary battery 121 is electrically connected to a non-inverting input terminal of the comparator, and an inverting input terminal of the comparator 56 is supplied with a reference potential. Although in the example illustrated in FIG. 8A, the reference potential and a potential compared with the reference potential are respectively supplied to the inverting input terminal and the non-inverting input terminal, the reference potential and the potential compared with the reference potential may be respectively supplied to the non-inverting input terminal and the inverting input terminal.

The reference potential supplied to the comparator 56 is supplied from a terminal VT1 through the transistor 48. An OS transistor is preferably used as the transistor 48. For example, a high potential signal is supplied to a gate of the transistor 48 from a terminal SH2 to turn the transistor 48 on, so that a favorable potential is supplied to the inverting input terminal of the comparator 56. After that, a low potential signal is supplied to the gate of the transistor 48 from the terminal SH2 to turn the transistor 48 off, so that a floating state is made to hold the supplied potential. As a result, the potential can be programmed into the inverting input terminal of the comparator 56.

An output terminal (referred to as terminal OU4) of the comparator 56 is electrically connected to a gate of the transistor 49. One of a source and a drain (referred to as terminal SG1 in FIG. 8A) of the transistor 49 is electrically connected to the wiring VS1, and the other of the source and the drain of the transistor 49 is electrically connected to the circuit 32, the oscillator 30, and the circuit 31. The transistor 49 has a function of controlling a state where each circuit and the wiring VS1 are electrically connected to each other and a state where they are disconnected. The transistor 49 is, for example, electrically connected to the transistor 42 and the transistor 43 in the oscillator 30 and the transistor 61 in the circuit 31 illustrated in FIG. 1 and the like, the transistor 46*a* in the circuit 32 illustrated in FIG. 3A and the like, and the transistor 46*b* in the circuit 32 illustrated in FIG. 3C and the like.

Figure 8B:
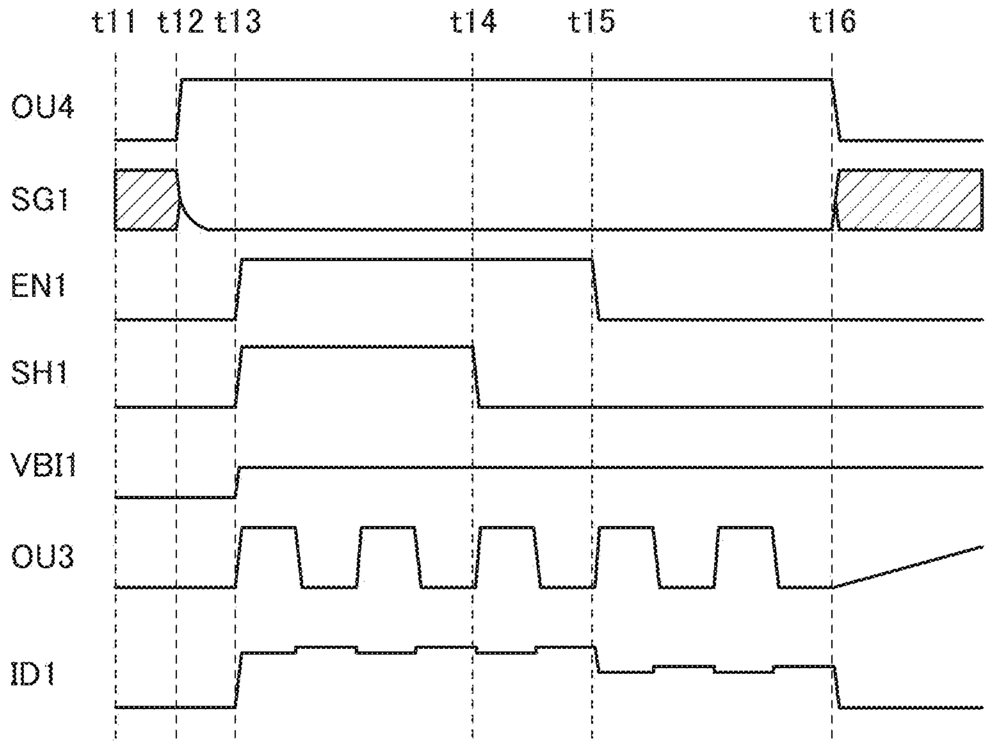
FIG. 8B is a diagram illustrating an operation example of a semiconductor device.

When a reference potential for controlling or protecting the secondary battery 121 is supplied to the circuit 33, the semiconductor device 21 can operate as a circuit for controlling or protecting the secondary battery 121. An example of supplying a potential for detecting overcharge as a reference potential to the circuit 33 is described below using a timing chart shown in FIG. 8B. The total current flowing the circuit 32, the oscillator 30, and the circuit 31 is current ID1.

At a time t11, the potential of the terminal OU4 is a low potential signal. The terminal SG1 is in a floating state.

At a time t12, when the positive electrode potential of the secondary battery 121 exceeds the reference potential, that is, the secondary battery 121 is judged as in an overcharge state, the comparator 56 outputs a high potential signal from the terminal OU4. The high potential signal is supplied from the comparator 56 to the gate of the transistor 49, whereby the transistor 49 is turned on.

When the transistor 49 is in an on state, the wiring VS1, the circuit 32, the oscillator 30, and the circuit 31 are brought into a conducting state. The terminal SG1 is supplied with a potential of the wiring VS1 (the low potential signal in the case of the example shown in FIG. 8B), and each circuit is supplied with the potential from the wiring VS1 through the terminal SG1, whereby the circuit 32, the oscillator 30, the circuit 31, and the wiring VS1 are brought into a conducting state.

At a time t13, the terminal EN1 is supplied with a signal, and the transistor 46*a* or the transistor 47*a* in the circuit 32 is turned on. In addition, the terminal SH1 is supplied with a signal, and the transistor 41 is turned on, which leads to supply of a potential VBI1 from the terminal VBI1 to the oscillator 30. As a result, a signal with a desired frequency is output from the terminal OU3.

At a time t14, the terminal SH1 is supplied with a signal, and then the transistor 41 is turned off. The potential output from the terminal VBI1 is kept at a constant value.

At a time t15, the terminal EN1 is supplied with a signal, and then the gate of the transistor 46*a* or the transistor 47*a* is supplied with a potential for turning the transistor off. The current flowing in the circuit 32 is blocked, and the current ID1 is lowered. At a time t16, a low potential signal is output from the terminal OU4, and the current flowing in the circuit 32, the oscillator 30, and the circuit 31 is blocked. Thus, the terminal SG1 is in a floating state.

The signal from the terminal OU3 is, for example, supplied to a circuit for controlling charging of the secondary battery, so that the charging is stopped or the charging condition is changed. In this manner, the secondary battery can be protected or controlled. When the secondary battery is controlled with use of the semiconductor device of one embodiment of the present invention, a power storage device of one embodiment of the present invention can be formed. The power storage device of one embodiment of the present invention enables improvements of the safety level and the lifetime of the secondary battery with low power consumption. Furthermore, the capacity of the secondary battery can be improved while the safety level is kept high in some cases.

When the transistor 49 is in an off state, the current flowing through the wiring VS1, the circuit 32, the oscillator 30, and the circuit 31 is blocked, so that power consumption in each circuit can be significantly reduced. When an OS transistor is used as the transistor 49, the amount of leakage current of the transistor 49 in an off state can be significantly reduced, so that the amount of power consumption can be reduced to the limit.

In the case of overdischarge detection, for example, a reference potential for determining an overdischarge state is supplied to the non-inverting input terminal, and the positive electrode potential of the secondary battery may be supplied to the inverting input terminal. In this case, when the positive electrode potential of the secondary battery becomes lower than the reference potential, a high potential signal is output from the comparator.

In the semiconductor device of one embodiment of the present invention, for example, a circuit having a function of controlling a battery may be incorporated. When the circuit having a function of controlling a battery is incorporated in the semiconductor device of one embodiment of the present invention and connected to the secondary battery, a power storage device can be formed. As the circuit having a function of controlling a battery, a control circuit 38 is included in FIG. 8. The signal from the terminal OU3 is supplied to the control circuit 38. In addition, the control circuit 38 may generates signals of the terminals SH1, EN1, VT1, SH2, and the like and supply them to the circuits. Alternatively, the control circuit 38 may supply a control signal to a circuit generating the signals.

A circuit having a function of changing a condition of charging or discharging a battery may be incorporated in the control circuit 38, for example. Examples of the condition include current density, upper voltage limit, lower voltage limit, and mode switching. Examples of the mode include a constant-current mode and a constant-voltage mode. The semiconductor device of one embodiment of the present invention has a function of protecting the battery, for example. For example, the semiconductor device has a function of stopping charge or discharge of the battery. For example, the semiconductor device has a function of discharging the battery in response to detection of overcharge. For example, the semiconductor device has a function of detecting an abnormality of the battery and stopping the operation of the battery or changing the condition of the battery. Stopping the operation of the battery means stopping charge or stopping discharge, for example. Examples of an abnormality of the battery include overcharge, overdischarge, overcurrent at charging, overcurrent at discharging, a short circuit, a micro-short circuit that will be described later, and a deviation from a predetermined range of operating temperature.

The control circuit 38 can be formed using a Si transistor, for example. Alternatively, the control circuit 38 may be formed using an OS transistor and a Si transistor. Alternatively, the control circuit 38 may be formed using an OS transistor.

The semiconductor device of one embodiment of the present invention may include a temperature sensor, a pressure sensor, an illuminance sensor, a motion sensor, an optical sensor, a humidity sensor, and the like. The semiconductor device of one embodiment of the present invention has a function of controlling a battery in accordance with detection results of the sensors, for example.

Embodiment 2

In this embodiment, a structure example of an OS transistor which can be used for the semiconductor device described in the above embodiment will be described. Note that an OS transistor is a thin film transistor and can be provided to be stacked; therefore, in this embodiment, a structure example of a semiconductor device in which an OS transistor is provided above a Si transistor formed on a single crystal silicon substrate will be described.

<Structure Example of Semiconductor Device>

Figure 9:
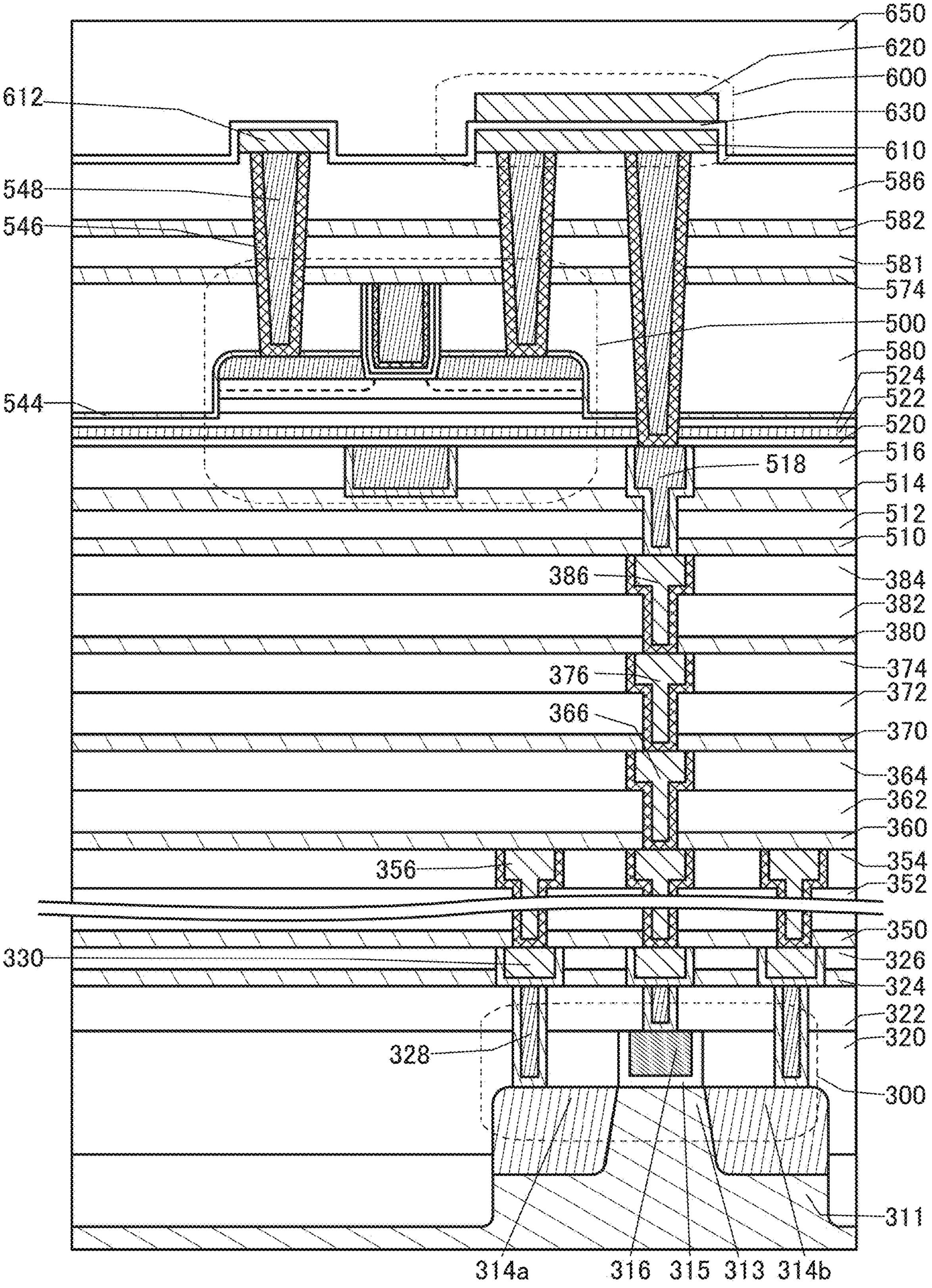
FIG. 9 is a cross-sectional view illustrating a structure example of a semiconductor device.
Figure 10A:
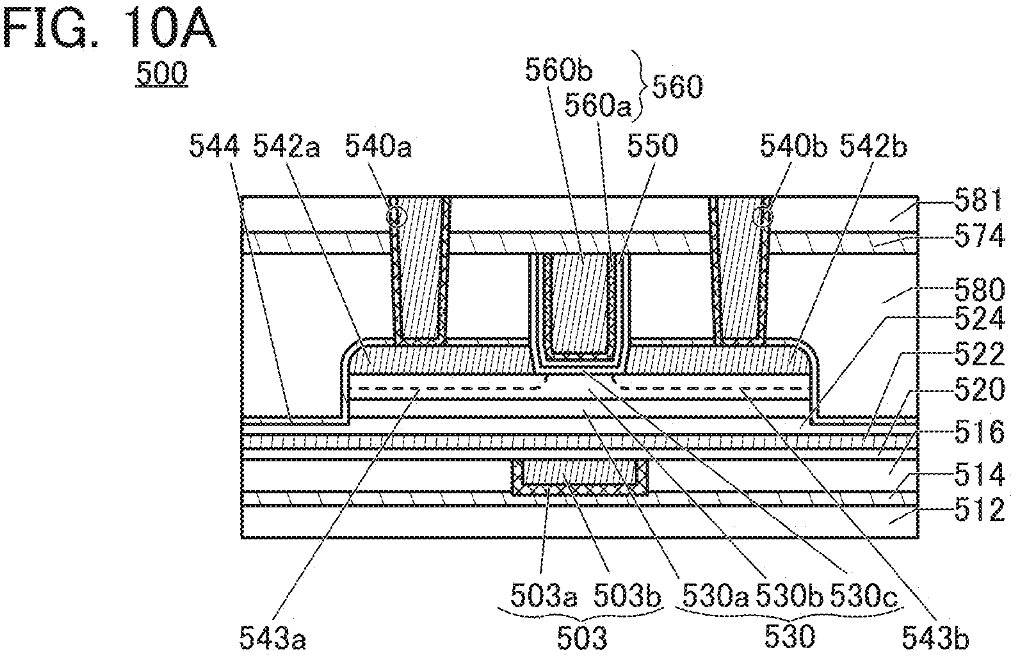
FIG. 10A is a cross-sectional view illustrating a structure example of a transistor.
Figure 10B:
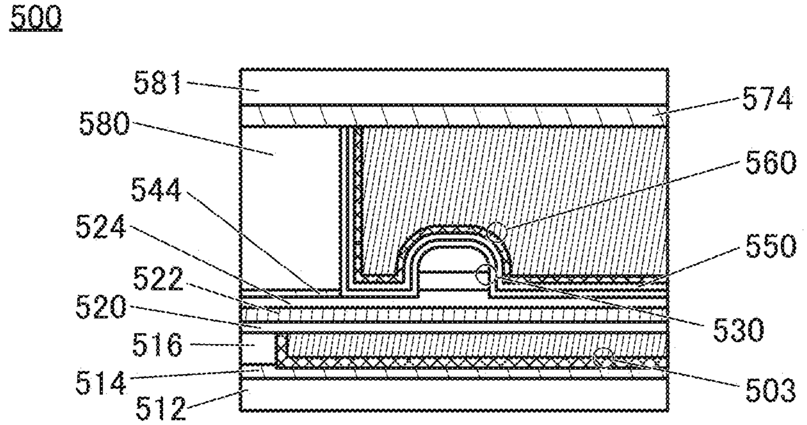
FIG. 10B is a cross-sectional view illustrating a structure example of the transistor.
Figure 10C:
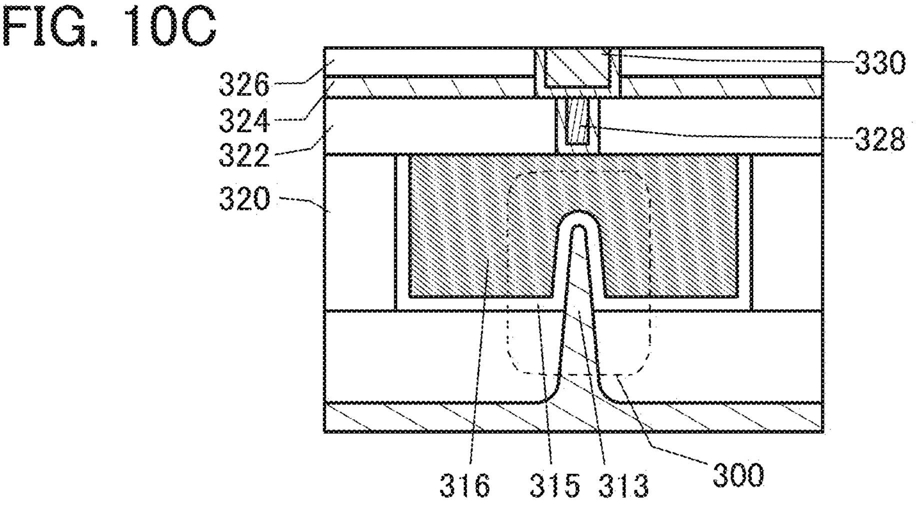
FIG. 10C is a cross-sectional view illustrating a structure example of a transistor.

A semiconductor device illustrated in FIG. 9 includes a transistor 300, a transistor 500, and a capacitor 600. FIG. 10A is a cross-sectional view of the transistor 500 in the channel length direction, FIG. 10B is a cross-sectional view of the transistor 500 in the channel width direction, and FIG. 10C is a cross-sectional view of the transistor 300 in the channel width direction.

The transistor 500 is a transistor in a channel formation region. The transistor 500 has extremely low off-state current.

The semiconductor device described in this embodiment includes the transistor 300, the transistor 500, and the capacitor 600 as illustrated in FIG. 9. The transistor 500 is provided above the transistor 300, and the capacitor 600 is provided above the transistor 300 and the transistor 500.

The transistor 300 is provided on a substrate 311 and includes a conductor 316, an insulator 315, a semiconductor region 313 that is a part of the substrate 311, and a low-resistance region 314*a* and a low-resistance region 314*b* functioning as a source region and a drain region.

As illustrated in FIG. 10C, in the transistor 300, a top surface and a side surface in the channel width direction of the semiconductor region 313 are covered with the conductor 316 with the insulator 315 therebetween. Such a Fin-type transistor 300 can have an increased effective channel width, and thus have improved on-state characteristics. In addition, since contribution of an electric field of a gate electrode can be increased, the off-state characteristics of the transistor 300 can be improved.

Note that the transistor 300 can be either a p-channel transistor or an n-channel transistor.

A region of the semiconductor region 313 where a channel is formed, a region in the vicinity thereof, the low-resistance region 314*a* and the low-resistance region 314*b* each functioning as a source region or a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 300 may be an HEMT (High Electron Mobility Transistor) with GaAs and GaAlAs, or the like.

The low-resistance region 314*a* and the low-resistance region 314*b* contain an element which imparts n-type conductivity, such as arsenic or phosphorus, or an element which imparts p-type conductivity, such as boron, in addition to the semiconductor material used for the semiconductor region 313.

For the conductor 316 functioning as a gate electrode, a semiconductor material such as silicon, which contains the element imparting n-type conductivity, such as arsenic or phosphorus, or the element imparting p-type conductivity, such as boron, or a conductive material such as a metal material, an alloy material, or a metal oxide material can be used.

Note that since the work function of a conductor depends on a material of the conductor, Vth of the transistor can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Note that the transistor 300 illustrated in FIG. 9 is just an example and the structure is not limited thereto; an appropriate transistor can be used in accordance with a circuit structure or a driving method.

An insulator 320, an insulator 322, an insulator 324, and an insulator 326 are stacked in this order to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

The insulator 322 may have a function of a planarization film for planarizing a level difference caused by the transistor 300 or the like provided below the insulator 322. For example, a top surface of the insulator 322 may be planarized by planarization treatment using a chemical mechanical polishing (CMP) method or the like to increase planarity.

The insulator 324 is preferably formed using a film having a barrier property that prevents diffusion of hydrogen or impurities from the substrate 311, the transistor 300, or the like into the region where the transistor 500 is provided.

For the film having a barrier property against hydrogen, silicon nitride formed using a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per area of the insulator 324 is less than or equal to $10\times10^{15}$ atoms/cm$^2$, preferably less than or equal to $5\times10^{15}$ atoms/cm$^2$, in the TDS analysis in a film-surface temperature range of from 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the relative permittivity of the insulator 324. When a material with a low dielectric constant is used for an interlayer film, the parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each have a function of a plug or a wiring. A plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and part of a conductor functions as a plug.

As a material for each of plugs and wirings (the conductor 328, the conductor 330, and the like), a single layer or stacked layers of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to form the plugs and wirings with a low-resistance conductive material such as aluminum or copper. The use of a low-resistance conductive material can reduce wiring resistance.

A wiring layer may be provided over the insulator 326 and the conductor 330. For example, in FIG. 9, an insulator 350, an insulator 352, and an insulator 354 are provided to be stacked in this order. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

Note that for example, as the insulator 350, like the insulator 324, an insulator having a barrier property against hydrogen is preferably used. Furthermore, the conductor 356 preferably contains a conductor having a barrier property against hydrogen. In particular, the conductor having a barrier property against hydrogen is formed in an opening portion of the insulator 350 having a barrier property against hydrogen. With this structure, the transistor 300 and the transistor 500 can be separated by a barrier layer, so that diffusion of hydrogen from the transistor 300 into the transistor 500 can be inhibited.

Note that for the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of a wiring is kept. In that case, a structure is preferable in which a tantalum nitride layer having a barrier property against hydrogen is in contact with the insulator 350 having a barrier property against hydrogen.

A wiring layer may be provided over the insulator 354 and the conductor 356. For example, in FIG. 9, an insulator 360, an insulator 362, and an insulator 364 are provided to be stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

Note that for example, as the insulator 360, like the insulator 324, an insulator having a barrier property against hydrogen is preferably used. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 300 and the transistor 500 can be separated by a barrier layer, so that diffusion of hydrogen from the transistor 300 into the transistor 500 can be inhibited.

A wiring layer may be provided over the insulator 364 and the conductor 366. For example, in FIG. 9, an insulator 370, an insulator 372, and an insulator 374 are provided to be stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

Note that for example, as the insulator 370, like the insulator 324, an insulator having a barrier property against hydrogen is preferably used. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 300 and the transistor 500 can be separated by a barrier layer, so that diffusion of hydrogen from the transistor 300 into the transistor 500 can be inhibited.

A wiring layer may be provided over the insulator 374 and the conductor 376. For example, in FIG. 9, an insulator 380, an insulator 382, and an insulator 384 are provided to be stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

Note that for example, as the insulator 380, like the insulator 324, an insulator having a barrier property against hydrogen is preferably used. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 300 and the transistor 500 can be separated by a barrier layer, so that diffusion of hydrogen from the transistor 300 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked sequentially over the insulator 384. A substance having a barrier property against oxygen or hydrogen is preferably used for any of the insulator 510, the insulator 512, the insulator 514, and the insulator 516.

For example, the insulator 510 and the insulator 514 are preferably formed using a film having a barrier property that prevents diffusion of hydrogen or impurities from the substrate 311, the region where the transistor 300 is provided, or the like into the region where the transistor 500 is provided. Therefore, a material similar to that for the insulator 324 can be used.

For the film having a barrier property against hydrogen, silicon nitride formed using a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen or moisture which are factors of change in electrical characteristics of the transistor. Accordingly, aluminum oxide can prevent mixing of impurities such as hydrogen or moisture into the transistor 500 in the manufacturing process and after the manufacturing of the transistor. In addition, release of oxygen from the oxide included in the transistor 500 can be inhibited. Therefore, aluminum oxide is suitably used for the protective film of the transistor 500.

In addition, for the insulator 512 and the insulator 516, a material similar to that for the insulator 320 can be used, for example. When a material with a relatively dielectric constant is used for the interlayer film, the parasitic capacitance between wirings can be reduced. A silicon oxide film, a silicon oxynitride film, or the like can be used for the insulator 512 and the insulator 516, for example.

A conductor 518, a conductor included in the transistor 500 (a conductor 503), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; thus, the diffusion of hydrogen from the transistor 300 into the transistor 500 can be inhibited.

The transistor 500 is provided above the insulator 516.

FIG. 9 illustrates an example in which a conductor 610 included in the capacitor 600 is connected to one of a source and a drain of the transistor 500 and a gate of the transistor 300 through a conductor provided in the opening portion in the insulator 580 and the like; however, the conductor 610 may be connected to a gate of an OS transistor, which is additionally provided in the same layer as the transistor 500, through a conductor provided in an opening portion of the insulator 580 and the like.

As illustrated in FIG. 10A and FIG. 10B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530*a* positioned over the insulator 524; an oxide 530*b* positioned over the oxide 530*a*; a conductor 542*a* and a conductor 542*b* positioned apart from each other over the oxide 530*b*; an insulator 580 that is positioned over the conductor 542*a* and the conductor 542*b* and is provided with an opening formed to overlap a region between the conductor 542*a* and the conductor 542*b*; a conductor 560 positioned in the opening; an insulator 550 positioned between the conductor 560 and the oxide 530*b*, the conductor 542*a*, the conductor 542*b*, and the insulator 580; and an oxide 530*c* positioned between the insulator 550 and the oxide 530*b*, the conductor 542*a*, the conductor 542*b*, and the insulator 580.

As illustrated in FIG. 10A and FIG. 10B, an insulator 544 is preferably positioned between the insulator 580 and the oxide 530*a*, the oxide 530*b*, the conductor 542*a*, and the conductor 542*b*. In addition, as illustrated in FIG. 10A and FIG. 10B, the conductor 560 preferably includes a conductor 560*a* provided inside the insulator 550 and a conductor 560*b* embedded inside the conductor 560*a*. As illustrated in FIG. 10A and FIG. 10B, an insulator 574 is preferably provided over the insulator 580, the conductor 560, and the insulator 550.

Hereinafter, the oxide 530*a*, the oxide 530*b*, and the oxide 530*c* may be collectively referred to as an oxide 530. The conductor 542*a* and the conductor 542*b* may be collectively referred to as a conductor 542.

Note that the transistor 500 having a structure in which three layers of the oxide 530*a*, the oxide 530*b*, and the oxide 530*c* are stacked in the region where the channel is formed and its vicinity is illustrated; however, the present invention is not limited thereto. For example, a single layer of the oxide 530*b*, a two-layer structure of the oxide 530*b* and the oxide 530*a*, a two-layer structure of the oxide 530*b* and the oxide 530*c*, or a stacked-layer structure of four or more layers may be employed. Furthermore, although the conductor 560 is shown to have a stacked-layer structure of two layers in the transistor 500, the present invention is not limited thereto. For example, the conductor 560 may have a single-layer structure or a stacked-layer structure of three or more layers. Note that the transistor 500 illustrated in FIG.

9, FIG. 10A, and FIG. 10B is an example, and the structure is not limited thereto; an appropriate transistor can be used in accordance with a circuit structure or a driving method.

Here, the conductor 560 functions as a gate electrode of the transistor, and the conductor 542*a* and the conductor 542*b* each function as a source electrode or a drain electrode. As described above, the conductor 560 is formed to be embedded in the opening of the insulator 580 and the region between the conductor 542*a* and the conductor 542*b*. The positions of the conductor 560, the conductor 542*a*, and the conductor 542*b* with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542*a* and the conductor 542*b* in a self-aligned manner, the conductor 560 does not have a region overlapping with the conductor 542*a* or the conductor 542*b*. Thus, parasitic capacitance formed between the conductor 560 and each of the conductor 542*a* and the conductor 542*b* can be reduced. As a result, the switching speed of the transistor 500 can be improved, and the transistor 500 can have high frequency characteristics.

The conductor 560 sometimes functions as a first gate (also referred to as top gate) electrode. In addition, the conductor 503 sometimes functions as a second gate (also referred to as bottom gate) electrode. In that case, Vth of the transistor 500 can be controlled by changing a potential applied to the conductor 503 independently of a potential applied to the conductor 560. In particular, Vth of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered. In this specification and the like, a transistor structure in which a channel formation region is electrically surrounded by electric fields of a first gate electrode and a second gate electrode is referred to as a surrounded channel (S-channel) structure.

Furthermore, in this specification and the like, the S-channel structure has a feature that the side surface and the vicinity of the oxide 530 in contact with the conductor 542*a* and the conductor 542*b* functioning as the source electrode and the drain electrode are of i-type like the channel formation region. The side surface and the vicinity of the oxide 530 in contact with the conductor 542*a* and the conductor 542*b* are in contact with the insulator 544 and thus can be of i-type like the channel formation region. Note that in this specification and the like, "i-type" can be equated with "highly purified intrinsic" to be described later. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

In addition, the conductor 503 has a structure similar to that of the conductor 518; a conductor 503*a* is formed in contact with an inner wall of an opening in the insulator 514 and the insulator 516, and a conductor 503*b* is formed on the inner side.

The insulator 520, the insulator 522, the insulator 524, and the insulator 550 each have a function of a gate insulating film.

Here, as the insulator 524 that is in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0\times10^{18}$ atoms/$cm^3$, preferably greater than or equal to $1.0\times10^{19}$ atoms/$cm^3$, further preferably greater than or equal to $2.0\times10^{19}$ atoms/$cm^3$ or greater than or equal to $3.0\times10^{20}$ atoms/$cm^3$ in TDS (Thermal Desorption Spectroscopy) analysis. Note that the temperature of the film surface in the TDS analysis is preferably within the range of 100° C. to 700° C., or 100° C. to 400° C.

In addition, in the case where the insulator 524 includes an excess-oxygen region, it is preferable that the insulator 522 have a function of inhibiting diffusion of oxygen (e.g., an oxygen atom, an oxygen molecule, or the like) (through which oxygen is unlikely to pass).

When the insulator 522 has a function of inhibiting diffusion of oxygen or impurities, oxygen contained in the oxide 530 is not diffused into the insulator 520 side, which is preferable. Furthermore, the conductor 503 can be inhibited from reacting with oxygen contained in the insulator 524 or the oxide 530.

For example, the insulator 522 is preferably formed using a single layer or stacked layers of an insulator containing what is called a high-k material such as aluminum oxide, hafnium oxide, tantalum oxide, zirconium oxide, lead zirconate titanate (PZT), strontium titanate ($SrTiO_3$), (Ba,Sr)$TiO_3$ (BST), or the like. As miniaturization and high integration of transistors progress, a problem such as leakage current might arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which the above oxygen is less likely to pass). For the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

In addition, it is preferable that the insulator 520 be thermally stable. For example, silicon oxide and silicon oxynitride are suitable because they are thermally stable. Furthermore, when an insulator that is a high-k material is combined with silicon oxide or silicon oxynitride, the insulator 520 having a stacked-layer structure that has thermal stability and a high dielectric constant can be obtained.

Note that the insulator 520, the insulator 522, and the insulator 524 may each have a stacked-layer structure of two or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including the channel formation region. For example, as the oxide 530, a metal oxide such as an In—M—Zn oxide (the element M is one or more of aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. Furthermore, as the oxide 530, an In—Ga oxide or an In—Zn oxide may be used.

Furthermore, a metal oxide with a low carrier concentration is preferably used in the transistor 500. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities in a metal oxide include hydrogen, nitrogen, alkali metal, alkaline earth metal, iron, nickel, and silicon.

In particular, hydrogen contained in a metal oxide reacts with oxygen bonded to a metal atom to be water, and thus forms oxygen vacancies in the metal oxide in some cases. If the channel formation region in the metal oxide includes oxygen vacancies, the transistor sometimes has normally-on characteristics. In some cases, a defect that is an oxygen vacancy which hydrogen enters functions as a donor and generates an electron serving as a carrier. In other cases, bonding of part of hydrogen to oxygen bonded to a metal atom generates electrons serving as carriers. Thus, a transistor using a metal oxide containing a large amount of hydrogen is likely to have normally-on characteristics.

A defect that is an oxygen vacancy which hydrogen has entered can function as a donor of a metal oxide. However, it is difficult to evaluate the defects quantitatively. Thus, the metal oxide is sometimes evaluated by not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Consequently, when a metal oxide is used for the oxide 530, hydrogen in the metal oxide is preferably reduced as much as possible. Specifically, the hydrogen concentration of the metal oxide, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide with a sufficiently low concentration of impurities such as hydrogen is used for a channel formation region of a transistor, the transistor can have stable electrical characteristics.

When a metal oxide is used for the oxide 530, the carrier density of the metal oxide in the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, still further preferably lower than $1\times10^{13}$ cm$^{-3}$, still further preferably lower than $1\times10^{12}$ cm$^{-3}$. Note that the lower limit of the carrier concentration of the metal oxide in the channel formation region is not particularly limited and can be, for example, $1\times10^{-9}$ cm$^{-3}$.

When a metal oxide is used for the oxide 530, contact between the conductor 542 (the conductor 542*a* and the conductor 542*b*) and the oxide 530 may make oxygen in the oxide 530 diffuse into the conductor 542, resulting in oxidation of the conductor 542. It is highly possible that oxidation of the conductor 542 lowers the conductivity of the conductor 542. Note that diffusion of oxygen in the oxide 530 into the conductor 542 can be interpreted as absorption of oxygen in the oxide 530 by the conductor 542.

When oxygen in the oxide 530 is diffused into the conductor 542 (the conductor 542*a* and the conductor 542*b*), a layer is sometimes formed between the conductor 542*a* and the oxide 530*b*, and between the conductor 542*b* and the oxide 530*b*. The layer contains more oxygen than the conductor 542 does, and thus presumably has an insulating property. In this case, a three-layer structure of the conductor 542, the layer, and the oxide 530*b* can be regarded as a three-layer structure of a metal, an insulator, and a semiconductor and is sometimes referred to as a MIS (Metal-Insulator-Semiconductor) structure or a diode junction structure having a MIS structure as its main part.

The above layer is not necessarily formed between the conductor 542 and the oxide 530*b*, but the layer may be formed between the conductor 542 and the oxide 530*c*, or formed between the conductor 542 and the oxide 530*b* and between the conductor 542 and the oxide 530*c*.

The metal oxide functioning as the channel formation region in the oxide 530 has a band gap that is preferably 2 eV or higher, further preferably 2.5 eV or higher. With use of a metal oxide having such a wide band gap, the off-state current of the transistor can be reduced.

When the oxide 530 includes the oxide 530*a* under the oxide 530*b*, it is possible to inhibit diffusion of impurities into the oxide 530*b* from the components formed below the oxide 530*a*. Moreover, including the oxide 530*c* over the oxide 530*b* makes it possible to inhibit diffusion of impurities into the oxide 530*b* from the components formed above the oxide 530*c*.

Note that the oxide 530 preferably has a stacked-layer structure of a plurality of oxide layers that differ in the atomic ratio of metal atoms. Specifically, the atomic ratio of the element M to the constituent elements in the metal oxide used as the oxide 530*a* is preferably higher than the atomic ratio of the element M to the constituent elements in the metal oxide used as the oxide 530*b*. In addition, the atomic ratio of the element M to In in the metal oxide used as the oxide 530*a* is preferably higher than the atomic ratio of the element M to In in the metal oxide used as the oxide 530*b*. Furthermore, the atomic ratio of In to the element M in the metal oxide used as the oxide 530*b* is preferably higher than the atomic ratio of In to the element M in the metal oxide used as the oxide 530*a*. A metal oxide that can be used as the oxide 530*a* or the oxide 530*b* can be used as the oxide 530*c*.

The energy of the conduction band minimum of each of the oxide 530*a* and the oxide 530*c* is preferably higher than the energy of the conduction band minimum of the oxide 530*b*. In other words, the electron affinity of each of the oxide 530*a* and the oxide 530*c* is preferably smaller than the electron affinity of the oxide 530*b*.

The energy level of the conduction band minimum gradually changes at junction portions of the oxide 530*a*, the oxide 530*b*, and the oxide 530*c*. In other words, the energy level of the conduction band minimum at the junction portions of the oxide 530*a*, the oxide 530*b*, and the oxide 530*c* continuously changes or is continuously connected. To obtain this, the density of defect states in mixed layers formed at the interface between the oxide 530*a* and the oxide 530*b* and at the interface between the oxide 530*b* and the oxide 530*c* is preferably made low.

Specifically, when the oxide 530*a* and the oxide 530*b* or the oxide 530*b* and the oxide 530*c* contain a common element (as a main component) in addition to oxygen, a mixed layer with a low density of defect states can be formed. For example, in the case where the oxide 530*b* is an In—Ga—Zn oxide, an In—Ga—Zn oxide, a Ga—Zn oxide, gallium oxide, or the like is preferably used as the oxide 530*a* and the oxide 530*c*.

At this time, the oxide 530*b* serves as a main carrier path. When the oxide 530*a* and the oxide 530*c* have the above structure, the density of defect states at the interface between the oxide 530*a* and the oxide 530*b* and the interface between the oxide 530*b* and the oxide 530*c* can be made low. Thus, the influence of interface scattering on carrier conduction is small, and the transistor 500 can have a high on-state current.

The conductor 542 (the conductor 542*a* and the conductor 542*b*) functioning as the source electrode and the drain electrode is provided over the oxide 530*b*. For the conductor 542, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

As illustrated in FIG. 10A, a region 543 (a region 543*a* and a region 543*b*) is sometimes formed as a low-resistance region at and near the interface between the oxide 530 and the conductor 542. In that case, the region 543*a* functions as one of a source region and a drain region, and the region 543*b* functions as the other of the source region and the drain region. Furthermore, the channel formation region is formed in a region between the region 543*a* and the region 543*b*.

When the conductor 542 is provided in contact with the oxide 530, the oxygen concentration in the region 543 sometimes decreases. In addition, a metal compound layer that contains the metal contained in the conductor 542 and the component of the oxide 530 is sometimes formed in the region 543. In such a case, the carrier concentration of the region 543 increases, and the region 543 becomes a low-resistance region.

The insulator 544 is provided to cover the conductor 542 and inhibits oxidation of the conductor 542. At this time, the insulator 544 may be provided to cover a side surface of the oxide 530 and to be in contact with the insulator 524.

A metal oxide containing one or more kinds selected from hafnium, aluminum, gallium, yttrium, zirconium, tungsten, titanium, tantalum, nickel, germanium, magnesium, and the like can be used as the insulator 544.

It is particularly preferable to use, as the insulator 544, an insulator containing an oxide of one or both of aluminum and hafnium, for example, aluminum oxide, hafnium oxide, or hafnium aluminate. In particular, hafnium aluminate has higher heat resistance than a hafnium oxide film. Therefore, hafnium aluminate is preferable because it is unlikely to be crystallized by heat treatment in a later step. Note that the insulator 544 is not an essential component when the conductor 542 is an oxidation-resistant material or does not significantly lose its conductivity even after absorbing oxygen. Design is appropriately set in consideration of required transistor characteristics.

The insulator 550 functions as a gate insulating film. The insulator 550 is preferably positioned in contact with the inner side (the top surface and the side surface) of the oxide 530*c*. The insulator 550 is preferably formed using an insulator from which oxygen is released by heating. For example, the insulator 550 is an oxide film in which the amount of released oxygen converted into oxygen atoms is greater than or equal to $1.0\times10^{18}$ atoms/$cm^3$, preferably greater than or equal to $1.0\times10^{19}$ atoms/$cm^3$, further preferably greater than or equal to $2.0\times10^{19}$ atoms/$cm^3$ or greater than or equal to $3.0\times10^{20}$ atoms/$cm^3$ in TDS analysis. Note that the temperature of the film surface in the TDS analysis is preferably within the range of 100° C. to 700° C.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator from which oxygen is released by heating is provided as the insulator 550 in contact with the top surface of the oxide 530*c*, oxygen can be effectively supplied from the insulator 550 to the channel formation region of the oxide 530*b* through the oxide 530*c*. Furthermore, as in the insulator 524, the concentration of impurities such as water or hydrogen in the insulator 550 is preferably reduced. The thickness of the insulator 550 is preferably greater than or equal to 1 nm and less than or equal to 20 nm.

Furthermore, to efficiently supply excess oxygen contained in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Although the conductor 560 functioning as the first gate electrode has a two-layer structure in FIG. 10A and FIG. 10B, the conductor 560 may have a single-layer structure or a stacked-layer structure of three or more layers.

For the conductor 560*a*, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560*a* has a function of inhibiting diffusion of oxygen, it is possible to inhibit a reduction in conductivity of the conductor 560*b* due to oxidation caused by oxygen contained in the insulator 550. As a conductive material having a function of inhibiting diffusion of oxygen, for example, tantalum, tantalum nitride, ruthenium, ruthenium oxide, or the like is preferably used.

In addition, a conductive material containing tungsten, copper, or aluminum as its main component is preferably used for the conductor 560*b*. Furthermore, the conductor 560*b* also functions as a wiring and thus a conductor having high conductivity is preferably used as the conductor 560*b*. For example, a conductive material containing tungsten, copper, or aluminum as its main component can be used. Moreover, the conductor 560*b* may have a stacked-layer structure, for example, a stacked-layer structure of the above conductive material and titanium or titanium nitride.

The insulator 580 is provided over the conductor 542 with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. In particular, silicon oxide and porous silicon oxide are preferable because an excess-oxygen region can be easily formed in a later step.

The insulator 580 preferably includes an excess-oxygen region. When the insulator 580 from which oxygen is released by heating is provided in contact with the oxide 530*c*, oxygen in the insulator 580 can be efficiently supplied to the oxide 530 through the oxide 530*c*. Note that the concentration of impurities such as water or hydrogen in the insulator 580 is preferably reduced.

The opening of the insulator 580 is formed to overlap with the region between the conductor 542*a* and the conductor 542*b*. Accordingly, the conductor 560 is formed to be embedded in the opening of the insulator 580 and the region between the conductor 542*a* and the conductor 542*b*.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with the top surface of the insulator 580, the top surface of the conductor 560, and the top surface of the insulator 550. When the insulator 574 is deposited by a sputtering method, an excess-oxygen region can be provided in the insulator 550 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water or hydrogen in the insulator 581 is preferably reduced.

A conductor 540*a* and a conductor 540*b* are positioned in openings formed in the insulator 581, the insulator 574, the insulator 580, and the insulator 544. The conductor 540*a* and the conductor 540*b* are provided to face each other with the conductor 560 therebetween. The structures of the conductor 540*a* and the conductor 540*b* are similar to those of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen or moisture which are factors of change in electrical characteristics of the transistor. Accordingly, aluminum oxide can prevent mixing of impurities such as hydrogen or moisture into the transistor 500 in the manufacturing process and after the manufacturing of the transistor. In addition, release of oxygen from the oxide included in the transistor 500 can be inhibited. Therefore, aluminum oxide is suitably used for the protective film of the transistor 500.

In addition, an insulator 586 is provided over the insulator 582. For the insulator 586, a material similar to that for the insulator 320 can be used. When a material with a relatively low permittivity is used for the interlayer film, the parasitic capacitance between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 300. The conductor 546 and the conductor 548 can be provided using materials similar to those for the conductor 328 and the conductor 330.

Next, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

Although an example in which the insulator 630 is used as a dielectric of a capacitor is shown in FIG. 9 and the like, another insulator may be used as a dielectric of the capacitor. As an electrode of the capacitor, another conductor or the like may be used.

For example, the insulator 315 functioning as a gate insulator of the transistor 300 may be used. In the case where the insulator 315 is used as a dielectric of a capacitor, the conductor 316 may be used as one electrode of the capacitor, and the low-resistance region 314*a* or the like may be used as the other electrode.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 are each shown to have a single-layer structure in FIG. 9, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In addition, in the case where the conductor is formed concurrently with another component such as a conductor, Cu (copper), Al (aluminum), or the like, which is a low-resistance metal material, may be used.

An insulator 650 is provided over the conductor 620 and the insulator 630. The insulator 650 can be provided using a material similar to that for the insulator 320. The insulator 650 may function as a planarization film that covers an uneven shape thereunder.

With use of this structure, a change in electrical characteristics can be inhibited and reliability can be improved in a semiconductor device using a transistor including an oxide semiconductor. Alternatively, a transistor including an oxide semiconductor and having a high on-state current can be provided. Alternatively, a transistor including an oxide semiconductor and having a low off-state current can be provided. A semiconductor device with low power consumption can be provided. Alternatively, a semiconductor device using a transistor including an oxide semiconductor can be miniaturized or highly integrated.

<Structure Example of Transistor>

Note that the structure of the transistor 500 in the semiconductor device described in this embodiment is not limited to the above. Examples of structures that can be used for the transistor 500 will be described below.

<Structure Example 1 of Transistor>

Figure 11A:
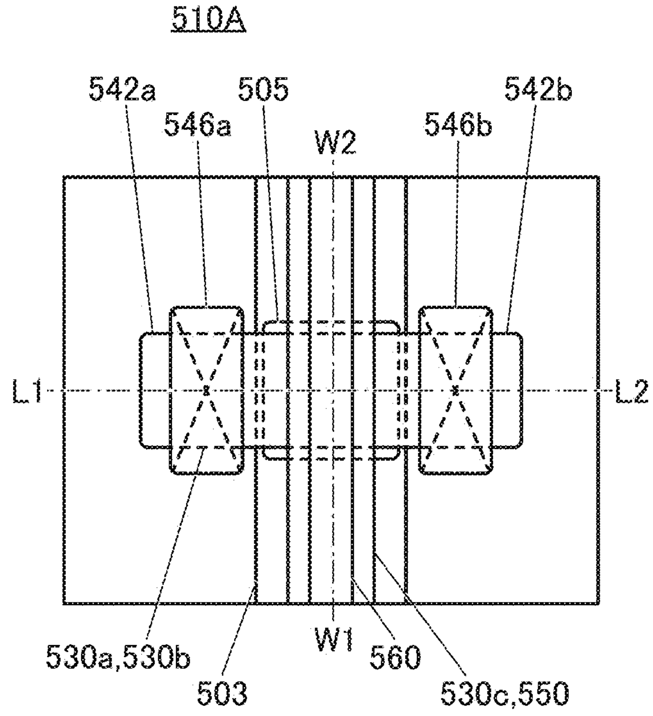
FIG. 11A is a top view illustrating a structure example of a transistor.
Figure 11C:
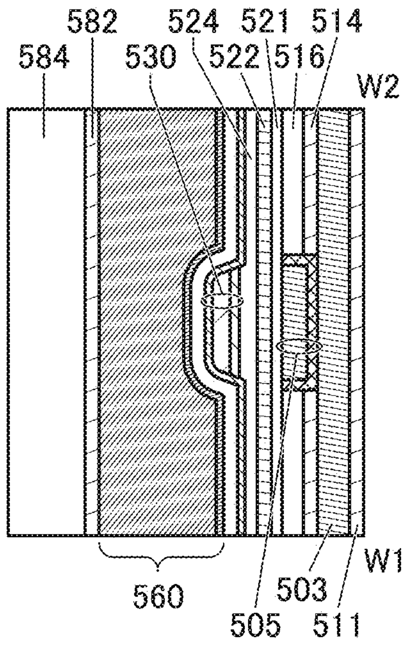
FIG. 11C is a cross-sectional view illustrating the structure example of the transistor.
Figure 11B:
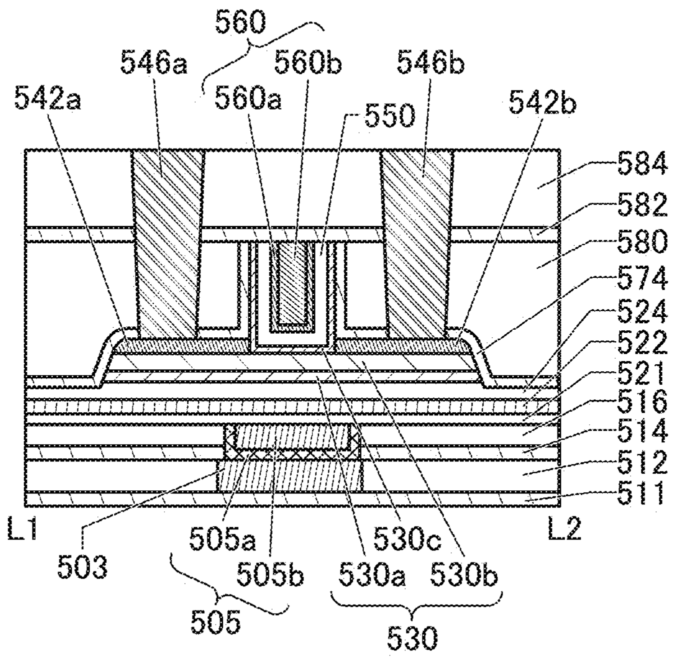
FIG. 11B is a cross-sectional view illustrating the structure example of the transistor.

A structure example of a transistor 510A is described with reference to FIG. 11A, FIG. 11B, and FIG. 11C. FIG. 11A is a top view of the transistor 510A. FIG. 11B is a cross-sectional view of a portion along the dashed-dotted line L1-L2 in FIG. 11A. FIG. 11C is a cross-sectional view of a portion along the dashed-dotted line W1-W2 in FIG. 11A. Note that for clarity of the drawing, some components are not illustrated in the top view of FIG. 11A.

FIG. 11A, FIG. 11B, and FIG. 11C illustrate the transistor 510A and the insulator 511, the insulator 512, the insulator 514, the insulator 516, the insulator 580, the insulator 582, and an insulator 584 that function as interlayer films. In addition, the conductor 546 (a conductor 546*a* and a conductor 546*b*) that is electrically connected to the transistor 510A and functions as a contact plug, and the conductor 503 functioning as a wiring are illustrated.

The transistor 510A includes the conductor 560 (the conductor 560*a* and the conductor 560*b*) functioning as a first gate electrode; a conductor 505 (a conductor 505*a* and a conductor 505*b*) functioning as a second gate electrode; the insulator 550 functioning as a first gate insulating film; an insulator 521, the insulator 522, and the insulator 524 that function as a second gate insulating film; the oxide 530 (the oxide 530*a*, the oxide 530*b*, and the oxide 530*c*) including a region where a channel is formed; the conductor 542*a* functioning as one of a source and a drain;

the conductor 542*b* functioning as the other of the source and the drain; and the insulator 574. In the transistor 510A illustrated in FIG. 11, the oxide 530*c*, the insulator 550, and the conductor 560 are positioned in an opening portion provided in the insulator 580 with the insulator 574 positioned therebetween. Moreover, the oxide 530*c*, the insulator 550, and the conductor 560 are positioned between the conductor 542*a* and the conductor 542*b*.

The insulator 511 and the insulator 512 each function as an interlayer film.

As the interlayer film, a single layer or stacked layers of an insulator such as silicon oxide, silicon oxynitride, silicon nitride oxide, aluminum oxide, hafnium oxide, tantalum oxide, zirconium oxide, PZT, $SrTiO_3$, or $(Ba,Sr)TiO_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

For example, the insulator 511 preferably functions as a barrier film that inhibits entry of impurities such as water or hydrogen into the transistor 510A from the substrate side. Accordingly, for the insulator 511, it is preferable to use an insulating material that has a function of inhibiting diffusion of impurities such as a hydrogen atom, a hydrogen molecule, a water molecule, and a copper atom (through which the above impurities are less likely to pass). Alternatively, it is preferable to use an insulating material that has a function of inhibiting diffusion of oxygen (e.g., at least one of an oxygen atom, an oxygen molecule, and the like) (through which the above oxygen is less likely to pass). Moreover, aluminum oxide or silicon nitride, for example, may be used for the insulator 511. This structure can inhibit diffusion of impurities such as hydrogen and water to the transistor 510A side from the substrate side through the insulator 511.

For example, the permittivity of the insulator 512 is preferably lower than that of the insulator 511. When a material with a low permittivity is used for an interlayer film, parasitic capacitance generated between wirings can be reduced.

The conductor 503 is formed to be embedded in the insulator 512. Here, the top surface of the conductor 503 and the top surface of the insulator 512 can be substantially level with each other. Note that although a structure in which the conductor 503 is a single layer is illustrated, the present invention is not limited thereto. For example, the conductor 503 may have a multilayer structure of two or more layers. Note that for the conductor 503, a conductive material that has high conductivity and contains tungsten, copper, or aluminum as its main component is preferably used.

In the transistor 510A, the conductor 560 sometimes functions as a first gate (also referred to as top gate) electrode. The conductor 505 sometimes functions as a second gate (also referred to as bottom gate) electrode. In that case, the threshold voltage of the transistor 510A can be controlled by changing a potential applied to the conductor 505 independently of a potential applied to the conductor 560. In particular, when a negative potential is applied to the conductor 505, the threshold voltage of the transistor 510A can be higher than 0 V, and the off-state current can be reduced. Thus, a drain current at the time when a potential applied to the conductor 560 is 0 V can be lower in the case where a negative potential is applied to the conductor 505 than in the case where a negative potential is not applied to the conductor 505.

For example, when the conductor 505 and the conductor 560 are provided to overlap each other, in the case where a potential is applied to the conductor 560 and the conductor 505, an electric field generated from the conductor 560 and an electric field generated from the conductor 505 are connected, so that the channel formation region formed in the oxide 530 can be covered.

That is, the channel formation region can be electrically surrounded by the electric field of the conductor 560 having a function of the first gate electrode and the electric field of the conductor 505 having a function of the second gate electrode. In other words, as in the above-described transistor 500, the S-channel structure is formed.

Like the insulator 511 or the insulator 512, the insulator 514 and the insulator 516 each function as an interlayer film. For example, the insulator 514 preferably functions as a barrier film that inhibits entry of impurities such as water or hydrogen into the transistor 510A from the substrate side. This structure can inhibit diffusion of impurities such as hydrogen and water to the transistor 510A side from the substrate side through the insulator 514. Moreover, for example, the insulator 516 preferably has a lower permittivity than the insulator 514. When a material with a low permittivity is used for an interlayer film, parasitic capacitance generated between wirings can be reduced.

In the conductor 505 functioning as the second gate, the conductor 505*a* is formed in contact with an inner wall of an opening in the insulator 514 and the insulator 516, and the conductor 505*b* is formed further inside. Here, the top surfaces of the conductor 505*a* and the conductor 505*b* and the top surface of the insulator 516 can be substantially level with each other. Although the transistor 510A having a structure in which the conductor 505*a* and the conductor 505*b* are stacked is illustrated, the present invention is not limited thereto. For example, the conductor 505 may have a single-layer structure or a stacked-layer structure of three or more layers.

Here, for the conductor 505*a*, it is preferable to use a conductive material that has a function of inhibiting diffusion of impurities such as a hydrogen atom, a hydrogen molecule, a water molecule, and a copper atom (through which the above impurities are less likely to pass). Alternatively, it is preferable to use a conductive material that has a function of inhibiting diffusion of oxygen (e.g., at least one of an oxygen atom, an oxygen molecule, and the like) (through which the above oxygen is less likely to pass). Note that in this specification and the like, a function of inhibiting diffusion of impurities or oxygen means a function of inhibiting diffusion of any one or all of the above impurities and the above oxygen.

For example, when the conductor 505*a* has a function of inhibiting diffusion of oxygen, a reduction in conductivity of the conductor 505*b* due to oxidation can be inhibited.

In the case where the conductor 505 doubles as a wiring, the conductor 505*b* is preferably formed using a conductive material that has high conductivity and contains tungsten, copper, or aluminum as its main component. In that case, the conductor 503 is not necessarily provided. Note that the conductor 505*b* is illustrated as a single layer but may have a stacked-layer structure, for example, a stacked-layer structure of any of the above conductive materials and titanium or titanium nitride.

The insulator 521, the insulator 522, and the insulator 524 each have a function of a second gate insulating film.

The insulator 522 preferably has a barrier property. The insulator 522 having a barrier property functions as a layer that inhibits entry of impurities such as hydrogen into the transistor 510A from the surroundings of the transistor 510A.

For the insulator 522, a single layer or stacked layers of an insulator containing what is called a high-k material such as aluminum oxide, hafnium oxide, hafnium aluminate, tantalum oxide, zirconium oxide, PZT, $SrTiO_3$, or (Ba,Sr)$TiO_3$ (BST) is preferably used, for example. As miniaturization and high integration of transistors progress, a problem such as leakage current might arise because of a thinner gate insulating film. When a high-k material is used for an insulator functioning as the gate insulating film, a gate potential during transistor operation can be reduced while the physical thickness is maintained.

It is preferable that the insulator 521 be thermally stable. For example, silicon oxide and silicon oxynitride are suitable because they are thermally stable. In addition, a combination of an insulator of a high-k material and silicon oxide or silicon oxynitride allows the insulator 521 to have a stacked-layer structure with thermal stability and a high dielectric constant.

Note that the second gate insulating film is shown to have a stacked-layer structure of three layers in FIG. 11, but may have a single-layer structure or a stacked-layer structure of two or more layers. In such cases, without limitation to a stacked-layer structure formed of the same material, a stacked-layer structure formed of different materials may be employed.

The oxide 530 including a region functioning as the channel formation region includes the oxide 530*a*, the oxide 530*b* over the oxide 530*a*, and the oxide 530*c* over the oxide 530*b*. Including the oxide 530*a* under the oxide 530*b* makes it possible to inhibit diffusion of impurities into the oxide 530*b* from the components formed below the oxide 530*a*.

Moreover, including the oxide 530*c* over the oxide 530*b* makes it possible to inhibit diffusion of impurities into the oxide 530*b* from the components formed above the oxide 530*c*. As the oxide 530, the above-described oxide semiconductor, which is one type of metal oxide, can be used.

Note that the oxide 530*c* is preferably provided in the opening portion provided in the insulator 580 with the insulator 574 therebetween. When the insulator 574 has a barrier property, diffusion of impurities from the insulator 580 into the oxide 530 can be inhibited.

One of the conductors 542 functions as a source electrode and the other functions as a drain electrode.

For the conductor 542*a* and the conductor 542*b*, a metal such as aluminum, titanium, chromium, nickel, copper, yttrium, zirconium, molybdenum, silver, tantalum, or tungsten or an alloy containing any of the metals as its main component can be used. In particular, a metal nitride film of tantalum nitride or the like is preferable because it has a barrier property against hydrogen or oxygen and high oxidation resistance.

Although a single-layer structure is shown in FIG. 11, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed thereover; and a three-layer structure where a molybdenum film or a molybdenum nitride film is formed, an aluminum film or a copper film is stacked over the molybdenum film or the molybdenum nitride film, and a molybdenum film or a molybdenum nitride film is formed thereover. Note that a transparent conductive material containing indium oxide, tin oxide, or zinc oxide may be used.

A barrier layer may be provided over the conductor 542. The barrier layer is preferably formed using a substance having a barrier property against oxygen or hydrogen. This structure can inhibit oxidation of the conductor 542 at the time of depositing the insulator 574.

A metal oxide can be used for the barrier layer, for example. In particular, an insulating film of aluminum oxide, hafnium oxide, gallium oxide, or the like, which has a barrier property against oxygen and hydrogen, is preferably used. Alternatively, silicon nitride deposited by a CVD method may be used.

With the barrier layer, the range of choices for the material of the conductor 542 can be expanded. For example, a material having a low oxidation resistance and high conductivity, such as tungsten or aluminum, can be used for the conductor 542. Moreover, for example, a conductor that can be easily deposited or processed can be used.

The insulator 550 functions as a first gate insulating film. The insulator 550 is preferably provided in the opening portion provided in the insulator 580 with the oxide 530*c* and the insulator 574 therebetween.

As miniaturization and high integration of transistors progress, a problem such as leakage current might arise because of a thinner gate insulating film. In that case, the insulator 550 may have a stacked-layer structure like the second gate insulating film. When the insulator functioning as the gate insulating film has a stacked-layer structure of a high-k material and a thermally stable material, a gate potential at the time when the transistor operates can be reduced while the physical thickness is maintained. Furthermore, the stacked-layer structure can be thermally stable and have a high dielectric constant.

The conductor 560 functioning as a first gate electrode includes the conductor 560*a* and the conductor 560*b* over the conductor 560*a*. Like the conductor 505*a*, the conductor 560*a* is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 560*a* has a function of inhibiting oxygen diffusion, the range of choices for the material of the conductor 560*b* can be extended. That is, the conductor 560*a* inhibits oxidation of the conductor 560*b*, thereby preventing the decrease in conductivity.

As a conductive material having a function of inhibiting diffusion of oxygen, tantalum, tantalum nitride, ruthenium, or ruthenium oxide is preferably used, for example. For the conductor 560*a*, the oxide semiconductor that can be used as the oxide 530 can be used. In that case, when the conductor 560*b* is deposited by a sputtering method, the conductor 560*a* can have a reduced electric resistance to be a conductor. Such a conductor can be referred to as an OC (Oxide Conductor) electrode.

The conductor 560*b* is preferably formed using a conductive material containing tungsten, copper, or aluminum as its main component. The conductor 560 functions as a wiring and thus is preferably formed using a conductor having high conductivity. For example, a conductive material containing tungsten, copper, or aluminum as its main component can be used. The conductor 560*b* may have a stacked-layer structure, for example, a stack of any of the above conductive materials and titanium or titanium nitride.

The insulator 574 is positioned between the insulator 580 and the transistor 510A. For the insulator 574, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like. The insulator 574 can inhibit diffusion of impurities such as water and hydrogen contained in the insulator 580 into the oxide 530*b* through the oxide 530*c* and the insulator 550. Furthermore, oxidation of the conductor 560 due to excess oxygen contained in the insulator 580 can be inhibited.

The insulator 580, the insulator 582, and the insulator 584 each function as an interlayer film.

Like the insulator 514, the insulator 582 preferably functions as a barrier insulating film that inhibits entry of impurities such as water or hydrogen into the transistor 510A from the outside.

Like the insulator 516, the insulator 580 and the insulator 584 preferably have a lower permittivity than the insulator 582. When a material with a low permittivity is used for an interlayer film, parasitic capacitance generated between wirings can be reduced.

The transistor 510A may be electrically connected to another component through a plug or a wiring such as the conductor 546 embedded in the insulator 580, the insulator 582, and the insulator 584.

As a material for the conductor 546, a single layer or stacked layers of a conductive material such as a metal material, an alloy material, a metal nitride material, or a metal oxide material can be used, as in the case of the conductor 505. For example, it is preferable to use a high-melting-point material that has both heat resistance and conductivity, such as tungsten or molybdenum. Alternatively, it is preferable to use a low-resistance conductive material such as aluminum or copper. The use of a low-resistance conductive material can reduce wiring resistance.

For example, when the conductor 546 has a stacked-layer structure of tantalum nitride or the like, which is a conductor having a barrier property against hydrogen and oxygen, and tungsten, which has high conductivity, diffusion of impurities from the outside can be inhibited while the conductivity of the wiring is maintained.

With the above structure, a semiconductor device using a transistor that includes an oxide semiconductor and has a high on-state current can be provided. Alternatively, a semiconductor device that uses a transistor including an oxide semiconductor and having a low off-state current can be provided. Alternatively, a semiconductor device that has small variations in electrical characteristics, stable electrical characteristics, and high reliability can be provided.

<Structure Example 2 of Transistor>

Figure 12A:
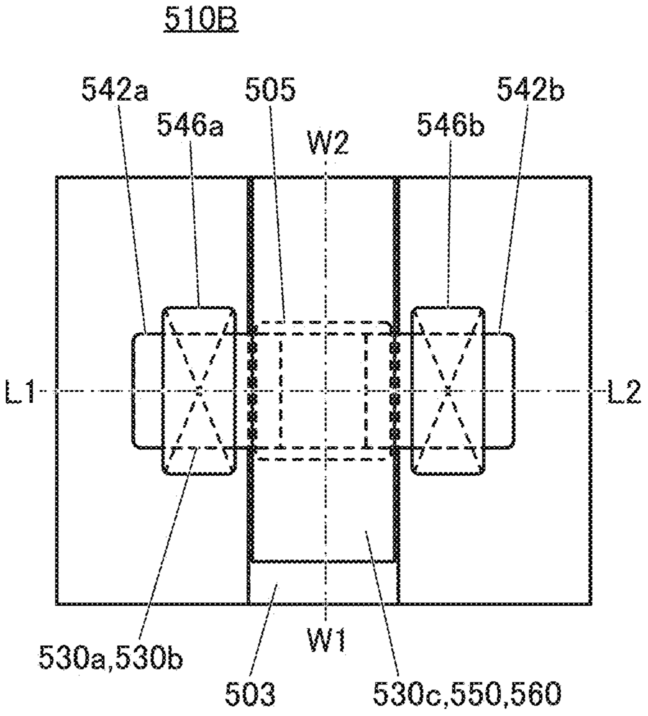
FIG. 12A is a top view illustrating a structure example of a transistor.
Figure 12C:
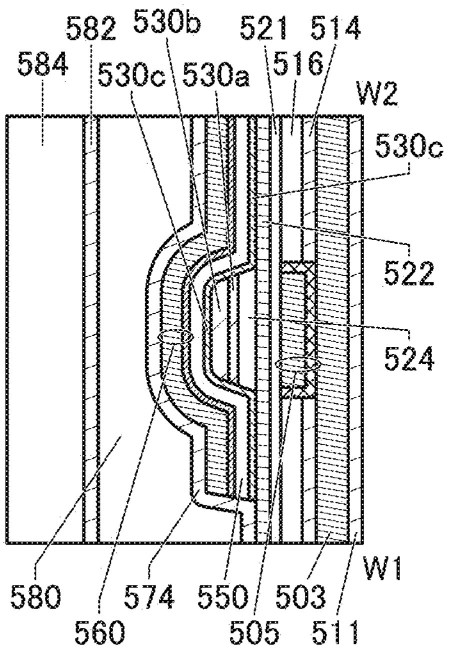
FIG. 12C is a cross-sectional view illustrating the structure example of the transistor.
Figure 12B:
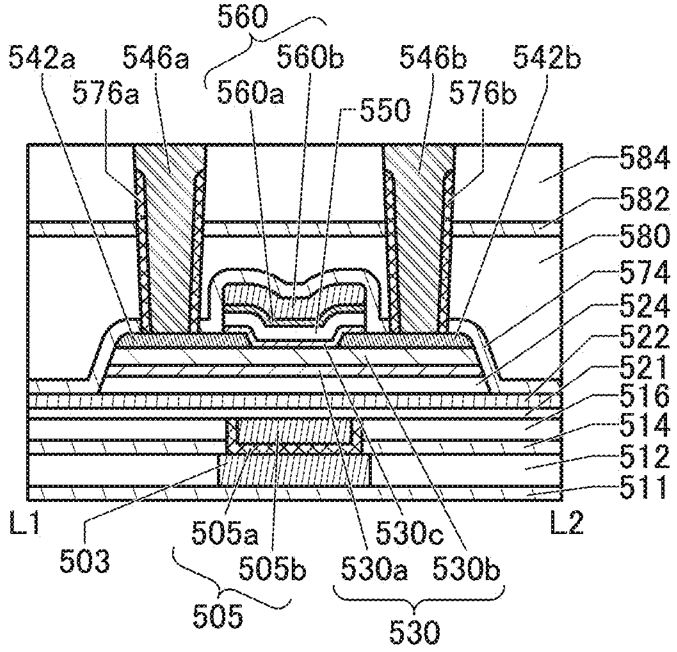
FIG. 12B is a cross-sectional view illustrating the structure example of the transistor.

A structure example of a transistor 510B is described with reference to FIG. 12A, FIG. 12B, and FIG. 12C. FIG. 12A is a top view of the transistor 510B. FIG. 12B is a cross-sectional view of a portion along the dashed-dotted line L1-L2 in FIG. 12A. FIG. 12C is a cross-sectional view of a portion along the dashed-dotted line W1-W2 in FIG. 12A. Note that for simplification of the drawing, some components are not shown in the top view in FIG. 12A.

The transistor 510B is a modification example of the transistor 510A. Therefore, differences from the transistor 510A will be mainly described to avoid repeated description.

The transistor 510B includes a region where the oxide 530*c*, the insulator 550, and the conductor 560 overlap with the conductor 542 (the conductor 542*a* and the conductor 542*b*). With this structure, a transistor having a high on-state current can be provided. Moreover, a transistor having high controllability can be provided.

The conductor 560 functioning as a first gate electrode includes the conductor 560*a* and the conductor 560*b* over the conductor 560*a*. Like the conductor 505*a*, the conductor 560*a* is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 560*a* has a function of inhibiting oxygen diffusion, the range of choices for the material of the conductor 560*b* can be extended. That is, the conductor 560*a* inhibits oxidation of the conductor 560*b*, thereby preventing the decrease in conductivity.

The insulator 574 is preferably provided to cover the top surface and a side surface of the conductor 560, a side surface of the insulator 550, and a side surface of the oxide 530*c*. For the insulator 574, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like. The insulator 574 can inhibit oxidation of the conductor 560. Moreover, the insulator 574 can inhibit diffusion of impurities such as water and hydrogen contained in the insulator 580 into the transistor 510B.

An insulator 576 (an insulator 576*a* and an insulator 576*b*) having a barrier property may be provided between the conductor 546 and the insulator 580. Providing the insulator 576 can prevent oxygen in the insulator 580 from reacting with the conductor 546 and oxidizing the conductor 546.

Furthermore, with the insulator 576 having a barrier property, the range of choices for the material of the conductor used as the plug or the wiring can be expanded. The use of a metal material having an oxygen absorbing property and high conductivity for the conductor 546, for example, can provide a semiconductor device with low power consumption. Specifically, a material having a low oxidation resistance and high conductivity, such as tungsten or aluminum, can be used. Moreover, for example, a conductor that can be easily deposited or processed can be used.

<Structure Example 3 of Transistor>

Figure 13A:
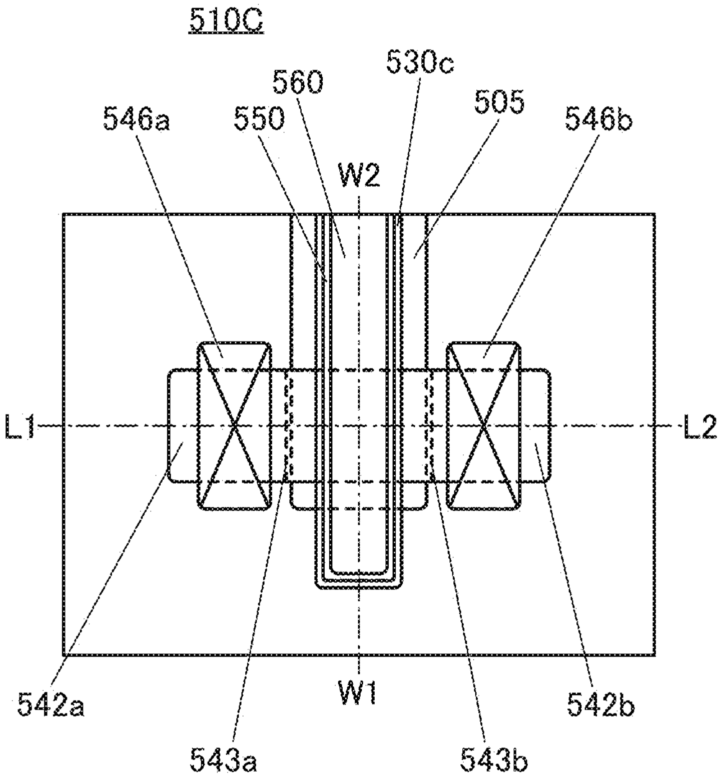
FIG. 13A is a top view illustrating a structure example of a transistor.
Figure 13C:
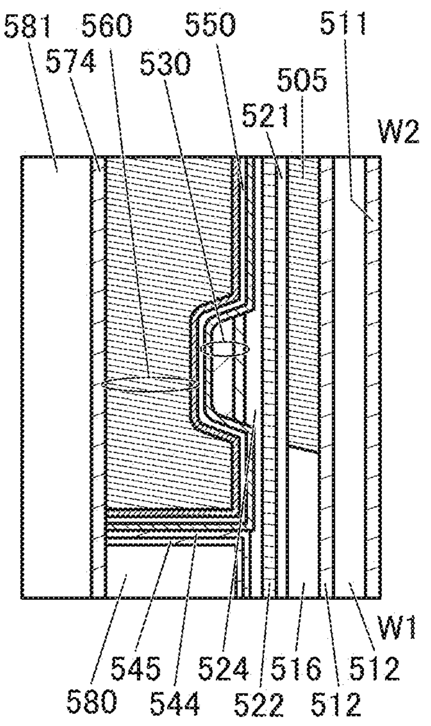
FIG. 13C is a cross-sectional view illustrating the structure example of the transistor.
Figure 13B:
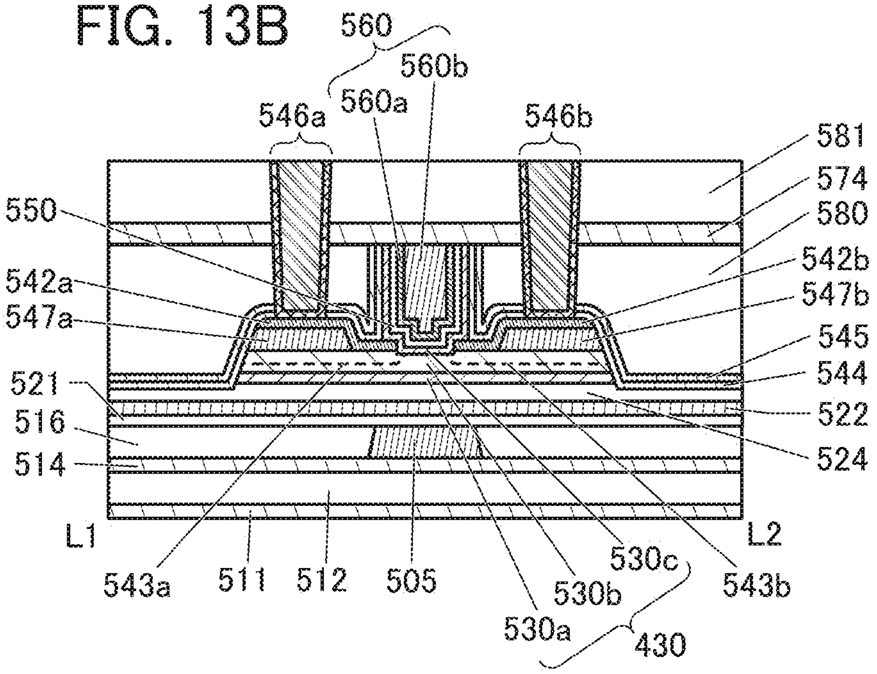
FIG. 13B is a cross-sectional view illustrating the structure example of the transistor.

A structure example of a transistor 510C is described with reference to FIG. 13A, FIG. 13B, and FIG. 13C. FIG. 13A is a top view of the transistor 510C. FIG. 13B is a cross-sectional view of a portion indicated by the dashed-dotted line L1-L2 in FIG. 13A. FIG. 13C is a cross-sectional view of a portion indicated by the dashed-dotted line W1-W2 in FIG. 13A. For clarity of the drawing, some components are not shown in the top view of FIG. 13A.

The transistor 510C is a modification example of the transistor 510A. Therefore, differences from the transistor 510A will be mainly described to avoid repeated description.

In the transistor 510C illustrated in FIG. 13, a conductor 547*a* is positioned between the conductor 542*a* and the oxide 530*b* and a conductor 547*b* is positioned between the conductor 542*b* and the oxide 530*b*. Here, the conductor 542*a* (the conductor 542*b*) has a region that extends beyond the top surface of the conductor 547*a* (the conductor 547*b*) and its side surface on the conductor 560 side and is in contact with the top surface of the oxide 530*b*. For the conductors 547, a conductor that can be used as the conductor 542 is used. It is preferable that the thickness of the conductor 547 be at least greater than that of the conductor 542.

In the transistor 510C illustrated in FIG. 13, because of the above structure, the conductor 542 can be closer to the conductor 560 than in the transistor 510A. Alternatively, the conductor 560 can overlap an end portion of the conductor 542*a* and an end portion of the conductor 542*b*. Thus, the effective channel length of the transistor 510C can be shortened, and the on-state current and the frequency characteristics can be improved.

The conductor 547*a* (the conductor 547*b*) is preferably provided to overlap with the conductor 542*a* (the conductor 542*b*). With such a structure, the conductor 547*a* (the conductor 547*b*) can function as a stopper to prevent over-etching of the oxide 530*b* in etching for forming the opening in which the conductor 546*a* (the conductor 546*b*) is to be embedded.

The transistor 510C illustrated in FIG. 13 may have a structure in which an insulator 545 is positioned on and in contact with the insulator 544. The insulator 544 preferably functions as a barrier insulating film that inhibits entry of impurities such as water or hydrogen and excess oxygen into the transistor 510C from the insulator 580 side. The insulator 545 can be formed using an insulator that can be used for the insulator 544. In addition, the insulator 544 may be formed using a nitride insulator such as aluminum nitride, aluminum titanium nitride, titanium nitride, silicon nitride, or silicon nitride oxide, for example.

Unlike in the transistor 510A illustrated in FIG. 11, in the transistor 510C illustrated in FIG. 13, the conductor 505 may be provided to have a single-layer structure. In this case, an insulating film to be the insulator 516 is formed over the patterned conductor 505, and an upper portion of the insulating film is removed by a CMP method or the like until the top surface of the conductor 505 is exposed. Preferably, the planarity of the top surface of the conductor 505 is made favorable. For example, the average surface roughness (Ra) of the top surface of the conductor 505 is less than or equal to 1 nm, preferably less than or equal to 0.5 nm, further preferably less than or equal to 0.3 nm. This allows the improvement in planarity of an insulating layer formed over the conductor 505 and the increase in crystallinity of the oxide 530*b* and the oxide 530*c*.

<Structure Example 4 of Transistor>

Figure 14A:
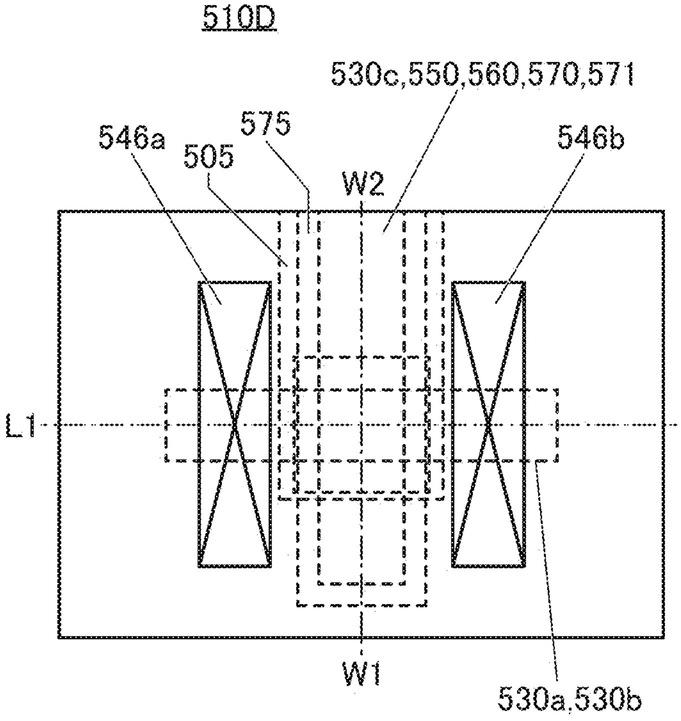
FIG. 14A is a top view illustrating a structure example of a transistor.
Figure 14C:
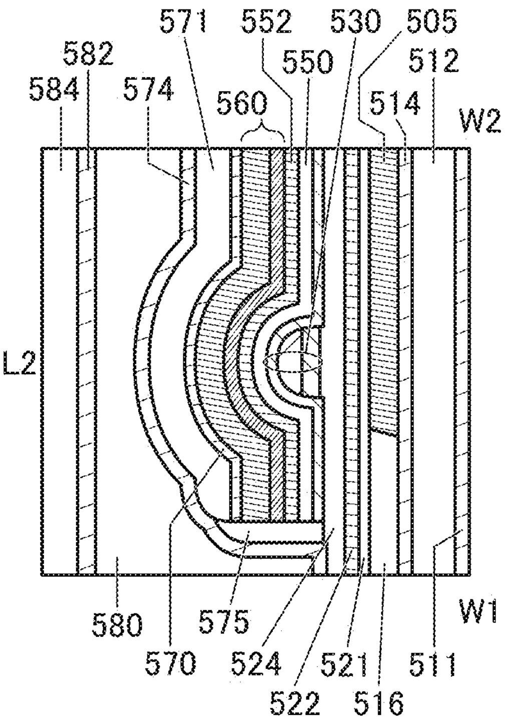
FIG. 14C is a cross-sectional view illustrating the structure example of the transistor.
Figure 14B:
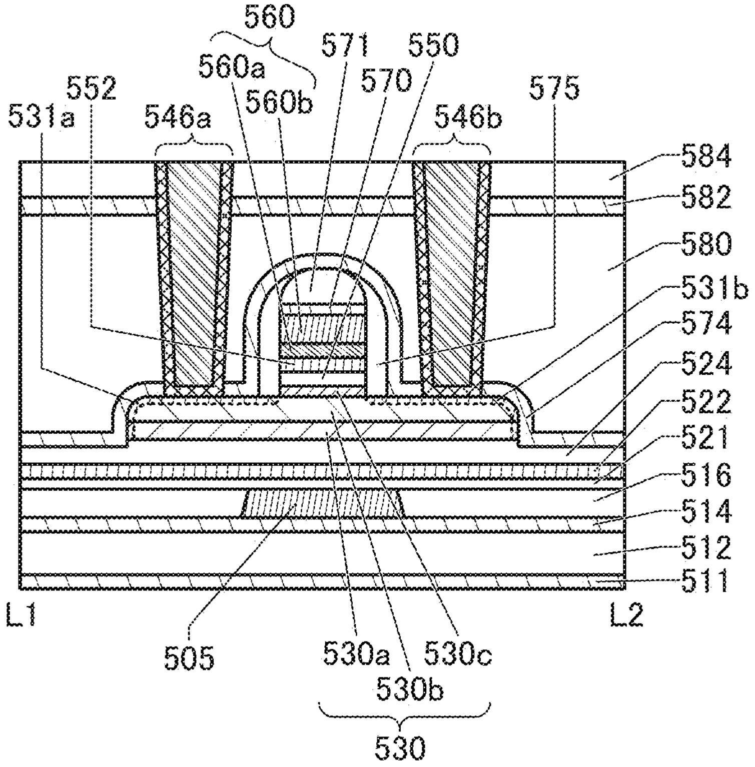
FIG. 14B is a cross-sectional view illustrating the structure example of the transistor.

A structure example of a transistor 510D is described with reference to FIG. 14A, FIG. 14B, and FIG. 14C. FIG. 14A is a top view of the transistor 510D. FIG. 14B is a cross-sectional view of a portion indicated by the dashed-dotted line L1-L2 in FIG. 14A. FIG. 14C is a cross-sectional view of a portion indicated by the dashed-dotted line W1-W2 in FIG. 14A. Note that for clarity of the drawing, some components are not illustrated in the top view of FIG. 14A.

The transistor 510D is a modification example of the above transistors. Therefore, differences from the above transistors will be mainly described to avoid repeated description.

In FIG. 14A to FIG. 14C, the conductor 503 is not provided, and the conductor 505 that has a function of a second gate is made to function also as a wiring. In addition, the insulator 550 is provided over the oxide 530*c* and a metal oxide 552 is provided over the insulator 550. In addition, the conductor 560 is provided over the metal oxide 552, and an insulator 570 is provided over the conductor 560. Furthermore, an insulator 571 is provided over the insulator 570.

The metal oxide 552 preferably has a function of inhibiting diffusion of oxygen. When the metal oxide 552 that inhibits oxygen diffusion is provided between the insulator 550 and the conductor 560, diffusion of oxygen into the conductor 560 is inhibited. That is, a reduction in the amount of oxygen supplied to the oxide 530 can be inhibited. Moreover, oxidation of the conductor 560 due to oxygen can be inhibited.

Note that the metal oxide 552 may have a function of part of the first gate. For example, the oxide semiconductor that can be used for the oxide 530 can be used for the metal oxide 552. In this case, when the conductor 560 is deposited by a sputtering method, the electrical resistance of the metal oxide 552 is lowered so that the metal oxide 552 can be a conductive layer. This can be called an OC electrode.

The metal oxide 552 may have a function of part of a gate insulating film. Thus, when silicon oxide, silicon oxynitride, or the like is used for the insulator 550, a metal oxide that is a high-k material with a high dielectric constant is preferably used for the metal oxide 552. Such a stacked-layer structure can be thermally stable and can have a high dielectric constant. Consequently, a gate potential that is applied when the transistor operates can be lowered while the physical thickness is maintained. In addition, the equivalent oxide thickness (EOT) of an insulating layer functioning as the gate insulating film can be reduced.

Although the metal oxide 552 in the transistor 510D is shown as a single layer, the metal oxide 552 may have a stacked-layer structure of two or more layers. For example, a metal oxide functioning as part of the gate electrode and a metal oxide functioning as part of the gate insulating film may be stacked.

With the metal oxide 552 functioning as a gate electrode, the on-state current of the transistor 510D can be increased without a reduction in the influence of the electric field from the conductor 560. With the metal oxide 552 functioning as the gate insulating film, the distance between the conductor 560 and the oxide 530 is kept by the physical thicknesses of the insulator 550 and the metal oxide 552, so that leakage current between the conductor 560 and the oxide 530 can be reduced. Thus, with the stacked-layer structure of the insulator 550 and the metal oxide 552, the physical distance between the conductor 560 and the oxide 530 and the intensity of electric field applied from the conductor 560 to the oxide 530 can be easily adjusted as appropriate.

Specifically, the oxide semiconductor that can be used for the oxide 530 can also be used for the metal oxide 552 when the resistance thereof is reduced. Alternatively, a metal oxide containing one kind or two or more kinds selected from hafnium, aluminum, gallium, yttrium, zirconium, tungsten, titanium, tantalum, nickel, germanium, magnesium, and the like can be used.

It is particularly preferable to use an insulating layer containing an oxide of one or both of aluminum and hafnium, for example, aluminum oxide, hafnium oxide, or hafnium aluminate. In particular, hafnium aluminate has higher heat resistance than a hafnium oxide film. Therefore, hafnium aluminate is preferable because it is unlikely to be crystallized by heat treatment in a later step. Note that the metal oxide 552 is not an essential component. Design is appropriately set in consideration of required transistor characteristics.

For the insulator 570, an insulating material having a function of inhibiting the passage of oxygen and impurities such as water or hydrogen is preferably used. For example, aluminum oxide or hafnium oxide is preferably used. Thus, oxidation of the conductor 560 due to oxygen from above the insulator 570 can be inhibited. Moreover, entry of impurities such as water or hydrogen from above the insulator 570 into the oxide 530 through the conductor 560 and the insulator 550 can be inhibited.

The insulator 571 functions as a hard mask. By providing the insulator 571, the conductor 560 can be processed to have a side surface that is substantially vertical; specifically, an angle formed by the side surface of the conductor 560 and a substrate surface can be greater than or equal to 75° and less than or equal to 100°, preferably greater than or equal to 80° and less than or equal to 95°.

Note that an insulating material having a function of inhibiting the passage of oxygen and impurities such as water or hydrogen may be used for the insulator 571 so that the insulator 571 also functions as a barrier layer. In that case, the insulator 570 does not have to be provided.

Parts of the insulator 570, the conductor 560, the metal oxide 552, the insulator 550, and the oxide 530*c* are selected and removed using the insulator 571 as a hard mask, whereby their side surfaces can be substantially aligned with each other and a surface of the oxide 530*b* can be partly exposed.

The transistor 510D includes a region 531*a* and a region 531*b* on part of the exposed surface of the oxide 530*b*. One of the region 531*a* and the region 531*b* functions as a source region, and the other functions as a drain region.

The region 531*a* and the region 531*b* can be formed by addition of an impurity element such as phosphorus or boron to the exposed surface of the oxide 530*b* by an ion implantation method, an ion doping method, a plasma immersion ion implantation method, or plasma treatment, for example. In this embodiment and the like, an "impurity element" refers to an element other than main constituent elements.

Alternatively, the region 531*a* and the region 531*b* can be formed in such a manner that, after part of the surface of the oxide 530*b* is exposed, a metal film is formed and then heat treatment is performed so that the element contained in the metal film is diffused into the oxide 530*b*.

The electrical resistivity of regions of the oxide 530*b* to which the impurity element is added decreases. For that reason, the region 531*a* and the region 531*b* are sometimes referred to as "impurity regions" or "low-resistance regions".

The region 531*a* and the region 531*b* can be formed in a self-aligned manner by using the insulator 571 and/or the conductor 560 as a mask. Thus, the conductor 560 does not overlap the region 531*a* and/or the region 531*b*, so that the parasitic capacitance can be reduced. Moreover, an offset region is not formed between a channel formation region and the source/drain region (the region 531*a* or the region 531*b*). The formation of the region 531*a* and the region 531*b* in a self-aligned manner achieves an increase in on-state current, a reduction in threshold voltage, and an improvement in operating frequency, for example.

Note that an offset region may be provided between the channel formation region and the source/drain region in order to further reduce the off-state current. The offset region is a region where the electrical resistivity is high and the impurity element is not added. The offset region can be formed by the addition of the impurity element after the formation of an insulator 575. In this case, the insulator 575 serves as a mask like the insulator 571 or the like. Thus, the impurity element is not added to a region of the oxide 530*b* overlapping with the insulator 575, so that the electrical resistivity of the region can be kept high.

The transistor 510D includes the insulator 575 on the side surfaces of the insulator 570, the conductor 560, the metal oxide 552, the insulator 550, and the oxide 530*c*. The insulator 575 is preferably an insulator having a low dielectric constant. For example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like is preferably used. In particular, silicon oxide, silicon oxynitride, silicon nitride oxide, or porous silicon oxide is preferably used for the insulator 575, in which case an excess-oxygen region can be easily formed in the insulator 575 in a later step. Silicon oxide and silicon oxynitride are preferable because of their thermal stability. The insulator 575 preferably has a function of diffusing oxygen.

The transistor 510D also includes the insulator 574 over the insulator 575 and the oxide 530. The insulator 574 is preferably deposited by a sputtering method. When a sputtering method is used, an insulator containing few impurities such as water or hydrogen can be deposited. For example, aluminum oxide is preferably used for the insulator 574.

Note that an oxide film obtained by a sputtering method may extract hydrogen from the component over which the oxide film is deposited. Thus, the hydrogen concentrations in the oxide 530 and the insulator 575 can be reduced when the insulator 574 absorbs hydrogen and water from the oxide 530 and the insulator 575.

Figure 15A:
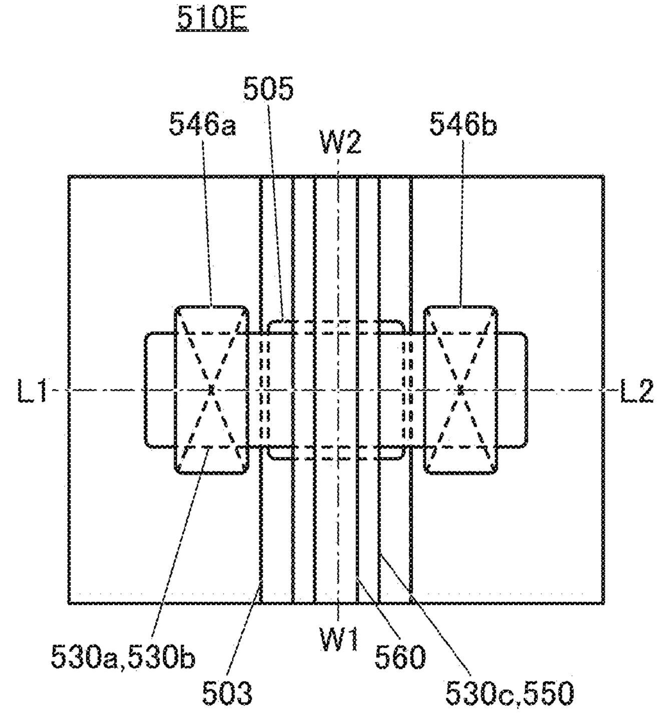
FIG. 15A is a top view illustrating a structure example of a transistor.
Figure 15C:
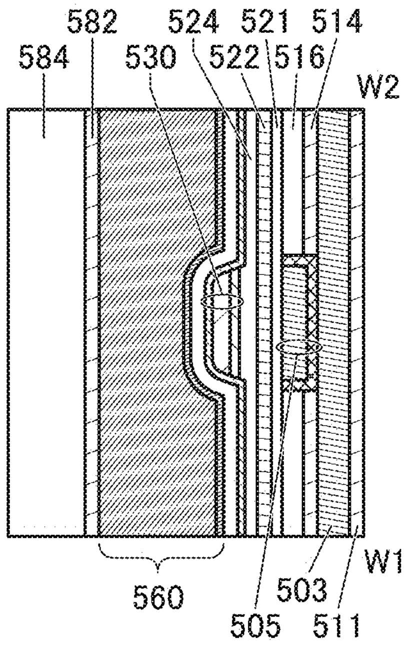
FIG. 15C is a cross-sectional view illustrating the structure example of the transistor.
Figure 15B:
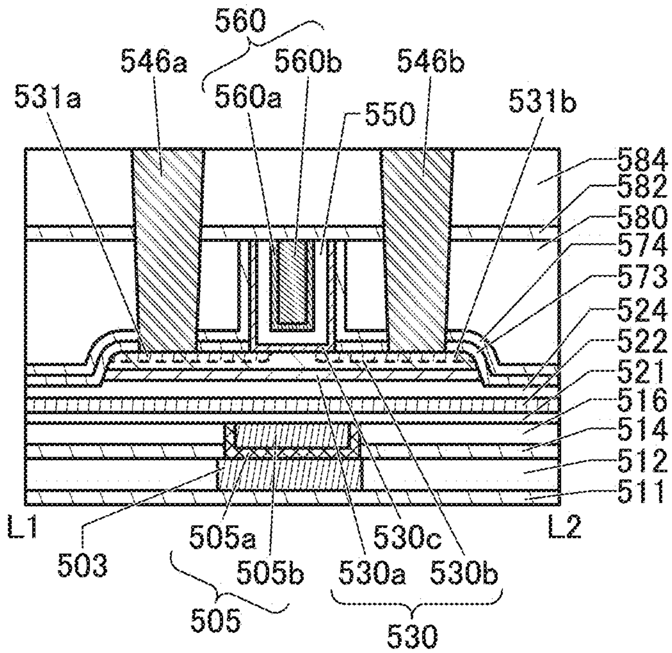
FIG. 15B is a cross-sectional view illustrating the structure example of the transistor.

<Structure Example 5 of Transistor>A structure example of a transistor 510E is described with reference to FIG. 15A to FIG. 15C. FIG. 15A is a top view of the transistor 510E. FIG. 15B is a cross-sectional view of a portion indicated by a dashed-dotted line L1-L2 in FIG. 15A. FIG. 15C is a cross-sectional view of a portion indicated by a dashed-dotted line W1-W2 in FIG. 15A. Note that for clarity of the drawing, some components are not illustrated in the top view of FIG. 15A.

The transistor 510E is a modification example of the above transistors. Therefore, differences from the above transistors will be mainly described to avoid repeated description.

In FIG. 15A to FIG. 15C, the conductor 542 is not provided, and part of the exposed surface of the oxide 530*b* includes the region 531*a* and the region 531*b*. One of the region 531*a* and the region 531*b* functions as a source region, and the other functions as a drain region. Moreover, an insulator 573 is included between the oxide 530*b* and the insulator 574.

The regions 531 (the region 531*a* and the region 531*b*) illustrated in FIG. 15 are regions where an element described below is added to the oxide 530*b*. The regions 531 can be formed using a dummy gate, for example.

Specifically, a dummy gate is provided over the oxide 530*b*, and the element that reduces the resistance of the oxide 530*b* is added using the dummy gate as a mask. That is, the element is added to regions of the oxide 530 that doses not overlap with the dummy gate, whereby the regions 531 are formed. As a method of adding the element, an ion implantation method by which an ionized source gas is subjected to mass separation and then added, an ion doping method by which an ionized source gas is added without mass separation, a plasma immersion ion implantation method, or the like can be used.

Typical examples of the element that reduces the resistance of the oxide 530 are boron and phosphorus. Moreover, hydrogen, carbon, nitrogen, fluorine, sulfur, chlorine, titanium, a rare gas, or the like may be used. Typical examples of the rare gas include helium, neon, argon, krypton, and xenon. The concentration of the element is measured by SIMS or the like.

In particular, boron and phosphorus are preferable because an apparatus used in a manufacturing line for amorphous silicon or low-temperature polysilicon can be used. Since the existing facility can be used, capital investment can be reduced.

Next, an insulating film to be the insulator 573 and an insulating film to be the insulator 574 may be formed over the oxide 530*b* and the dummy gate. Stacking the insulating film to be the insulator 573 and the insulating film to be the insulator 574 can provide a region where the oxide 530*c* and the insulator 550 overlap the region 531.

Specifically, after an insulating film to be the insulator 580 is provided over the insulating film to be the insulator 574, the insulating film to be the insulator 580 is subjected to CMP treatment, whereby part of the insulating film to be the insulator 580 is removed and the dummy gate is exposed. Then, when the dummy gate is removed, part of the insulator 573 in contact with the dummy gate is preferably also removed. Thus, the insulator 574 and the insulator 573 are exposed at a side surface of an opening portion provided in the insulator 580, and the region 531 provided in the oxide 530*b* is partly exposed at the bottom surface of the opening portion. Next, an oxide film to be the oxide 530*c*, an insulating film to be the insulator 550, and a conductive film to be the conductor 560 are formed in this order in the opening portion, and then an oxide film to be the oxide 530*c*, an insulating film to be the insulator 550, and a conductive film to be the conductor 560 are partly removed by CMP treatment or the like until the insulator 580 is exposed; thus, the transistor illustrated in FIG. 15 can be formed.

Note that the insulator 573 and the insulator 574 are not essential components. Design is appropriately set in consideration of required transistor characteristics.

The cost of the transistor illustrated in FIG. 15 can be reduced because an existing apparatus can be used and the conductor 542 is not provided.

<Structure Example 6 of Transistor>

Figure 16A:
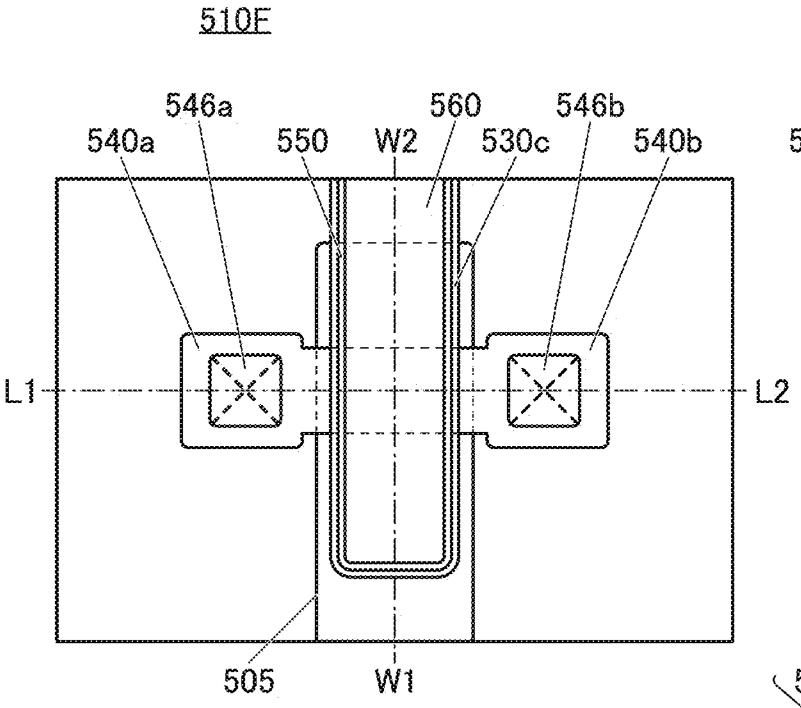
FIG. 16A is a top view illustrating a structure example of a transistor.
Figure 16C:
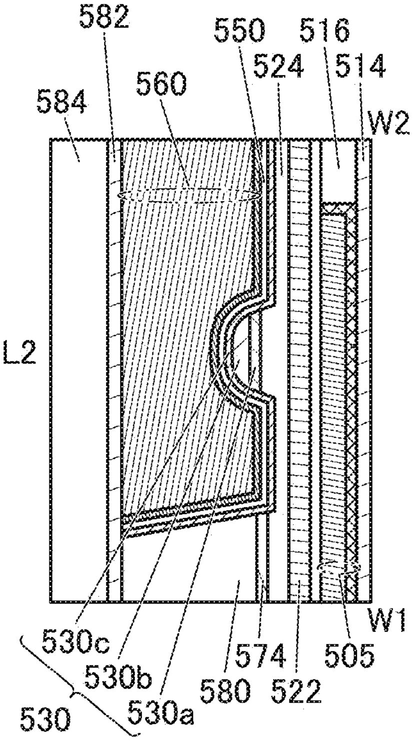
FIG. 16C is a cross-sectional view illustrating the structure example of the transistor.
Figure 16B:
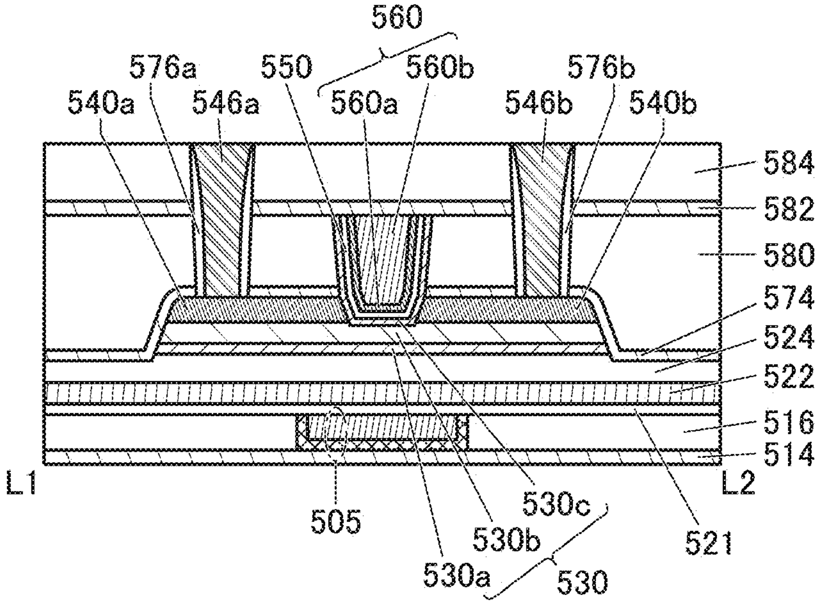
FIG. 16B is a cross-sectional view illustrating the structure example of the transistor.

A structure example of a transistor 510F is described with reference to FIG. 16A to FIG. 16C. FIG. 16A is a top view of the transistor 510F. FIG. 16B is a cross-sectional view of a portion indicated by a dashed-dotted line L1-L2 in FIG. 16A. FIG. 16C is a cross-sectional view of a portion indicated by a dashed-dotted line W1-W2 in FIG. 16A. Note that for clarity of the drawing, some components are not illustrated in the top view of FIG. 16A.

The transistor 510F is a modification example of the transistor 510A. Therefore, differences from the above transistors will be mainly described to avoid repeated description.

In the transistor 510A, part of the insulator 574 is provided in the opening portion provided in the insulator 580 and covers the side surface of the conductor 560. Meanwhile, in the transistor 510F, an opening is formed by partly removing the insulator 580 and the insulator 574.

An insulator 576 (an insulator 576*a* and an insulator 576*b*) having a barrier property may be provided between the conductor 546 and the insulator 580. Providing the insulator 576 can prevent oxygen in the insulator 580 from reacting with the conductor 546 and oxidizing the conductor 546.

Note that when an oxide semiconductor is used as the oxide 530, the oxide 530 preferably has a stacked-layer structure of a plurality of oxide layers that differ in the atomic ratio of metal atoms. Specifically, the atomic proportion of the element M in the constituent elements in the metal oxide used as the oxide 530*a* is preferably higher than the atomic proportion of the element M in the constituent elements in the metal oxide used as the oxide 530*b*. In addition, the atomic ratio of the element M to In in the metal oxide used as the oxide 530*a* is preferably higher than the atomic ratio of the element M to In in the metal oxide used as the oxide 530*b*. Furthermore, the atomic ratio of In to the element M in the metal oxide used as the oxide 530*b* is preferably higher than the atomic ratio of In to the element M in the metal oxide used as the oxide 530*a*. A metal oxide that can be used as the oxide 530*a* or the oxide 530*b* can be used as the oxide 530*c*.

The oxide 530*a*, the oxide 530*b*, and the oxide 530*c* preferably have crystallinity, and in particular, it is preferable to use a CAAC-OS. An oxide having crystallinity, such as a CAAC-OS, has a dense structure with small amounts of impurities and defects (e.g., oxygen vacancies) and high crystallinity. This can inhibit extraction of oxygen from the oxide 530*b* by the source electrode or the drain electrode. This can reduce extraction of oxygen from the oxide 530*b* even when heat treatment is performed; hence, the transistor 510F is stable against high temperatures in the manufacturing process (what is called thermal budget).

Note that one or both of the oxide 530*a* and the oxide 530*c* may be omitted. The oxide 530 may be a single layer of the oxide 530*b*. In the case where the oxide 530 is a stack of the oxide 530*a*, the oxide 530*b*, and the oxide 530*c*, the energy of the conduction band minimum of each of the oxide 530*a* and the oxide 530*c* is preferably higher than the energy of the conduction band minimum of the oxide 530*b*. In other words, the electron affinity of each of the oxide 530*a* and the oxide 530*c* is preferably smaller than the electron affinity of the oxide 530*b*. In that case, for the oxide 530*c*, a metal oxide that can be used for the oxide 530*a* is preferably used. Specifically, the atomic proportion of the element M in the constituent elements in the metal oxide used as the oxide 530*c* is preferably higher than the atomic proportion of the element M in the constituent elements in the metal oxide used as the oxide 530*b*. Moreover, the atomic ratio of the element M to In in the metal oxide used as the oxide 530*c* is preferably higher than the atomic ratio of the element M to In in the metal oxide used as the oxide 530*b*. Furthermore, the atomic ratio of In to the element M in the metal oxide used as the oxide 530*b* is preferably higher than the atomic ratio of In to the element M in the metal oxide used as the oxide 530*c*.

The energy level of the conduction band minimum gradually changes at junction portions of the oxide 530*a*, the oxide 530*b*, and the oxide 530*c*. In other words, the energy level of the conduction band minimum at the junction portions of the oxide 530*a*, the oxide 530*b*, and the oxide 530*c* continuously changes or is continuously connected. To obtain this, the density of defect states in a mixed layer formed at the interface between the oxide 530*a* and the oxide 530*b* and the interface between the oxide 530*b* and the oxide 530*c* is preferably made low.

Specifically, when the oxide 530*a* and the oxide 530*b* or the oxide 530*b* and the oxide 530*c* contain a common element (as a main component) in addition to oxygen, a mixed layer with a low density of defect states can be formed. For example, in the case where the oxide 530*b* is an In—Ga—Zn oxide, an In—Ga—Zn oxide, a Ga—Zn oxide, gallium oxide, or the like may be used as the oxide 530*a* and the oxide 530*c*. In addition, the oxide 530*c* may have a stacked-layer structure. For example, it is possible to employ a stacked-layer structure of an In—Ga—Zn oxide and a Ga—Zn oxide over the In—Ga—Zn oxide, or a stacked-layer structure of an In—Ga—Zn oxide and gallium oxide over the In—Ga—Zn oxide. In other words, the oxide 530*c* may employ a stacked-layer structure of an In—Ga—Zn oxide and an oxide that does not contain In.

Specifically, as the oxide 530*a*, a metal oxide having In:Ga:Zn=1:3:4 [atomic ratio] or a composition in the vicinity thereof, or 1:1:0.5 [atomic ratio] or a composition in the vicinity thereof is used. As the oxide 530*b*, a metal oxide having In:Ga:Zn=1:1:1 [atomic ratio] or a composition in the vicinity thereof, In:Ga:Zn=4:2:3 [atomic ratio] or a composition in the vicinity thereof, In:Ga:Zn=5:1:3 [atomic ratio] or a composition in the vicinity thereof, or 10:1:3 [atomic ratio] or a composition in the vicinity thereof or an In—Zn oxide is used. A metal oxide that can be used as the oxide 530*a* or the oxide 530*b* may be used as the oxide 530*c*. Note that a composition in the neighborhood includes the range of ±30% of an intended atomic ratio.

The oxide 530*c* may have a stacked-layer structure of two or more layers. As a specific example of the case where the oxide 530*c* has a stacked-layer structure, a metal oxide having In:Ga:Zn=5:1:3 [atomic ratio] or a composition in the vicinity thereof, or 10:1:3 [atomic ratio] or a composition in the vicinity thereof or an In—Zn oxide is used as a lower layer of the oxide 530*c*, and a metal oxide having In:Ga:Zn=1:3:4 [atomic ratio] or a composition in the vicinity thereof, Ga:Zn=2:1 [atomic ratio] or a composition in the vicinity thereof, or Ga:Zn=2:5 [atomic ratio] or a composition in the vicinity thereof or gallium oxide is used as an upper layer of the oxide 530*c*.

When the oxide 530*a* and the oxide 530*c* have the above structure, the density of defect states at the interface between the oxide 530*a* and the oxide 530*b* and the interface between the oxide 530*b* and the oxide 530*c* can be made low. Thus, the influence of interface scattering on carrier conduction is small, and the transistor 510F can have a high on-state current and high frequency characteristics. Note that in the case where the oxide 530*c* has a stacked-layer structure, in addition to the effect of reducing the density of defect states at the interface between the oxide 530*b* and the oxide 530*c*, the effect of inhibiting diffusion of the constituent element of the oxide 530*c* to the insulator 550 side is expected. More specifically, the oxide 530*c* has a stacked-layer structure and the oxide that does not contain In is positioned at the upper part of the stacked-layer structure, whereby the amount of In that would diffuse to the insulator 550 side can be reduced. Since the insulator 550 functions as a gate insulator, the transistor has defects in characteristics when In diffuses. Thus, when the oxide 530*c* has a stacked-layer structure, a highly reliable display device can be provided.

A metal oxide functioning as an oxide semiconductor is preferably used as the oxide 530. For example, as the metal oxide to be the channel formation region in the oxide 530, a metal oxide having a bandgap of 2 eV or larger, preferably 2.5 eV or larger is preferably used. With use of a metal oxide having such a wide band gap, the off-state current of the transistor can be reduced. With use of such a transistor, a semiconductor device with low power consumption can be provided.

<Structure Example 2 of Semiconductor Device>

Figure 17:
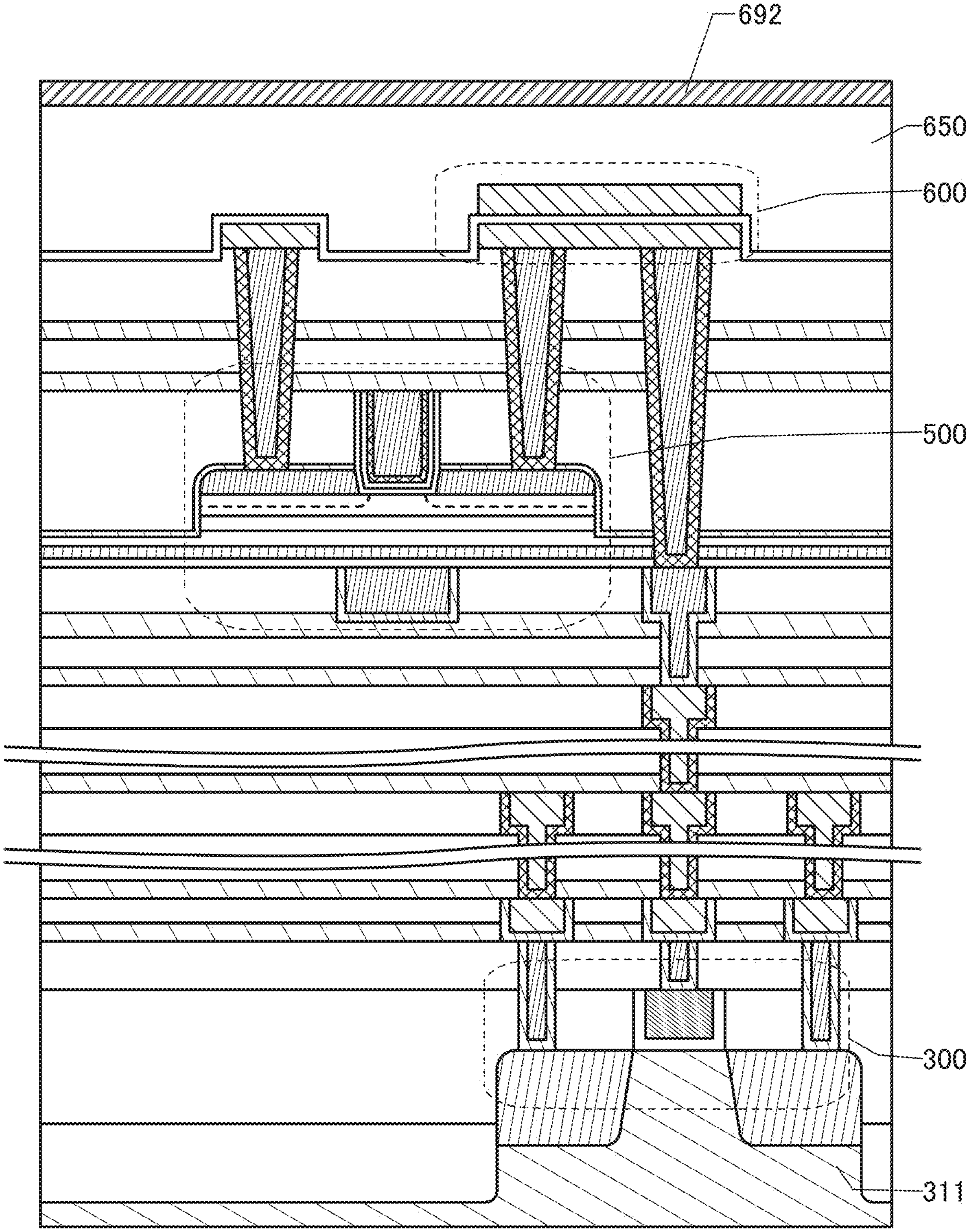
FIG. 17 is a cross-sectional view illustrating a structure example of a semiconductor device.

FIG. 17 illustrates an example in which the semiconductor device illustrated in FIG. 9 includes a conductor 692 over the insulator 650. The conductor 692 is formed to cover one surface of the semiconductor device. Although not illustrated in FIG. 17, the conductor 692 may have an opening portion. A conductor electrically connected to a conductor in a lower layer than the insulator 650 may be provided in the opening portion.

For the conductor 692, a metal can be used. A metal nitride or a metal oxide that has conductivity may be used. For the conductor 692, for example, titanium, titanium nitride, titanium oxide, or the like can be used. The conductor 692 has a function of cutting off or weakening an electromagnetic wave from the outside of the semiconductor device. Furthermore, the conductor 692 has a function of diffusing and releasing static electricity or preventing localization of electric charge. Providing the conductor 692 enables more stable operation of the semiconductor device.

Figure 18:
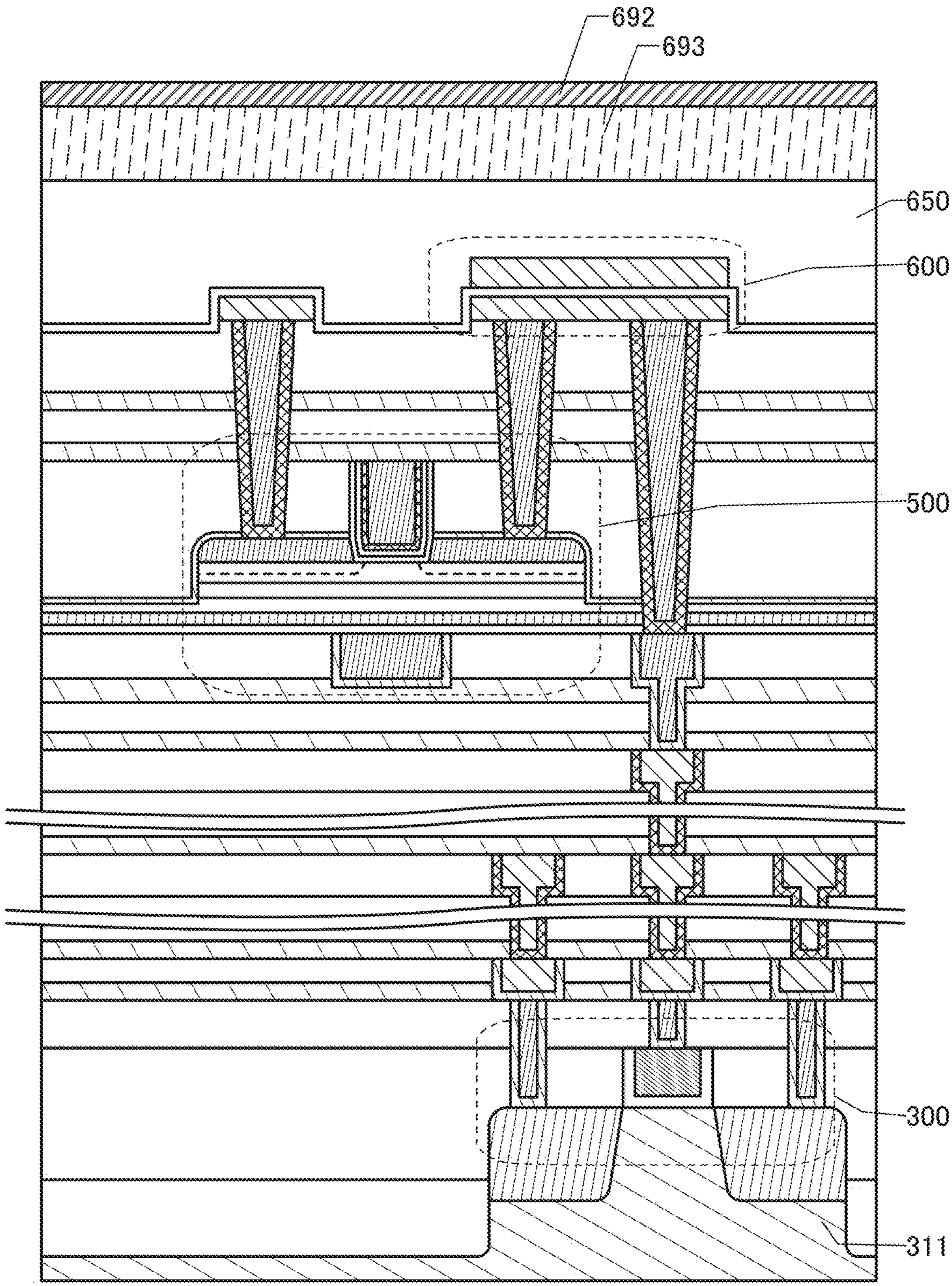
FIG. 18 is a cross-sectional view illustrating a structure example of a semiconductor device.

FIG. 18 illustrates an example in which an insulator 693 is included between the insulator 650 and the conductor 692. For the insulator 693, a structural body in which a fibrous body is impregnated with an organic resin can be used, for example. A glass fiber may be used as the fibrous body, for example. A brominated epoxy resin may be used as the organic resin, for example.

Note that this embodiment can be implemented in appropriate combination with the other embodiments described in this specification.

Embodiment 3

In this embodiment, the composition of a metal oxide that can be used in the OS transistor described in the above embodiment is described.

<<Metal Oxide>>

As the oxide 530, a metal oxide functioning as an oxide semiconductor is preferably used. A metal oxide that can be used as the oxide 530 according to the present invention is described below.

The metal oxide preferably contains at least indium or zinc. In particular, indium and zinc are preferably contained. Furthermore, gallium, yttrium, tin, or the like is preferably contained in addition to indium and zinc. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In—M—Zn oxide containing indium, the element M, and zinc is considered. The element M is one or more elements selected from aluminum, gallium, yttrium, and tin. Examples of other elements that can be used as the element M include boron, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide containing nitrogen is also collectively referred to as a metal oxide in some cases. A metal oxide containing nitrogen may be referred to as a metal oxynitride.

[Structure of Metal Oxide]

Oxide semiconductors (metal oxides) are classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. On the other hand, a clear crystal grain boundary is difficult to observe in the CAAC-OS; thus, it can be said that a reduction in electron mobility due to the crystal grain boundary is unlikely to occur. Entry of impurities, formation of defects, or the like might decrease the crystallinity of a metal oxide, which means that the CAAC-OS is a metal oxide having small amounts of impurities and defects (e.g., oxygen vacancies). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that an In-Ga-Zn oxide (hereinafter, IGZO) that is a kind of metal oxide containing indium, gallium, and zinc has a stable structure in some cases by being formed of the above-described nanocrystals. In particular, crystals of IGZO tend not to grow in the air and thus, a stable structure might be obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity compared with the nc-OS and the CAAC-OS.

An oxide semiconductor (metal oxide) can have various structures that show different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Impurities]

Here, the influence of each impurity in the metal oxide are described.

Entry of impurities into the oxide semiconductor forms defect states or oxygen vacancies in some cases. Thus, when impurities enter a channel formation region of the oxide semiconductor, the electrical characteristics of a transistor using the oxide semiconductor are likely to vary and its reliability is degraded in some cases. Moreover, when the channel formation region includes oxygen vacancies, the transistor tends to have normally-on characteristics.

The above defect states might include a trap state. Electric charge trapped by the trap states in the metal oxide takes a long time to be released and may behave like fixed electric charge.

Thus, a transistor whose channel formation region includes a metal oxide having a high density of trap states has unstable electrical characteristics in some cases.

If impurities exist in the channel formation region of the oxide semiconductor, the crystallinity of the channel formation region might decrease, and the crystallinity of an oxide provided in contact with the channel formation region might decrease. Low crystallinity of the channel formation region tends to result in deterioration in stability or reliability of the transistor. Moreover, if the crystallinity of the oxide provided in contact with the channel formation region is low, an interface state might be formed and the stability or reliability of the transistor might deteriorate.

Therefore, the reduction in concentration of impurities in the channel formation region of the oxide semiconductor and the vicinity thereof is effective in improving the stability or reliability of the transistor. Examples of impurities include hydrogen, nitrogen, an alkali metal, an alkaline earth metal, iron, nickel, and silicon.

Specifically, the concentration of the above impurities obtained by SIMS is lower than or equal to $1\times10^{18}$ atoms/cm$^3$, preferably lower than or equal to $2\times10^{16}$ atoms/cm$^3$ in the channel formation region of the oxide semiconductor and the vicinity thereof. Alternatively, the concentration of the above impurities obtained by element analysis using EDX is lower than or equal to 1.0 atomic % in and around the channel formation region of the oxide semiconductor. When an oxide containing the element M is used as the oxide semiconductor, the concentration ratio of the above impurities to the element M is lower than 0.10, preferably lower than 0.05 in the channel formation region of the oxide semiconductor and the vicinity thereof. Here, the concentration of the element M used in the calculation of the concentration ratio may be a concentration in a region that is the same as the region whose concertation of the above impurities is calculated or may be a concentration in the oxide semiconductor.

A metal oxide with a low impurity concentration has a low density of defect states and thus has a low density of trap states in some cases.

In the case where hydrogen enters an oxygen vacancy in the metal oxide, the oxygen vacancy and the hydrogen are bonded to each other to form VoH in some cases. The VoH serves as a donor and an electron that is a carrier is generated in some cases. In other cases, bonding of part of hydrogen to oxygen bonded to a metal atom generates electrons serving as carriers.

Thus, a transistor including an oxide semiconductor that contains a large amount of hydrogen is likely to have normally-on characteristics. Moreover, hydrogen in an oxide semiconductor is easily transferred by a stress such as heat or an electric field; thus, a large amount of hydrogen in an oxide semiconductor might reduce the reliability of the transistor.

Accordingly, the amount of VoH in the metal oxide is preferably reduced as much as possible so that the oxide semiconductor becomes a highly purified intrinsic or substantially highly purified intrinsic oxide semiconductor. It is important to remove impurities such as moisture and hydrogen in an oxide semiconductor (sometimes described as dehydration or dehydrogenation treatment) and to compensate for oxygen vacancies by supplying oxygen to the oxide semiconductor (sometimes described as oxygen adding treatment) in order to obtain an oxide semiconductor whose VoH is sufficiently reduced. When an oxide semiconductor with sufficiently reduced impurities such as VoH is used for a channel formation region of a transistor, the transistor can have stable electrical characteristics.

An oxide semiconductor with a low carrier concentration is preferably used for the transistor. In the case where the carrier concentration of the oxide semiconductor is lowered, the impurity concentration in the oxide semiconductor is lowered to decrease the density of defect states. In this specification and the like, a state with a low impurity concentration and a low density of defect states is referred to as a highly purified intrinsic or substantially highly purified intrinsic state. Note that examples of impurities in the oxide semiconductor include hydrogen, nitrogen, alkali metal, alkaline earth metal, iron, nickel, silicon, and the like.

Specifically, hydrogen contained in an oxide semiconductor reacts with oxygen bonded to a metal atom to be water, and thus sometimes causes an oxygen vacancy in the oxide semiconductor. If the channel formation region in the oxide semiconductor includes oxygen vacancies, the transistor sometimes has normally-on characteristics. In some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor including an oxide semiconductor that contains a large amount of hydrogen is likely to have normally-on characteristics.

A defect where hydrogen enters an oxygen vacancy (VoH) can serve as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration in the oxide semiconductor that is obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When an oxide semiconductor with a sufficiently low concentration of impurities such as hydrogen is used for a channel formation region of a transistor, the transistor can have stable electrical characteristics.

The carrier concentration of the oxide semiconductor in the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet still further preferably lower than $1\times10^{13}$ cm$^{-3}$, yet still further preferably lower than $1\times10^{12}$ cm$^{-3}$. Note that the lower limit of the carrier concentration of the oxide semiconductor in the channel formation region is not particularly limited and can be, for example, $1\times10^{-9}$ cm$^{-3}$.

According to one embodiment of the present invention, a semiconductor device having favorable reliability can be provided. With one embodiment of the present invention, a semiconductor device having favorable electrical characteristics can be provided. According to another embodiment of the present invention, a semiconductor device having a high on-state current can be provided. According to another embodiment of the present invention, a semiconductor device that can be miniaturized or highly integrated can be provided. Another object of one embodiment of the present invention is to provide a semiconductor device with low power consumption.

<<Other Semiconductor Material>>

A semiconductor material that can be used for the oxide 530 is not limited to the above metal oxides. A semiconductor material having a bandgap (a semiconductor material that is not a zero-gap semiconductor) can be used for the oxide 530. For example, a single element semiconductor such as silicon, a compound semiconductor such as gallium arsenide, or a layered material (also referred to as an atomic layered material or a two-dimensional material) is preferably used as a semiconductor material. In particular, a layered material functioning as a semiconductor is preferably used as a semiconductor material.

Here, in this specification and the like, the layered material is a general term of a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material functioning as a semiconductor and having high two-dimensional electrical conductivity is used for a channel formation region, a transistor having a high on-state current can be provided.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

As the oxide 530, a transition metal chalcogenide functioning as a semiconductor is preferably used, for example. Specific examples of the transition metal chalcogenide which can be used for the oxide 530 include molybdenum sulfide (typically $MoS_2$), molybdenum selenide (typically $MoSe_2$), molybdenum telluride (typically $MoTe_2$), tungsten sulfide ($WS_2$), tungsten selenide (typically $WSe_2$), tungsten telluride (typically $WTe_2$), hafnium sulfide ($HfS_2$), hafnium selenide ($HfSe_2$), zirconium sulfide ($ZrS_2$), and zirconium selenide ($ZrSe_2$).

Note that this embodiment can be implemented in appropriate combination with the other embodiments described in this specification.

REFERENCE NUMERALS

EN1: terminal, ID1: current, IN2: terminal, ND1: node, ND2: node, ND3: node, ND4: node, OU1: terminal, OU2: terminal, OU3: terminal, OU4: terminal, RL1: resistor, SG1: terminal, SH1: terminal, SH2: terminal, Sv1: signal, VBI1: terminal, VD1: wiring, VS1: wiring, VT1: terminal, 21: semiconductor device, 30: oscillator, 31: circuit, 32: circuit, 33: circuit, 36: amplifier circuit, 38: control circuit, 41: transistor, 42: transistor, 43: transistor, 44: transistor, 45: transistor, 46*a*: transistor, 46*b*: transistor, 47*a*: transistor, 47*b*: transistor, 48: transistor, 49: transistor, 51: capacitor, 52: capacitor, 53: inverter, 54: transistor, 55: transistor, 56: comparator, 57: capacitor, 61: transistor, 62: transistor, 63: circuit, 63*a*: transistor, 63*b*: transistor, 63*n*: transistor, 63*x*: circuit, 63*y*: circuit, 64: transistor, 65: transistor, 66: capacitor, 71: transistor, 72: transistor, 73: transistor, 74: transistor, 75: transistor, 76: transistor, 77: transistor, 121: secondary battery, 300: transistor, 311: substrate, 313: semiconductor region, 314*a*: low-resistance region, 314*b*: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 500: transistor, 503: conductor, 503*a*: conductor, 503*b*: conductor, 505: conductor, 505*a*: conductor, 505*b*: conductor, 510: insulator, 510A: transistor, 510B: transistor, 510C: transistor, 510D: transistor, 510E: transistor, 510F: transistor, 511: insulator, 512: insulator, 514: insulator, 516: insulator,

518: conductor, 520: insulator, 521: insulator, 522: insulator, 524: insulator, 530: oxide, 530*a*: oxide, 530*b*: oxide, 530*c*: oxide, 531: region, 531*a*: region, 531*b*: region, 540*a*: conductor, 540*b*: conductor, 542: conductor, 542*a*: conductor, 542*b*: conductor, 543: region, 543*a*: region, 543*b*: region, 544: insulator, 545: insulator, 546: conductor, 546*a*: conductor, 546*b*: conductor, 547: conductor, 547*a*: conductor, 547*b*: conductor, 548: conductor, 550: insulator, 552: metal oxide, 560: conductor, 560*a*: conductor, 560*b*: conductor, 570: insulator, 571: insulator, 573: insulator, 574: insulator, 575: insulator, 576: insulator, 576*a*: insulator, 576*b*: insulator, 580: insulator, 581: insulator, 582: insulator, 584: insulator, 586: insulator, 600: capacitor, 610: conductor, 612: conductor, 620: conductor, 630: insulator, 650: insulator, 692: conductor, 693: insulator

The invention claimed is:

1. A semiconductor device comprising:
a first transistor;
a second transistor;
an oscillator;
a first wiring;
a second wiring;
a first circuit;
a secondary battery; and
a comparator,
wherein the oscillator is electrically connected to each of the first wiring, the second wiring, and the first circuit,
wherein each of the first transistor and the second transistor comprises a metal oxide comprising indium in a channel formation region,
wherein the oscillator comprises a third transistor, a fourth transistor, a fifth transistor, a sixth transistor, and a first capacitor,
wherein a gate of the third transistor and a gate of the fourth transistor are electrically connected to one of a source and a drain of the first transistor,
wherein one of a source and a drain of the third transistor is electrically connected to one of a source and a drain of the fifth transistor and a first electrode of the first capacitor,
wherein one of a source and a drain of the fourth transistor is electrically connected to one of a source and a drain of the sixth transistor and a second electrode of the first capacitor,
wherein the other of the source and the drain of the fifth transistor is electrically connected to a gate of the sixth transistor,
wherein the other of the source and the drain of the sixth transistor is electrically connected to the first circuit and a gate of the fifth transistor,
wherein the first wiring is electrically connected to the other of the source and the drain of the third transistor and the other of the source and the drain of the fourth transistor,
wherein one of a non-inverting input terminal and an inverting input terminal of the comparator is electrically connected to a positive electrode of the secondary battery, and
wherein the other of the non-inverting input terminal and the inverting input terminal of the comparator is electrically connected to one of a source and a drain of the second transistor.

2. The semiconductor device according to claim 1,
wherein the second transistor comprises a first gate and a second gate provided over the first gate, and
wherein one of the first gate and the second gate of the second transistor is electrically connected to the first wiring.

3. The semiconductor device according to claim 1, wherein the third transistor to the sixth transistor each comprise a metal oxide comprising indium in a channel formation region.

4. The semiconductor device according to claim 1, further comprising a second capacitor,
wherein a first electrode of the second capacitor is electrically connected to one of a source and a drain of the first transistor, and
wherein a second electrode of the second capacitor is electrically connected to the first wiring.

5. The semiconductor device according to claim 1, further comprising a resistor, a seventh transistor, and an eighth transistor,
wherein the first wiring is electrically connected to one of a source and a drain of the seventh transistor,
wherein the other of the source and the drain of the seventh transistor is electrically connected to one of a source and a drain of the eighth transistor,
wherein the other of the source and the drain of the eighth transistor is electrically connected to a first electrode of the resistor,
wherein the second electrode of the resistor is electrically connected to the second wiring,
wherein the other of the source and the drain of the first transistor is electrically connected to the source or the drain of the eighth transistor,
wherein the first wiring is configured to be supplied with a first potential signal, and
wherein the second wiring is configured to be supplied with a second potential signal higher than the first potential signal.

6. The semiconductor device according to claim 1,
wherein the first circuit comprises n (n is a natural number greater than or equal to 2) transistors,
wherein the n transistors included in the first circuit are connected in series between the first wiring and the second wiring,
wherein between two adjacent transistors in the n transistors included in the first circuit, a source or a drain of one of the two adjacent transistors is electrically connected to a source or a drain of the other of the two adjacent transistors, and
wherein the gate of the fifth transistor is electrically connected to a gate of at least one of the n transistors included in the first circuit.

7. A semiconductor device comprising:
a first transistor;
a second transistor;
an oscillator;
a first wiring;
a second wiring;
a first circuit;
a secondary battery; and
a comparator,
wherein the oscillator is electrically connected to each of the first wiring, the second wiring, and the first circuit,
wherein each of the first transistor and the second transistor comprises a metal oxide comprising indium in a channel formation region,
wherein the oscillator comprises a third transistor, a fourth transistor, a fifth transistor, a sixth transistor, and a first capacitor, wherein a gate of the third transistor and a gate of the fourth transistor are electrically connected to one of a source and a drain of the first transistor, wherein one of a source and a drain of the third transistor is electrically connected to one of a source and a drain of the fifth transistor and a first electrode of the first capacitor, wherein one of a source and a drain of the fourth transistor is electrically connected to one of a source and a drain of the sixth transistor and a second electrode of the first capacitor, wherein the other of the source and the drain of the fifth transistor is electrically connected to a gate of the sixth transistor, wherein the other of the source and the drain of the sixth transistor is electrically connected to the first circuit and a gate of the fifth transistor, wherein the first wiring is electrically connected to the other of the source and the drain of the third transistor and the other of the source and the drain of the fourth transistor, wherein one of a non-inverting input terminal and an inverting input terminal of the comparator is electrically connected to a positive electrode of the secondary battery, wherein the other of the non-inverting input terminal and the inverting input terminal of the comparator is electrically connected to one of a source and a drain of the second transistor, wherein the second transistor is configured so that a first potential is supplied to the other of the non-inverting input terminal and the inverting input terminal when the second transistor is turned on, wherein the second transistor is configured so that the first potential is held at the other of the non-inverting input terminal and the inverting input terminal when the second transistor is turned off, wherein the comparator is configured to output an output signal based on a result of comparison between a potential of the positive electrode and the first potential, and wherein the oscillator is configured to block current flowing between the first wiring and the second wiring in accordance with the output signal.

8. The semiconductor device according to claim 7, wherein the second transistor comprises a first gate and a second gate provided over the first gate, and wherein one of the first gate and the second gate of the second transistor is electrically connected to the first wiring.

9. The semiconductor device according to claim 7, wherein the third transistor to the sixth transistor each comprise a metal oxide comprising indium in a channel formation region.

10. The semiconductor device according to claim 7, further comprising a second capacitor, wherein a first electrode of the second capacitor is electrically connected to one of a source and a drain of the first transistor, and wherein a second electrode of the second capacitor is electrically connected to the first wiring.

11. The semiconductor device according to claim 7, further comprising a resistor, a seventh transistor, and an eighth transistor, wherein the first wiring is electrically connected to one of a source and a drain of the seventh transistor, wherein the other of the source and the drain of the seventh transistor is electrically connected to one of a source and a drain of the eighth transistor, wherein the other of the source and the drain of the eighth transistor is electrically connected to a first electrode of the resistor, wherein the second electrode of the resistor is electrically connected to the second wiring, wherein the other of the source and the drain of the first transistor is electrically connected to the source or the drain of the eighth transistor, wherein the first wiring is configured to be supplied with a first potential signal, and wherein the second wiring is configured to be supplied with a second potential signal higher than the first potential signal.

12. The semiconductor device according to claim 7, wherein the first circuit comprises n (n is a natural number greater than or equal to 2) transistors, wherein the n transistors included in the first circuit are connected in series between the first wiring and the second wiring, wherein between two adjacent transistors in the n transistors included in the first circuit, a source or a drain of one of the two adjacent transistors is electrically connected to a source or a drain of the other of the two adjacent transistors, and wherein the gate of the fifth transistor is electrically connected to a gate of at least one of the n transistors included in the first circuit.

13. A semiconductor device comprising:

a first transistor;

a second transistor;

an oscillator;

a first wiring;

a second wiring;

a first circuit;

a secondary battery; and a comparator, wherein the oscillator is electrically connected to each of the first wiring, the second wiring, and the first circuit, wherein each of the first transistor and the second transistor comprises a metal oxide comprising indium in a channel formation region, wherein the oscillator comprises a third transistor, a fourth transistor, a fifth transistor, a sixth transistor, and a first capacitor, wherein a gate of the third transistor and a gate of the fourth transistor are electrically connected to one of a source and a drain of the first transistor, wherein one of a source and a drain of the third transistor is electrically connected to one of a source and a drain of the fifth transistor and a first electrode of the first capacitor, wherein one of a source and a drain of the fourth transistor is electrically connected to one of a source and a drain of the sixth transistor and a second electrode of the first capacitor, wherein the other of the source and the drain of the fifth transistor is electrically connected to a gate of the sixth transistor, wherein the other of the source and the drain of the sixth transistor is electrically connected to the first circuit and a gate of the fifth transistor, wherein the first wiring is electrically connected to the other of the source and the drain of the third transistor and the other of the source and the drain of the fourth transistor, wherein one of a non-inverting input terminal and an inverting input terminal of the comparator is electrically connected to a positive electrode of the secondary battery, wherein the other of the non-inverting input terminal and the inverting input terminal of the comparator is electrically connected to one of a source and a drain of the second transistor, wherein the first circuit comprises at least one of an inverter and a buffer, and an input terminal, wherein the gate of the fifth transistor is electrically connected to the input terminal, and wherein the first circuit is configured to perform at least one of shaping and amplification on a signal supplied to the input terminal.

14. The semiconductor device according to claim 13, wherein the second transistor comprises a first gate and a second gate provided over the first gate, and wherein one of the first gate and the second gate of the second transistor is electrically connected to the first wiring.

15. The semiconductor device according to claim 13, wherein the third transistor to the sixth transistor each comprise a metal oxide comprising indium in a channel formation region.

16. The semiconductor device according to claim 13, further comprising a second capacitor, wherein a first electrode of the second capacitor is electrically connected to one of a source and a drain of the first transistor, and wherein a second electrode of the second capacitor is electrically connected to the first wiring.

17. The semiconductor device according to claim 13, further comprising a resistor, a seventh transistor, and an eighth transistor, wherein the first wiring is electrically connected to one of a source and a drain of the seventh transistor, wherein the other of the source and the drain of the seventh transistor is electrically connected to one of a source and a drain of the eighth transistor, wherein the other of the source and the drain of the eighth transistor is electrically connected to a first electrode of the resistor, wherein the second electrode of the resistor is electrically connected to the second wiring, wherein the other of the source and the drain of the first transistor is electrically connected to the source or the drain of the eighth transistor, wherein the first wiring is configured to be supplied with a first potential signal, and wherein the second wiring is configured to be supplied with a second potential signal higher than the first potential signal.

18. The semiconductor device according to claim 13, wherein the first circuit comprises n (n is a natural number greater than or equal to 2) transistors, wherein the n transistors included in the first circuit are connected in series between the first wiring and the second wiring, wherein between two adjacent transistors in the n transistors included in the first circuit, a source or a drain of one of the two adjacent transistors is electrically connected to a source or a drain of the other of the two adjacent transistors, and wherein the gate of the fifth transistor is electrically connected to a gate of at least one of the n transistors included in the first circuit.

* * * * *